(12) United States Patent
Hatakeyama et al.

(10) Patent No.: US 9,250,518 B2
(45) Date of Patent: Feb. 2, 2016

(54) RESIST COMPOSITION AND PATTERNING PROCESS

(71) Applicant: SHIN-ETSU CHEMICAL CO., LTD., Tokyo (JP)

(72) Inventors: Jun Hatakeyama, Joetsu (JP); Masaki Ohashi, Joetsu (JP); Masayoshi Sagehashi, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/529,582

(22) Filed: Oct. 31, 2014

(65) Prior Publication Data

US 2015/0125794 A1    May 7, 2015

(30) Foreign Application Priority Data

Nov. 5, 2013 (JP) ................. 2013-229075

(51) Int. Cl.
| | | |
|---|---|---|
| G03F 7/004 | (2006.01) | |
| G03F 7/039 | (2006.01) | |
| G03F 7/038 | (2006.01) | |
| G03F 7/20 | (2006.01) | |
| G03F 7/30 | (2006.01) | |

(52) U.S. Cl.
CPC ............ *G03F 7/0045* (2013.01); *G03F 7/0046* (2013.01); *G03F 7/0382* (2013.01); *G03F 7/0397* (2013.01); *G03F 7/2041* (2013.01); *G03F 7/30* (2013.01)

(58) Field of Classification Search
None
See application file for complete search history.

(56) References Cited

U.S. PATENT DOCUMENTS

| | | | |
|---|---|---|---|
| 6,673,511 B1 | 1/2004 | Hatakeyama et al. | |
| 6,749,988 B2 | 6/2004 | Hatakeyama et al. | |
| 6,916,593 B2 | 7/2005 | Hatakeyama et al. | |
| 7,511,169 B2 | 3/2009 | Ohsawa et al. | |
| 7,527,912 B2 | 5/2009 | Ohsawa et al. | |
| 7,537,880 B2 | 5/2009 | Harada et al. | |
| 7,598,016 B2 | 10/2009 | Kobayashi et al. | |
| 7,771,914 B2 | 8/2010 | Hatakeyama et al. | |
| 7,919,226 B2 | 4/2011 | Ohsawa et al. | |
| 8,114,570 B2 | 2/2012 | Ohsawa et al. | |
| 8,435,717 B2 | 5/2013 | Hagiwara et al. | |
| 8,574,817 B2 | 11/2013 | Hatakeyama et al. | |
| 8,846,303 B2 | 9/2014 | Hatakeyama et al. | |
| 2008/0090172 A1 | 4/2008 | Hatakeyama et al. | |
| 2008/0118860 A1 | 5/2008 | Harada et al. | |
| 2008/0153030 A1 | 6/2008 | Kobayashi et al. | |
| 2012/0141938 A1 | 6/2012 | Hatakeyama et al. | |

FOREIGN PATENT DOCUMENTS

| | | | |
|---|---|---|---|
| JP | 2001-194776 A | | 7/2001 |
| JP | 2002-226470 A | | 8/2002 |
| JP | 2002-363148 A | | 12/2002 |
| JP | 2005-84365 A | | 3/2005 |
| JP | 3790649 B2 | | 6/2006 |
| JP | 2006-178317 A | | 7/2006 |
| JP | 2006-258980 | * | 9/2006 |
| JP | 2007-145797 A | | 6/2007 |
| JP | 2008-106045 A | | 5/2008 |
| JP | 2008-111103 A | | 5/2008 |
| JP | 2008-122932 A | | 5/2008 |
| JP | 2008-158339 A | | 7/2008 |
| JP | 2008-239918 A | | 10/2008 |
| JP | 2009-7327 A | | 1/2009 |
| JP | 2009-258695 A | | 11/2009 |
| JP | 2012-137729 A | | 7/2012 |
| JP | 2013-80033 A | | 5/2013 |
| JP | 2013-83821 A | | 5/2013 |

OTHER PUBLICATIONS

JPO English abstract for JP 2006-258980 (2006).*
Machine-assisted English translation for JP 2006-258980 provided by JPO (2006).*
Hinsberg et al., "Extendibility of Chemically Amplified Resists: Another Brick Wall?", Proceedings of SPIE, 2003, pp. 1-14, vol. 5039.
Kishikawa et al., "Assessment of trade-off between resist resolution and sensitivity for optimization of hyper-NA immersion lithography", Proceedings of SPIE, 2007, pp. 65203L-1-65203L-9, vol. 6520.
Wang et al., "Photobase generator and photo decomposable quencher for high-resolution photoresist applications", Proceedings of SPIE, 2010, pp. 76390W-1-76390W-15, vol. 7639.

* cited by examiner

*Primary Examiner* — Sin Lee
(74) *Attorney, Agent, or Firm* — Westerman, Hattori, Daniels & Adrian, LLP

(57) ABSTRACT

A photoresist film containing a sulfonium or iodonium salt of carboxylic acid having an amino group has a high dissolution contrast and offers improved resolution, wide focus margin and minimal LWR when used as a positive resist film adapted for alkaline development and a negative resist film adapted for organic solvent development.

15 Claims, No Drawings

RESIST COMPOSITION AND PATTERNING PROCESS

CROSS-REFERENCE TO RELATED APPLICATION

This non-provisional application claims priority under 35 U.S.C. §119(a) on Patent Application No. 2013-229075 filed in Japan on Nov. 5, 2013, the entire contents of which are hereby incorporated by reference.

TECHNICAL FIELD

This invention relates to a resist composition comprising a sulfonium or iodonium salt capable of generating a carboxylic acid having an acid-reactive amino group, and a patterning process using the same.

BACKGROUND ART

To meet the demand for higher integration density and operating speed of LSIs, the effort to reduce the pattern rule is in rapid progress. The wide-spreading flash memory market and the demand for increased storage capacities drive forward the miniaturization technology. As the advanced miniaturization technology, manufacturing of microelectronic devices at the 65-nm node by the ArF lithography has been implemented in a mass scale. Manufacturing of 45-nm node devices by the next generation ArF immersion lithography is approaching to the verge of high-volume application. The candidates for the future generation 32-nm node include ultra-high NA lens immersion lithography using a liquid having a higher refractive index than water in combination with a high refractive index lens and a high refractive index resist film, EUV lithography of 13.5 nm wavelength, and double patterning version of the ArF lithography, on which active research efforts have been made.

With respect to high-energy radiation of very short wavelength such as EB or x-ray, hydrocarbons and similar light elements used in resist materials have little absorption. Then polyhydroxystyrene base resist materials are under consideration.

Resist materials for EB lithography are practically used in the mask image writing application. Recently, the mask manufacturing technology becomes of greater interest. Reduction projection exposure systems or steppers have been used since the time when the exposure light was g-line. While their demagnification factor was ⅕, a factor of ¼ is now used as a result of chip size enlargement and projection lens diameter increase. It becomes of concern that a dimensional error of a mask has an impact on the dimensional variation of a pattern on wafer. It is pointed out that as the pattern feature is reduced, the value of a dimensional variation on the wafer becomes greater than the value of a dimensional error of the mask. This is evaluated by a mask error enhancement factor (MEEF) which is a dimensional variation on wafer divided by a dimensional error of mask. Patterns on the order of 45 nm often show an MEEF in excess of 4. In a situation including a demagnification factor of ¼ and a MEEF of 4, the mask manufacture needs an accuracy substantially equivalent to that for equi-magnification masks.

The exposure system for mask manufacturing made a transition from the laser beam exposure system to the EB exposure system to increase the accuracy of line width. Since a further size reduction becomes possible by increasing the accelerating voltage of the electron gun in the EB exposure system, the accelerating voltage has increased from 10 keV to 30 keV and reached 50 keV in the current mainstream system, with a voltage of 100 keV being under investigation.

Chemically amplified resist compositions comprising an acid generator capable of generating an acid upon exposure to light or EB include chemically amplified positive resist compositions wherein deprotection reaction takes place under the action of acid and chemically amplified negative resist compositions wherein crosslinking reaction takes place under the action of acid. Quenchers are often added to these resist compositions for the purpose of controlling the diffusion of the acid to unexposed areas to improve the contrast. The addition of quenchers is fully effective to this purpose. A number of amine quenchers were proposed as disclosed in Patent Documents 1 to 3.

As the pattern feature size is reduced, approaching to the diffraction limit of light, light contrast lowers. In the case of positive resist film, a lowering of light contrast leads to reductions of resolution and focus margin of hole and trench patterns.

For mitigating the influence of reduced resolution of resist pattern due to a lowering of light contrast, an attempt is made to enhance the dissolution contrast of resist film. One such attempt is a chemically amplified resist material utilizing an acid amplifying mechanism that a compound is decomposed with an acid to generate another acid. In general, the concentration of acid creeps up linearly with an increase of exposure dose. In the case of the acid amplifying mechanism, the concentration of acid jumps up non-linearly as the exposure dose increases. The acid amplifying system is beneficial for further enhancing the advantages of chemically amplified resist film including high contrast and high sensitivity, but worsens the drawbacks of chemically amplified resist film that environmental resistance is degraded by amine contamination and maximum resolution is reduced by an increase of acid diffusion distance. The acid amplifying system is very difficult to control when implemented in practice.

Another approach for enhanced contrast is by reducing the concentration of amine with an increasing exposure dose. This may be achieved by applying a compound which loses the function of quencher upon light exposure.

With respect to the acid labile group used in methacrylate polymers for the ArF lithography, deprotection reaction takes place when a photoacid generator capable of generating a sulfonic acid having fluorine substituted at $\alpha$-position (referred to "$\alpha$-fluorinated sulfonic acid") is used, but not when an acid generator capable of generating a sulfonic acid not having fluorine substituted at $\alpha$-position (referred to "$\alpha$-non-fluorinated sulfonic acid") or carboxylic acid is used. If a sulfonium or iodonium salt capable of generating an $\alpha$-fluorinated sulfonic acid is combined with a sulfonium or iodonium salt capable of generating an $\alpha$-non-fluorinated sulfonic acid, the sulfonium or iodonium salt capable of generating an $\alpha$-non-fluorinated sulfonic acid undergoes ion exchange with the $\alpha$-fluorinated sulfonic acid. Through the ion exchange, the $\alpha$-fluorinated sulfonic acid thus generated by light exposure is converted back to the sulfonium or iodonium salt while the sulfonium or iodonium salt of an $\alpha$-non-fluorinated sulfonic acid or carboxylic acid functions as a quencher.

Further, the sulfonium or iodonium salt capable of generating an $\alpha$-non-fluorinated sulfonic acid also functions as a photodegradable quencher since it loses the quencher function by photodegradation.

Non-Patent Document 3 points out that the addition of a photodegradable quencher expands the margin of a trench pattern although the structural formula is not illustrated.

However, it has only a little influence on performance improvement. There is a desire to have a quencher for further improving contrast.

Patent Document 4 discloses an amine quencher which reduces its basicity through a mechanism that an acid labile group is eliminated under the action of acid, and lactam is then formed. Due to the mechanism that basicity is reduced under the action of acid, acid diffusion is controlled by high basicity in the unexposed region where the amount of acid generated is minimal, whereas acid diffusion is promoted due to reduced basicity of the quencher in the overexposed region where the amount of acid generated is large. This expands the difference in acid amount between the exposed and unexposed regions, from which an improvement in contrast is expected. However, the contrast enhancing effect is low since deprotection reaction of the base polymer and deprotection reaction of the quencher and ensuing lactam-forming reaction take place simultaneously in parallel. If the deprotection reaction of the quencher is slower than the deprotection reaction of the base polymer, the contrast enhancing effect is lower. There is a desire to have a quencher capable of further contrast improvement.

CITATION LIST

Patent Document 1: JP-A 2001-194776
Patent Document 2: JP-A 2002-226470
Patent Document 3: JP-A 2002-363148
Patent Document 4: JP-A 2012-137729 (US 20120141938)
Non-Patent Document 1: SPIE Vol. 5039 p1 (2003)
Non-Patent Document 2: SPIE Vol. 6520 p65203L-1 (2007)
Non-Patent Document 3: SPIE Vol. 7639 p76390W (2010)

DISCLOSURE OF INVENTION

A blend of an onium salt of α-non-fluorinated sulfonic acid or carboxylic acid with an onium salt of α-fluorinated sulfonic acid, imidic acid or methidic acid is effective for reducing LWR, but suffers from a low dissolution contrast. An amine compound quencher provides a high dissolution contrast, but is less effective for reducing LWR. There is a desire to have a quencher which offers a high dissolution contrast and reduced LWR.

An object of the invention is to provide a resist composition which exhibits a high dissolution contrast and reduced LWR independent of whether it is positive or negative working; and a pattern forming process using the same.

The inventors have found that a resist composition comprising a sulfonium or iodonium salt of a carboxylic acid having an acid-reactive group of specific structure is used to form a photoresist film having a high contrast and minimal LWR.

In one aspect, the invention provides a resist composition comprising a base polymer and a sulfonium salt having the general formula (1)-1 or a iodonium salt having the general formula (1)-2.

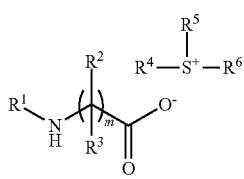
(1)-1

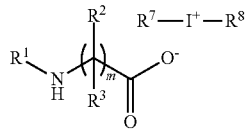
(1)-2

Herein $R^1$ is hydrogen, or a straight, branched or cyclic $C_1$-$C_{30}$ alkyl, $C_6$-$C_{30}$ aryl, $C_7$-$C_{30}$ aralkyl, $C_2$-$C_{30}$ alkenyl, $C_2$-$C_{10}$ alkynyl, or $C_4$-$C_{12}$ heterocyclic-bearing group, or a combination of such groups, which group may contain a hydroxyl, mercapto, carboxyl, ether, thioether, ester, sulfonic acid ester, sulfonyl, lactone ring, carbonyl, cyano, nitro, halogen, trifluoromethyl, amide, imide, sulfonamide, carbonate, sulfide, —N═CR—O—, —N═CR—S—, or ═N—O—N═moiety, or $R^1$ may be an acid labile group; R is hydrogen, mercapto, hydroxyl or $C_4$-$C_3$ alkyl, or may bond with the nitrogen atom in formula (1) to form a ring; $R^2$ and $R^3$ each are hydrogen, a straight or branched $C_1$-$C_4$ alkyl group or $C_2$-$C_4$ alkenyl group, or $R^2$ and $R^3$ may bond together to form a ring with the carbon atom to which they are attached; $R^4$, $R^5$ and $R^6$ are each independently a straight, branched or cyclic $C_1$-$C_{12}$ alkyl, alkenyl, oxoalkyl or oxoalkenyl group, $C_6$-$C_{20}$ aryl, $C_7$-$C_{12}$ aralkyl or aryloxoalkyl group, in which at least one hydrogen atom may be substituted by an ether, ester, carbonyl, carbonate, hydroxyl, carboxyl, halogen, cyano, amide, nitro, sultone, sulfonic acid ester, sulfone moiety, or sulfonium salt-containing substituent, $R^4$ and $R^5$ may bond together to form a ring with the sulfur atom to which they are attached; $R^7$ and $R^8$ each are a $C_6$-$C_{20}$ aryl group which may contain a straight, branched or cyclic $C_1$-$C_{10}$ alkyl or alkoxy moiety, and m is an integer of 2 to 8.

The resist composition may further comprise an acid generator capable of generating a sulfonic acid, imidic acid or methidic acid.

In a preferred embodiment, the base polymer comprises recurring units (a1) derived from (meth)acrylate, styrenecarboxylic acid or vinylnaphthalenecarboxylic acid having an acid labile group substituted thereon, or recurring units (a2) derived from hydroxystyrene having an acid labile group substituted thereon, as represented by the general formula (2):

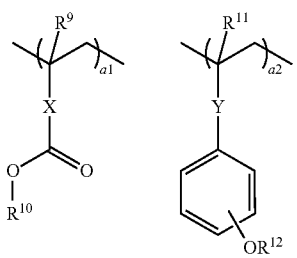
(2)

wherein $R^9$ and $R^{11}$ are each independently hydrogen or methyl, X is a single bond, a $C_1$-$C_{12}$ linking group having an ester moiety or lactone ring, phenylene group or naphthylene group, Y is a single bond or ester group, and $R^{10}$ and $R^{12}$ are each independently an acid labile group.

The resist composition may further comprise an organic solvent, the resist composition being a chemically amplified positive resist composition. Further a dissolution inhibitor may be added.

The resist composition may further comprise an organic solvent, the composition being a chemically amplified negative resist composition. Further a crosslinker may be added.

In any embodiment, a surfactant may be added.

In a preferred embodiment, the base polymer has further copolymerized therein recurring units of at least one type selected from sulfonium salt units (f1) to (f3), as represented by the general formula (3).

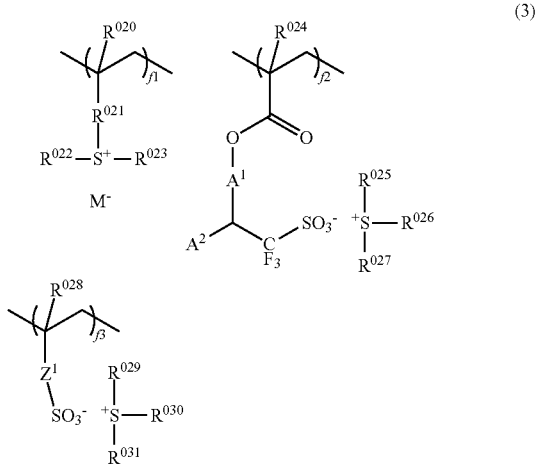

Herein $R^{020}$, $R^{024}$, and $R^{028}$ each are hydrogen or methyl, R is a single bond, phenylene, —O—$R^{033}$—, or —C(=O)—$Y^1$—$R^{033}$—, $Y^1$ is oxygen or NH, $R^{033}$ is a straight, branched or cyclic $C_1$-$C_6$ alkylene group, alkenylene group or phenylene group, which may contain a carbonyl (—CO—), ester (—COO—), ether (—O—), or hydroxyl moiety, $R^{022}$, $R^{023}$, $R^{025}$, $R^{026}$, $R^{027}$, $R^{029}$, $R^{030}$, and $R^{031}$ are each independently a straight, branched or cyclic $C_1$-$C_{12}$ alkyl group which may contain a carbonyl, ester or ether moiety, a $C_6$-$C_{12}$ aryl group, a $C_7$-$C_{20}$ aralkyl group, or a thiophenyl group, $A^1$ is a single bond, -$A^0$-C(=O)—O—, -$A^0$-O— or -$A^0$-O—C(=O)—, $A^0$ is a straight, branched or cyclic $C_1$-$C_{12}$ alkylene group which may contain a carbonyl, ester or ether moiety, $A^2$ is hydrogen, $CF_3$ or carbonyl group, $Z^1$ is a single bond, methylene, ethylene, phenylene, fluorinated phenylene, —O—$R^{032}$—, or —C(=O)—$Z^2$—$R^{032}$—, $Z^2$ is oxygen or NH, $R^{032}$ is a straight, branched or cyclic $C_1$-$C_6$ alkylene, phenylene, fluorinated phenylene, trifluoromethyl-substituted phenylene or alkenylene group, which may contain a carbonyl, ester, ether or hydroxyl moiety, M is a non-nucleophilic counter ion, subscripts f1, f2 and f3 are numbers in the range: $0 \le f1 \le 0.5$, $0 \le f2 \le 0.5$, $0 \le f3 \le 0.5$, and $0 < f1+f2+f3 \le 0.5$.

In another aspect, the invention provides a process for forming a pattern comprising the steps of applying the resist composition defined above onto a substrate, baking to form a resist film, exposing the resist film to high-energy radiation, and developing the exposed film with a developer. Typically, the high-energy radiation is ArF excimer laser radiation of 193 nm wavelength, KrF excimer laser radiation of 248 nm wavelength, EB, or extreme ultraviolet radiation of 3 to 15 nm wavelength.

Advantageous Effects of Invention

By virtue of a high dissolution contrast, a photoresist film containing a sulfonium or iodonium salt of a carboxylic acid having an acid-reactive group of specific structure offers improved resolution, wide focus margin and minimal LWR when used as a positive resist film subject to alkaline development, a negative resist film, and a negative resist film subject to organic solvent development.

DESCRIPTION OF EMBODIMENTS

As used herein, the singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The notation ($C_n$-$C_m$) means a group containing from n to m carbon atoms per group. The term "(meth)acrylate" refers collectively to acrylate and methacrylate.

The abbreviations and acronyms have the following meaning.

Mw: weight average molecular weight
Mn: number average molecular weight
Mw/Mn: molecular weight distribution or dispersity
GPC: gel permeation chromatography
PEB: post-exposure bake
PAG: photoacid generator
EB: electron beam
EUV: extreme ultraviolet
LWR: line width roughness
LER: line edge roughness
DOF: depth of focus The invention pertains to a resist composition, specifically chemically amplified positive or negative resist composition, comprising a base polymer, a sulfonium or iodonium salt of a carboxylic acid having an acid-reactive group of specific structure, and preferably an acid generator capable of generating a sulfonic acid, imidic acid (imide acid) or methidic acid (methide acid). A pattern is formed by applying the resist composition onto a substrate, pre-baking the composition to evaporate off any unnecessary solvent and to form a resist film, exposing the resist film to high-energy radiation, PEB, and developing the exposed film with alkaline water to form a positive pattern or with an organic solvent to form a negative pattern.

The sulfonium salt according to the invention is an acid generator in that it is capable of generating a carboxylic acid of specific structure upon light exposure and at the same time, a quencher in that it has an amino group. Since the carboxylic acid has an acidity insufficient to induce deprotection reaction of acid labile groups, it is recommended to separately add an acid generator capable of generating a sulfonic acid, imidic acid or methidic acid serving as strong acid enough to induce deprotection reaction of acid labile groups. The acid generator capable of generating a sulfonic acid, imidic acid or methidic acid may be of addition type or bound type (i.e., bound in a base polymer).

When a mixture of an acid generator capable of generating carboxylic acid and an acid generator capable of generating perfluoroalkylsulfonic acid (which is a superstrong acid) is exposed to light, these acid generators generate carboxylic acid and perfluoroalkylsulfonic acid, as shown in formulae (3)-1 and (3)-2 below, respectively. Since not all acid generators are decomposed, undecomposed acid generators are left in their proximity. As shown in formula (3)-3, where a sulfonium salt capable of generating carboxylic acid and perfluoroalkylsulfonic acid are co-present, ion exchange occurs therebetween whereby a sulfonium salt of perfluoroalkylsulfonic acid is created and carboxylic acid is released. This is because the salt of perfluoroalkylsulfonic acid having a higher acid strength is stabler. On the other hand, as shown in formula (3)-4, where a sulfonium salt of perfluoroalkylsulfonic acid and carboxylic acid are co-present, no ion exchange occurs. The ion exchange due to the sequence of acid strength occurs not only on sulfonium salts, but also on iodonium salts. The ion exchange occurs not only on perfluoroalkylsulfonic acids, but also on arylsulfonic acids, alkylsulfonic acids, imidic acids and methidic acids having a higher acid strength than carboxylic acids.

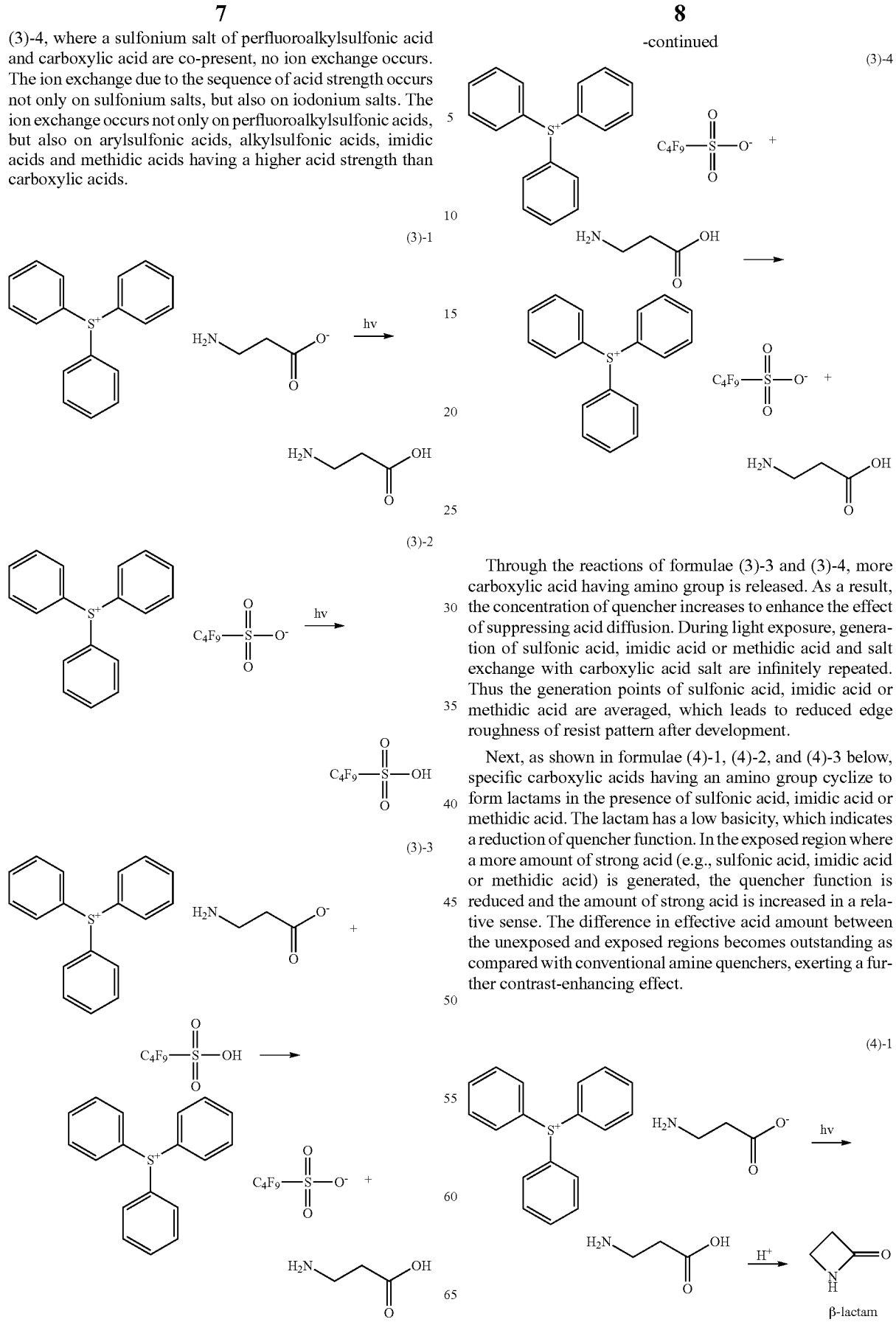

Through the reactions of formulae (3)-3 and (3)-4, more carboxylic acid having amino group is released. As a result, the concentration of quencher increases to enhance the effect of suppressing acid diffusion. During light exposure, generation of sulfonic acid, imidic acid or methidic acid and salt exchange with carboxylic acid salt are infinitely repeated. Thus the generation points of sulfonic acid, imidic acid or methidic acid are averaged, which leads to reduced edge roughness of resist pattern after development.

Next, as shown in formulae (4)-1, (4)-2, and (4)-3 below, specific carboxylic acids having an amino group cyclize to form lactams in the presence of sulfonic acid, imidic acid or methidic acid. The lactam has a low basicity, which indicates a reduction of quencher function. In the exposed region where a more amount of strong acid (e.g., sulfonic acid, imidic acid or methidic acid) is generated, the quencher function is reduced and the amount of strong acid is increased in a relative sense. The difference in effective acid amount between the unexposed and exposed regions becomes outstanding as compared with conventional amine quenchers, exerting a further contrast-enhancing effect.

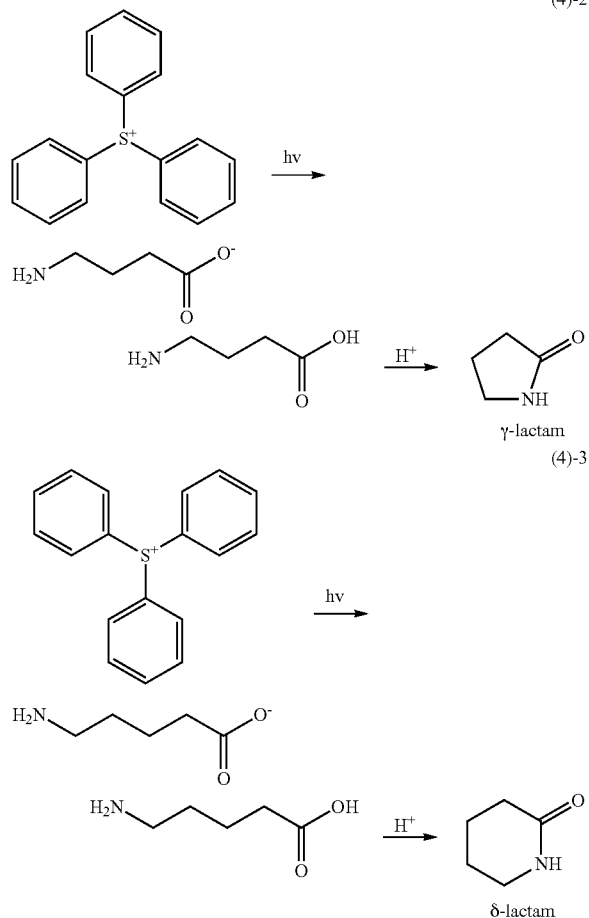

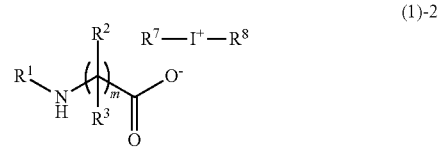

While the sulfonium or iodonium salt of specific carboxylic acid having an amino group is essential for the resist composition of the invention, another sulfonium or iodonium salt may be separately added as quencher. Suitable sulfonium and iodonium salts which can be added as quencher include sulfonium and iodonium salts of carboxylic acids, sulfonic acids, imidic acids and saccharin. The carboxylic acids used herein may or may not be fluorinated at α-position.

The contrast enhancing effect of the sulfonium or iodonium salt of specific carboxylic acid having an amino group will appear in any of positive pattern formation and negative pattern formation via aqueous alkaline development, and negative pattern formation via organic solvent development.

Below, components of the resist composition are described in detail.

The sulfonium or iodonium salt of specific carboxylic acid having an amino group has the general formula (1)-1 or (1)-2.

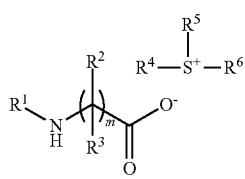

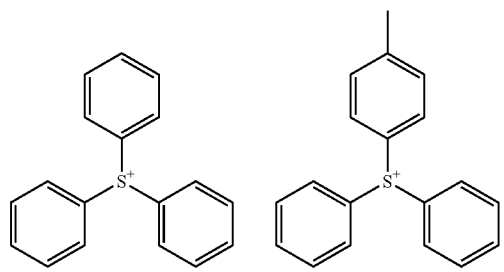

Herein $R^1$ is hydrogen, or a straight, branched or cyclic $C_1$-$C_{30}$ alkyl, $C_6$-$C_{30}$ aryl, $C_7$-$C_{30}$ aralkyl, $C_2$-$C_{30}$ alkenyl, $C_2$-$C_{10}$ alkynyl, or $C_4$-$C_{12}$ heterocyclic-bearing group, or a combination of such groups, which group may contain a hydroxyl, mercapto, carboxyl, ether, thio ether, ester, sulfonic acid ester, sulfonyl, lactone ring, carbonyl, cyano, nitro, halogen, trifluoromethyl, amide, imide, sulfonamide, carbonate, sulfide, —N=CR—O—, —N=CR—S—, or =N—O—N=moiety, or $R^1$ may be an acid labile group. R is hydrogen, mercapto, hydroxyl or $C_4$-$C_3$ alkyl, or may bond with the nitrogen atom in formula (1) to form a ring. $R^2$ and $R^3$ each are hydrogen, a straight or branched $C_1$-$C_4$ alkyl group or $C_2$-$C_4$ alkenyl group, or $R^2$ and $R^3$ may bond together to form a ring with the carbon atom to which they are attached. $R^4$, $R^5$ and $R^6$ are each independently a straight, branched or cyclic $C_1$-$C_{12}$ alkyl, alkenyl, oxoalkyl or oxoalkenyl group, $C_6$-$C_{20}$ aryl, $C_7$-$C_{12}$ aralkyl or aryloxoalkyl group, in which at least one hydrogen atom (one or more or all hydrogen atoms) may be substituted by an ether, ester, carbonyl, carbonate, hydroxyl, carboxyl, halogen, cyano, amide, nitro, sultone, sulfonic acid ester, sulfone moiety, or sulfonium salt-containing substituent, $R^4$ and $R^5$ may bond together to form a ring with the sulfur atom to which they are attached. $R^7$ and $R^8$ each are a $C_6$-$C_{20}$ aryl group which may contain a straight, branched or cyclic $C_1$-$C_{10}$ alkyl or alkoxy moiety, and m is an integer of 2 to 8.

Examples of the cation moiety of the sulfonium salt having formula (1)-1 and the iodonium salt having formula (1)-2 are illustrated below.

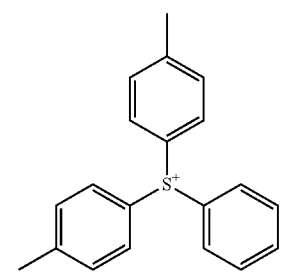

-continued
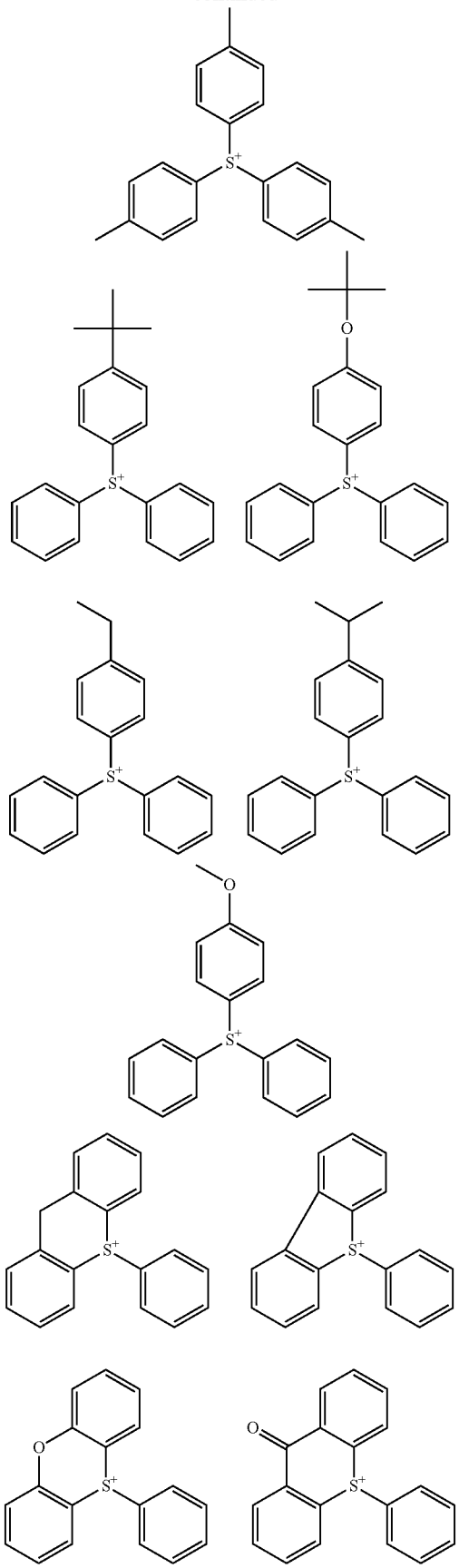
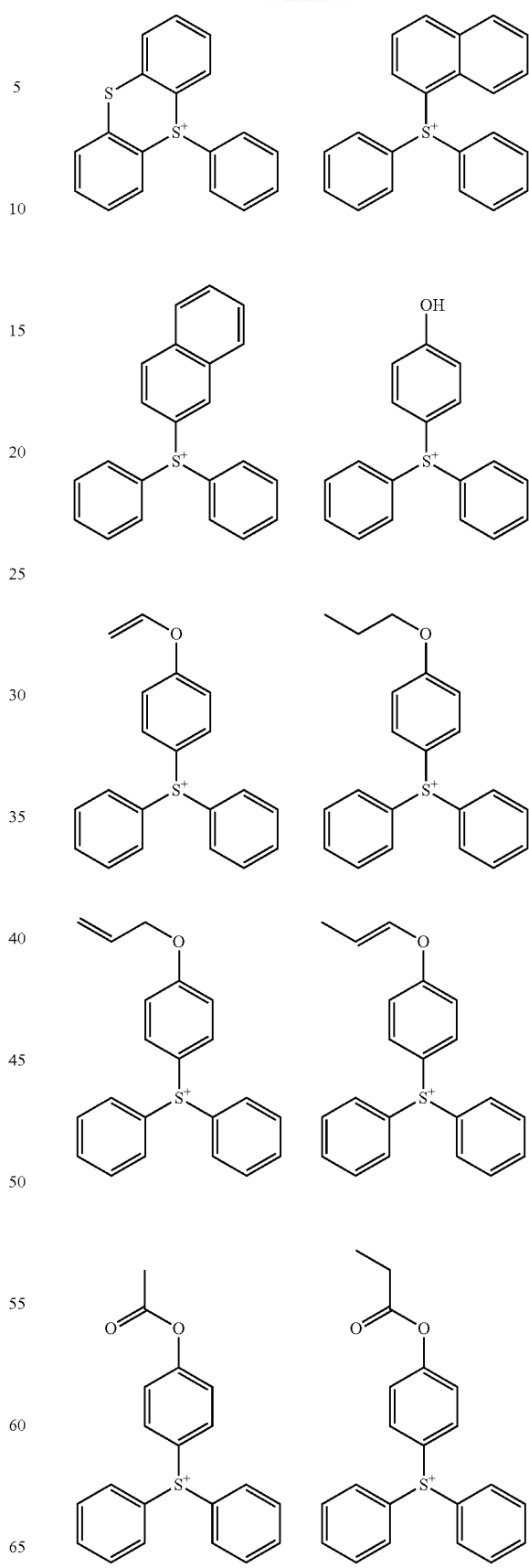

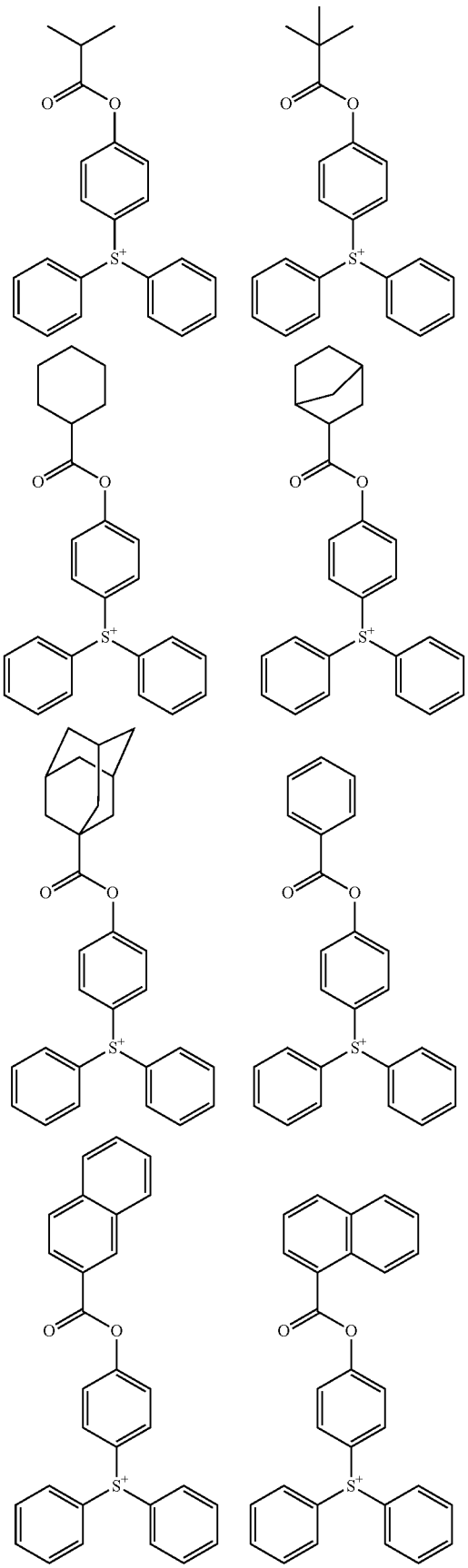
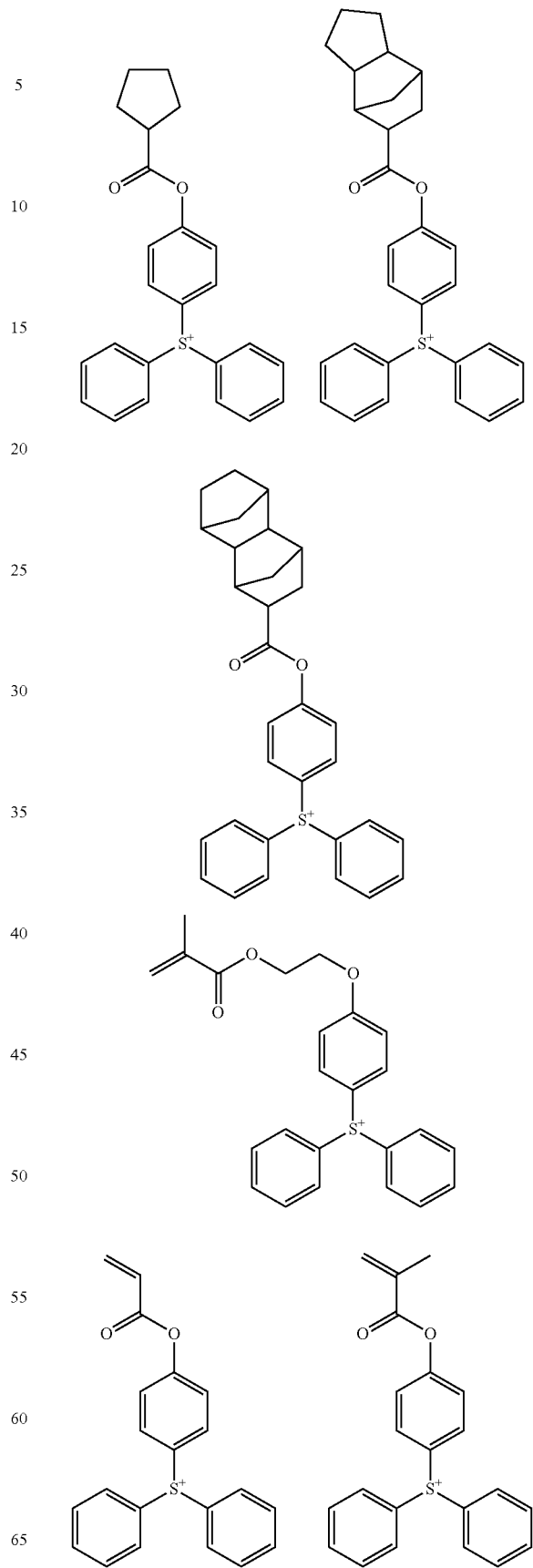

-continued
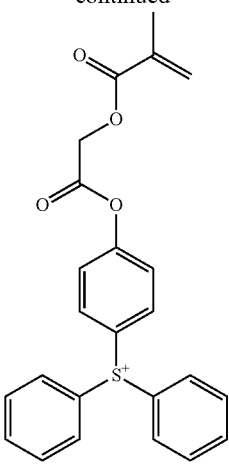
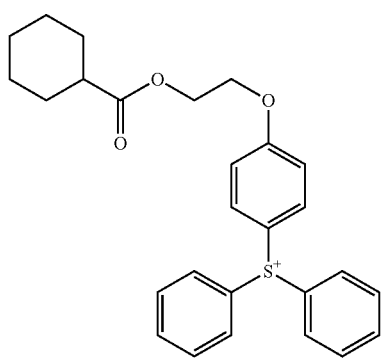
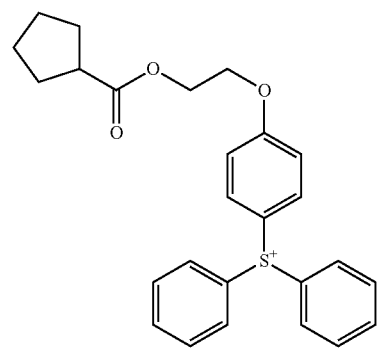
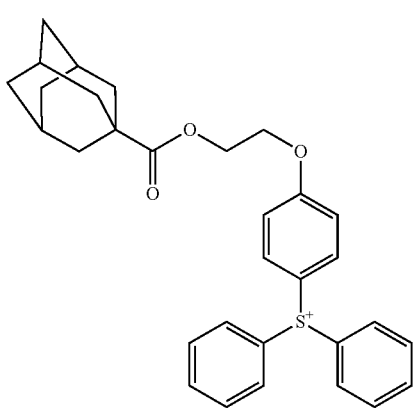
-continued
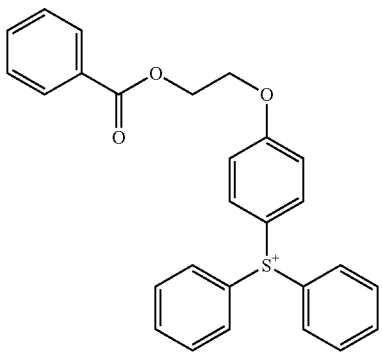
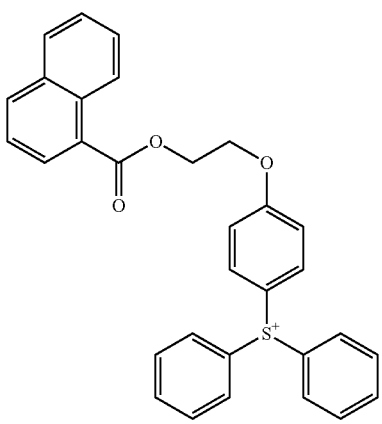
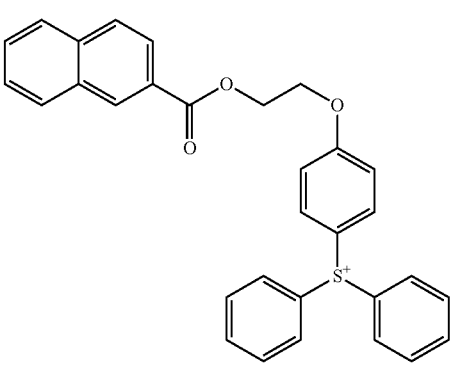
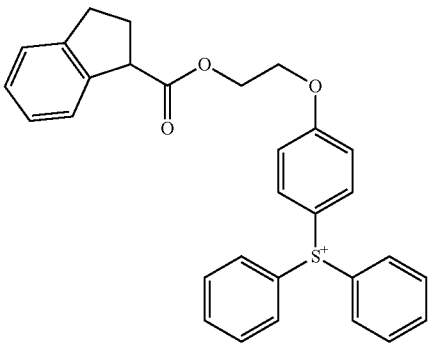

17
-continued
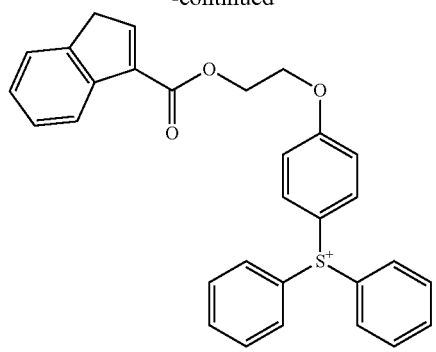
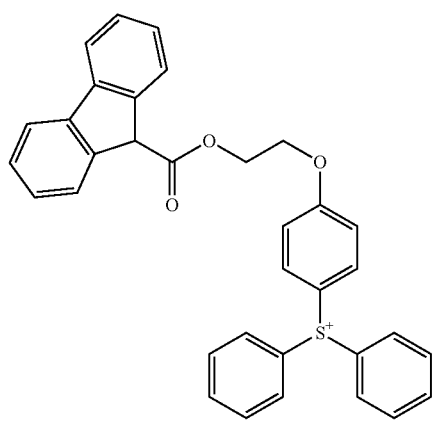
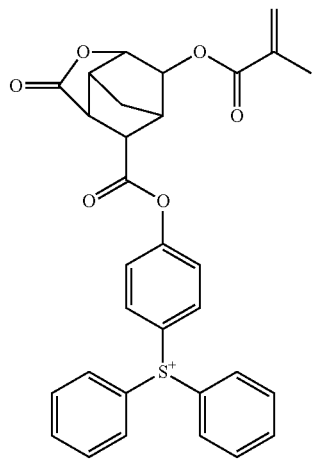
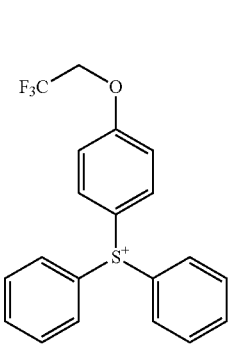
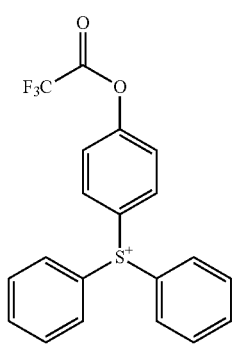
18
-continued
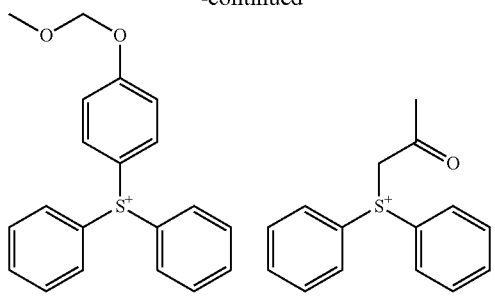
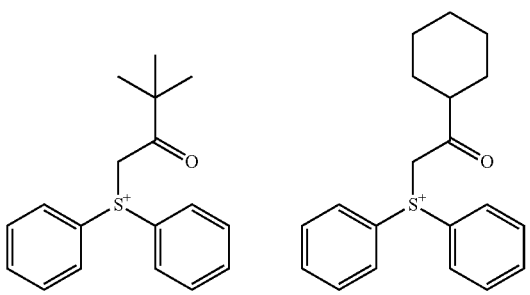
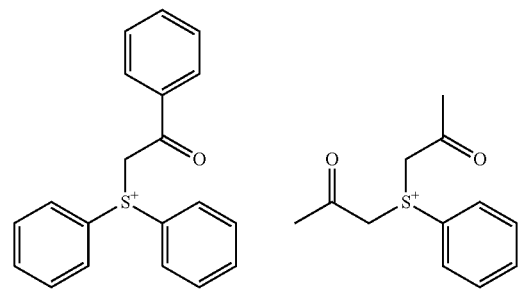
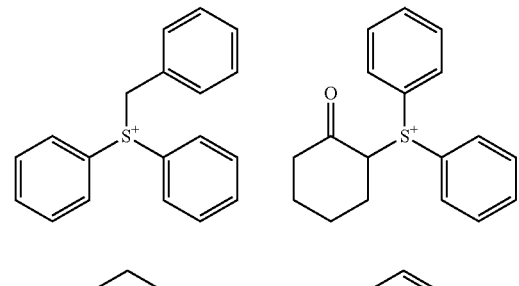
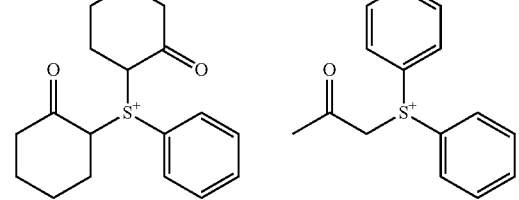
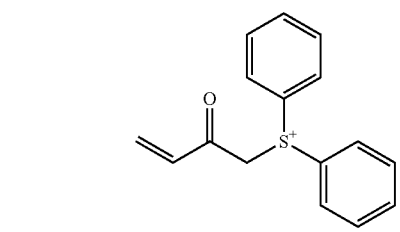

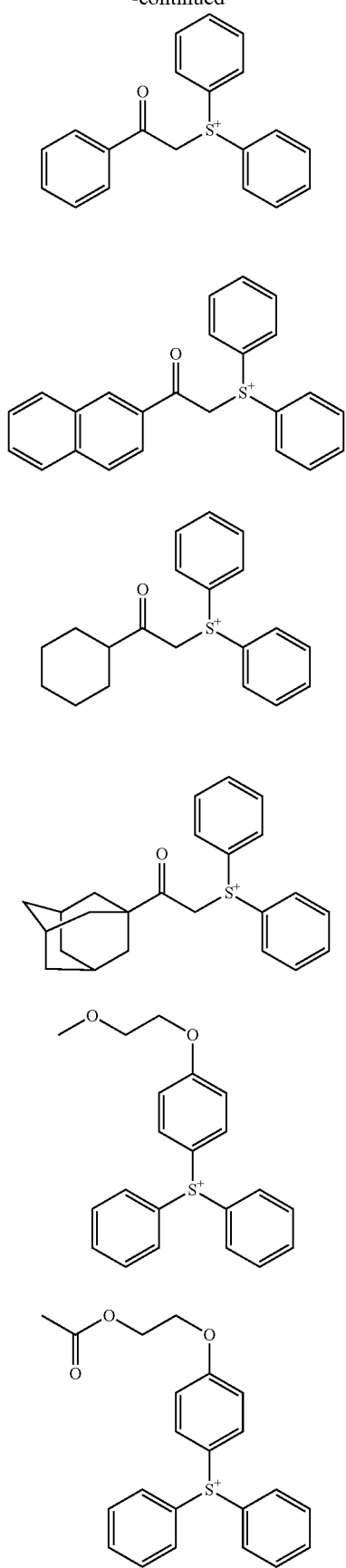
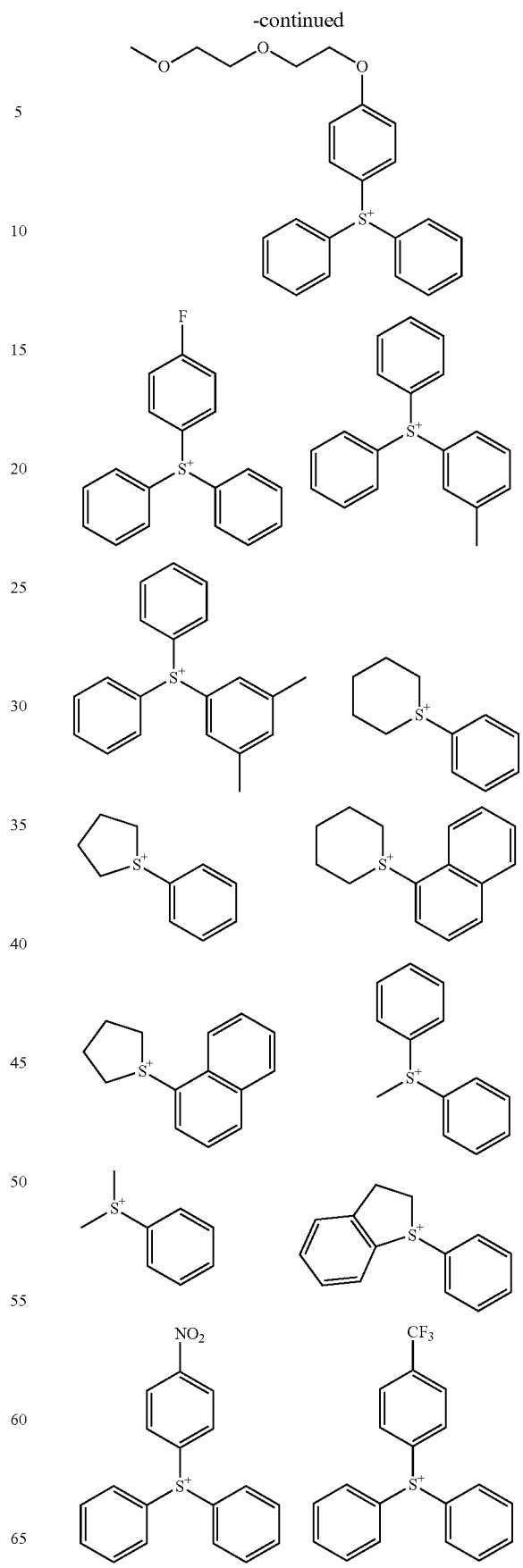

-continued
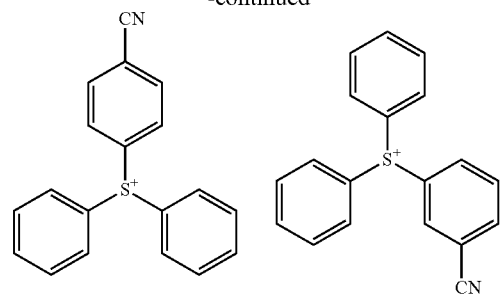
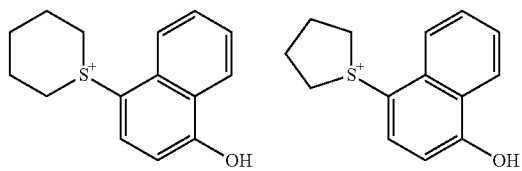
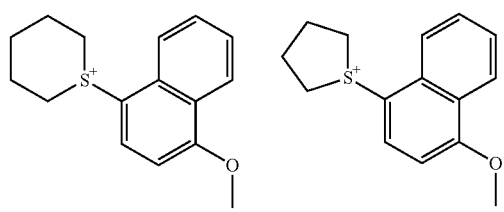
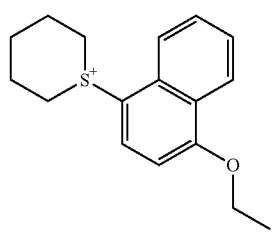
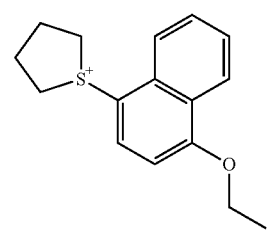
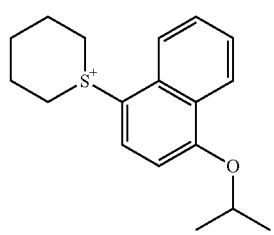
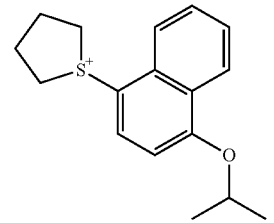
-continued
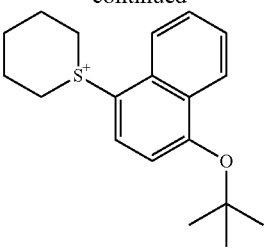
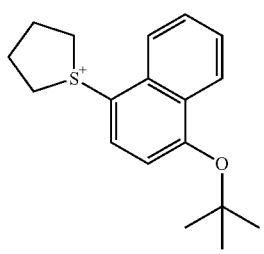
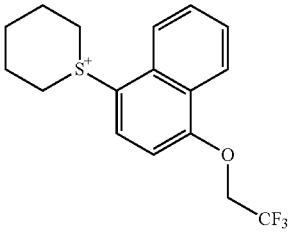
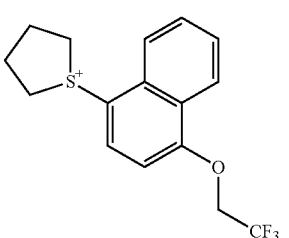
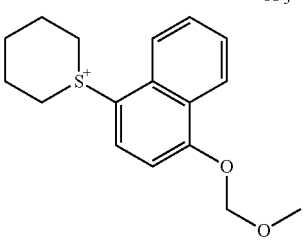
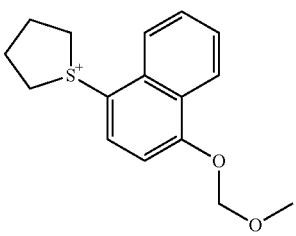
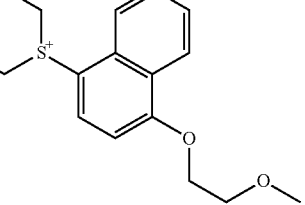

23
-continued
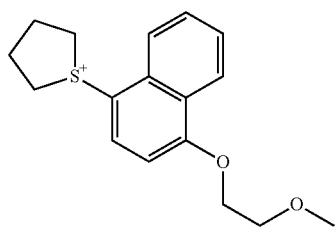
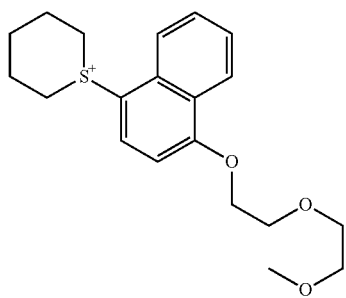
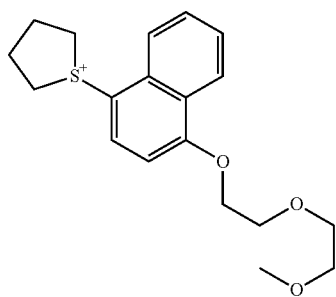
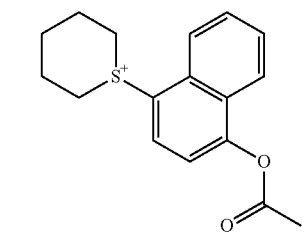
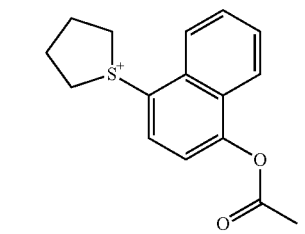
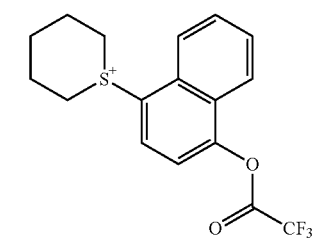
24
-continued
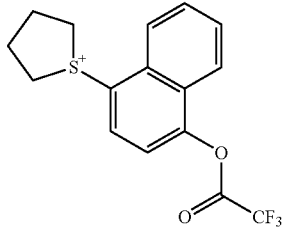
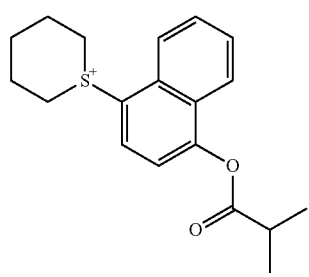
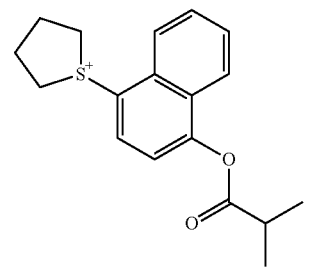
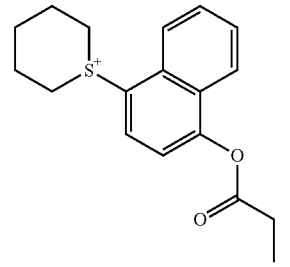
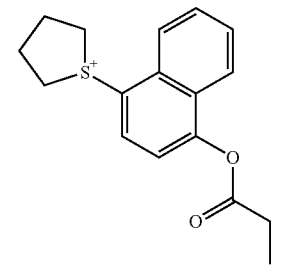
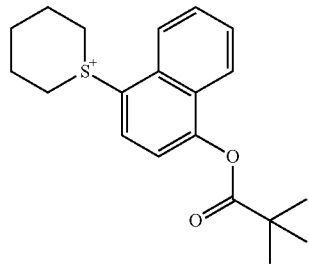

25
-continued
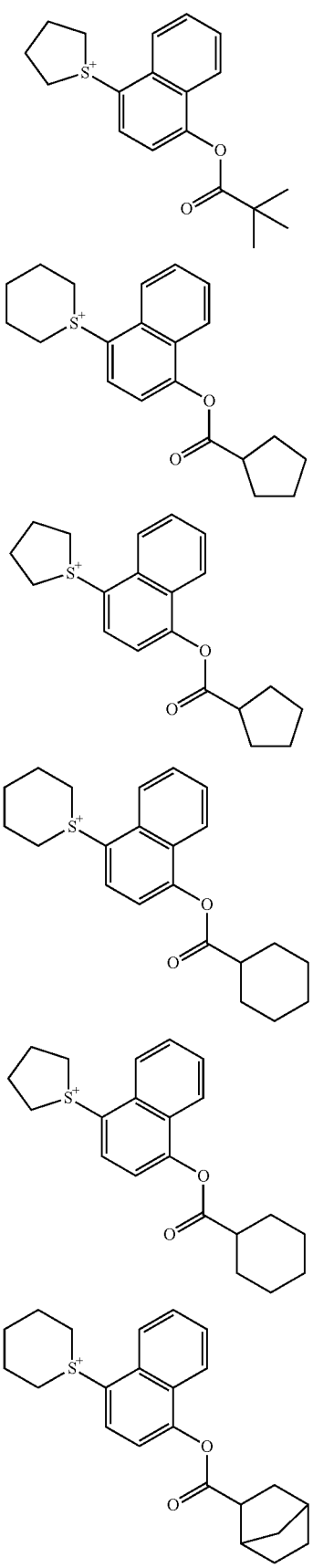
26
-continued
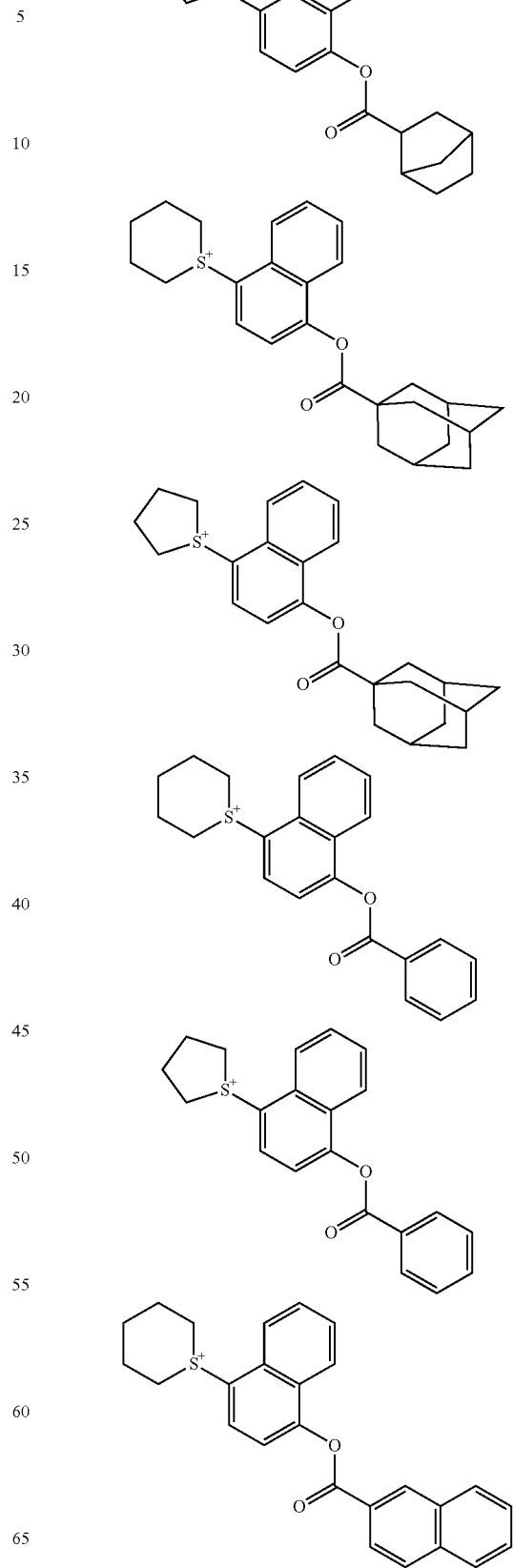

27
-continued
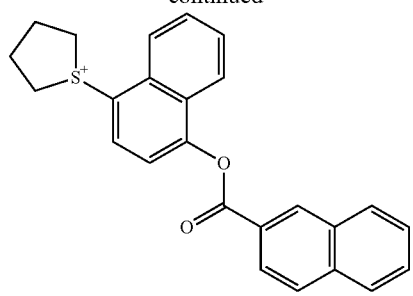
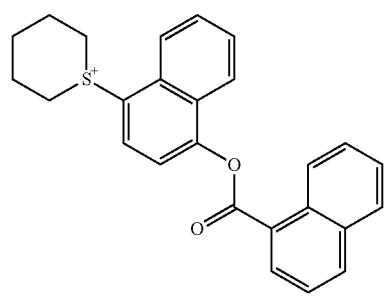
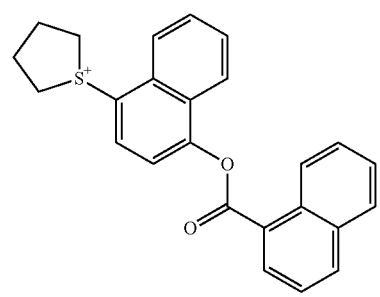
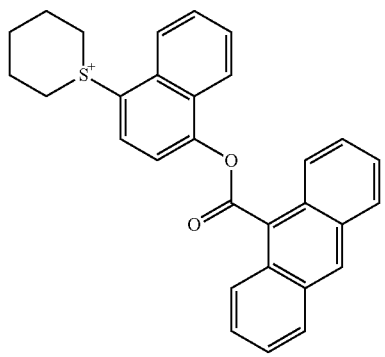
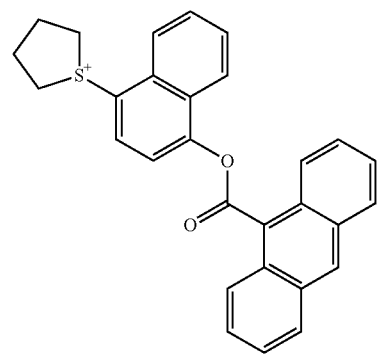
28
-continued
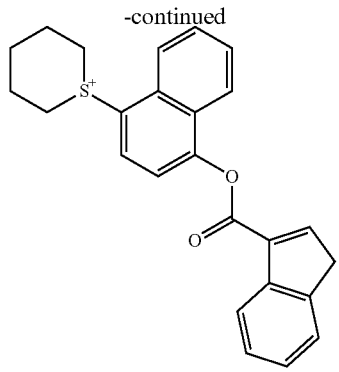
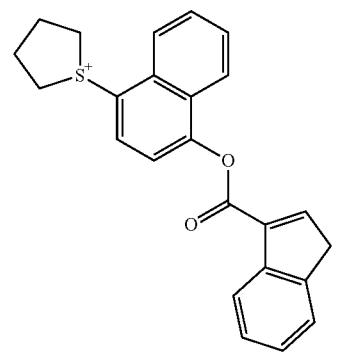
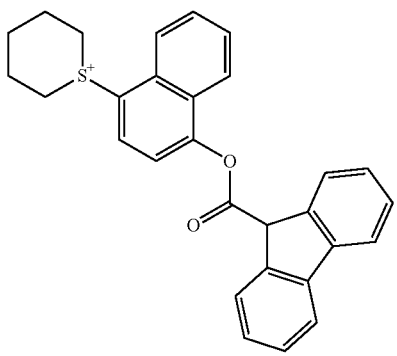
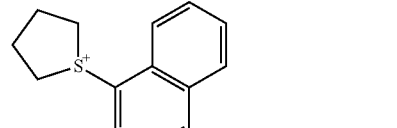
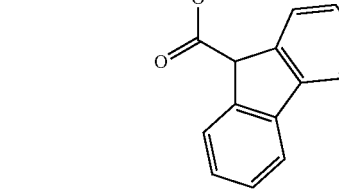
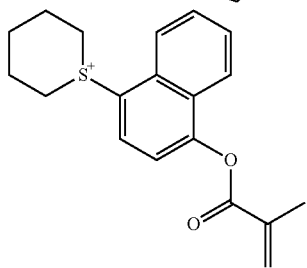

-continued
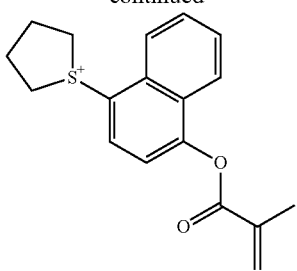
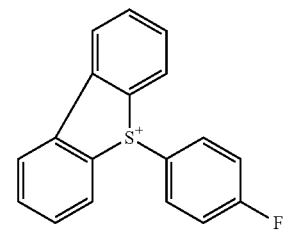
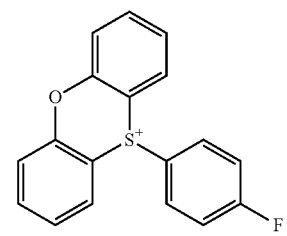
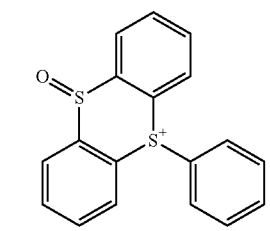
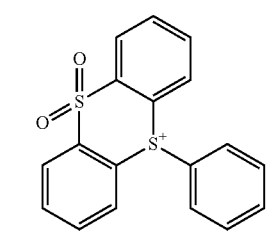
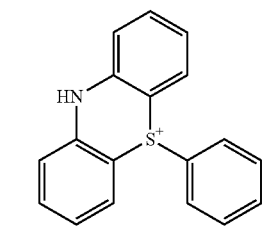
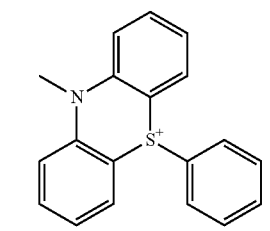
-continued
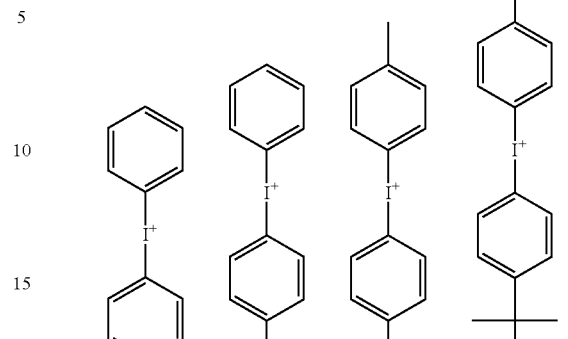
Examples of $(CR^2R^3)_m$ moiety on the anion side of the compound having formula (1) are illustrated below.

31
-continued
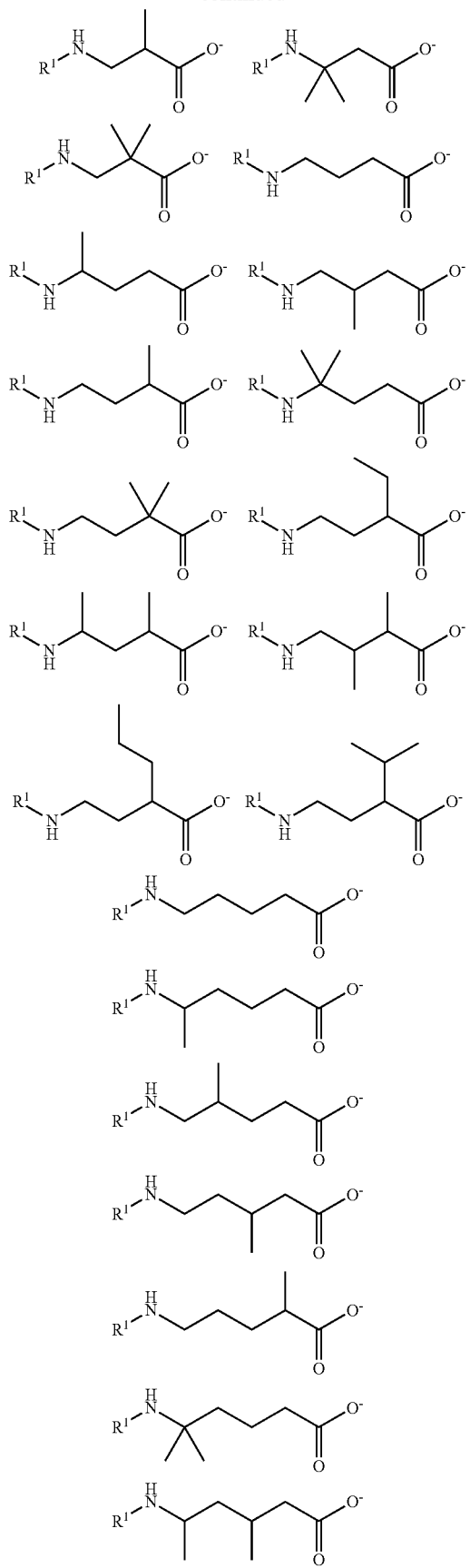
32
-continued
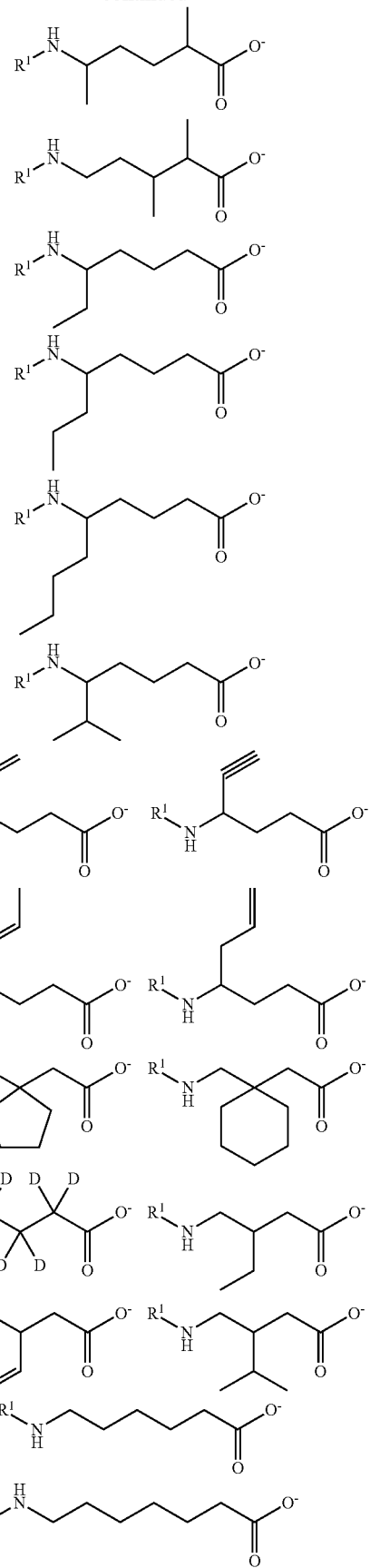

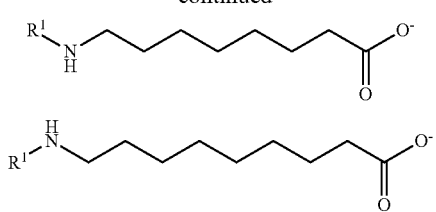
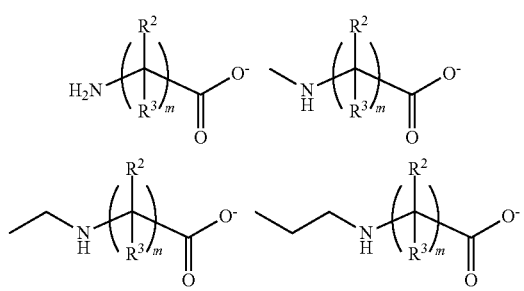
Herein R¹ is as defined above, and D is deuterium.
Examples of R¹ in formula (1) are illustrated below by the overall structure of the anion moiety of the salt having formula (1).
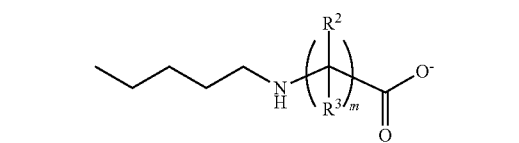
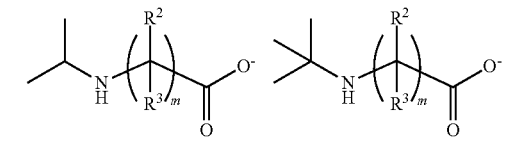
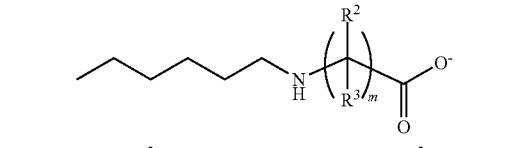
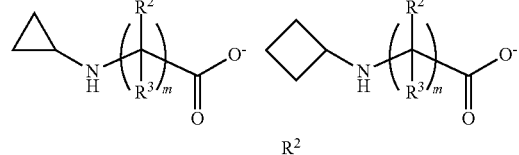
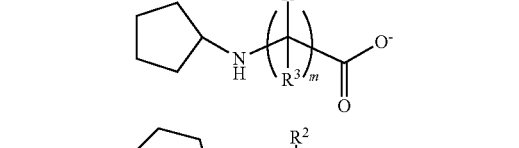
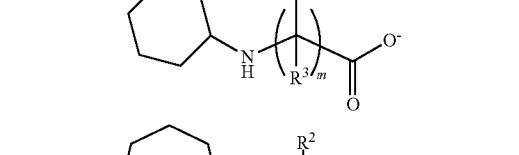
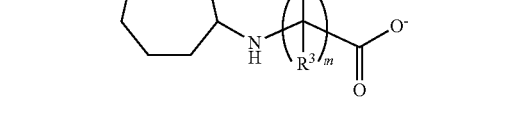
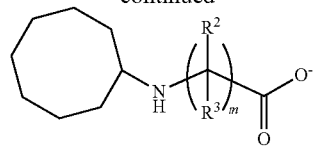
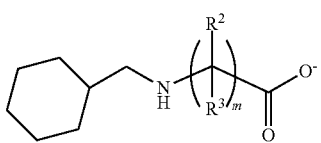
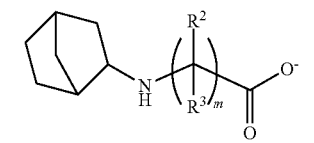
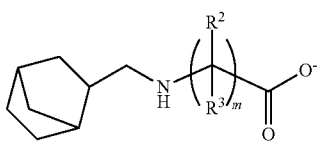
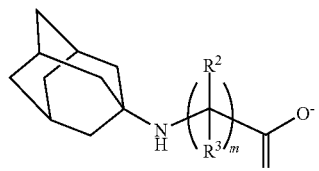
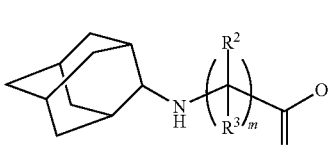
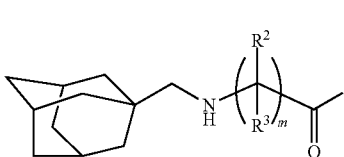
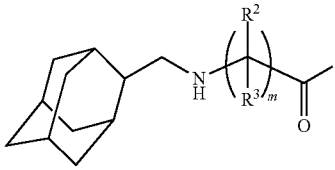
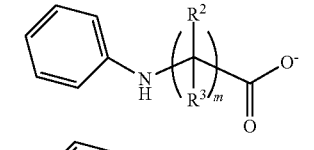
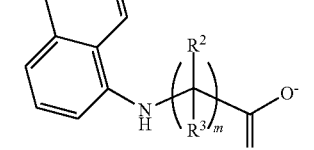

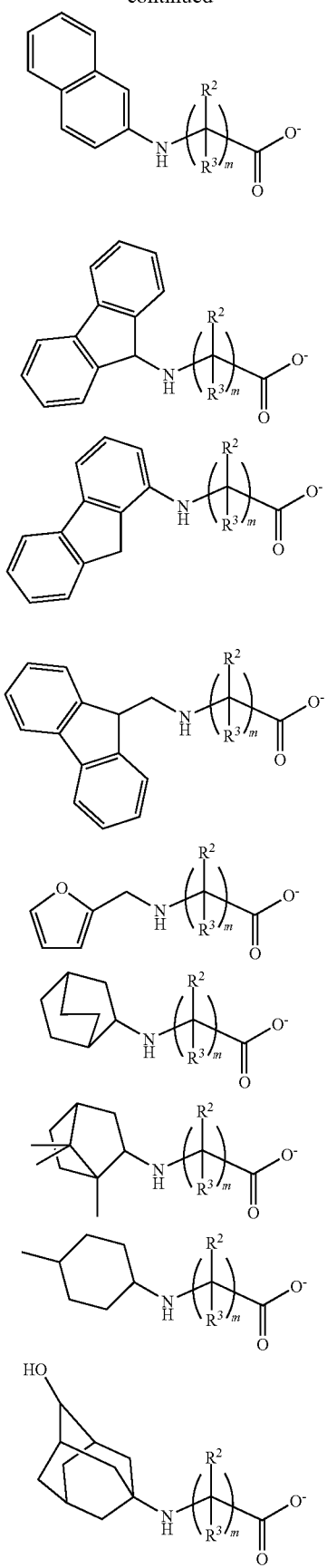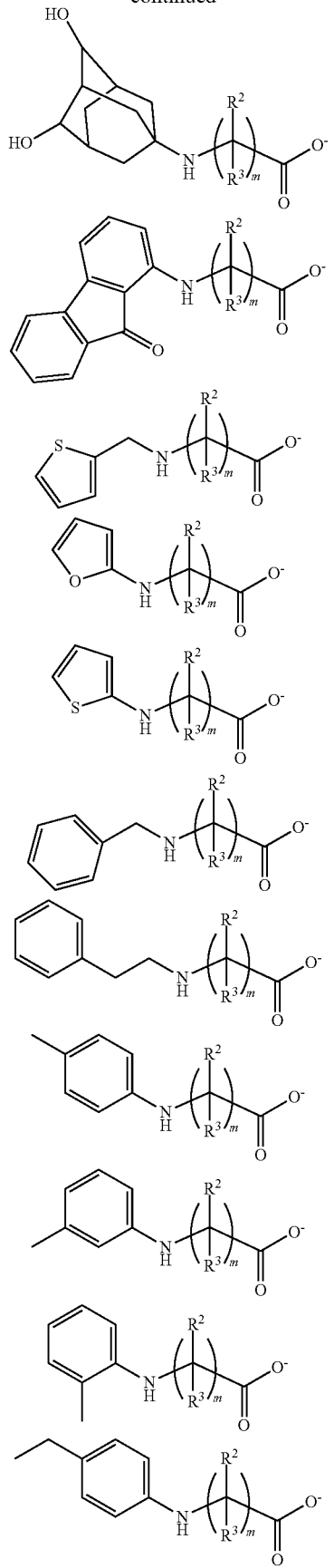

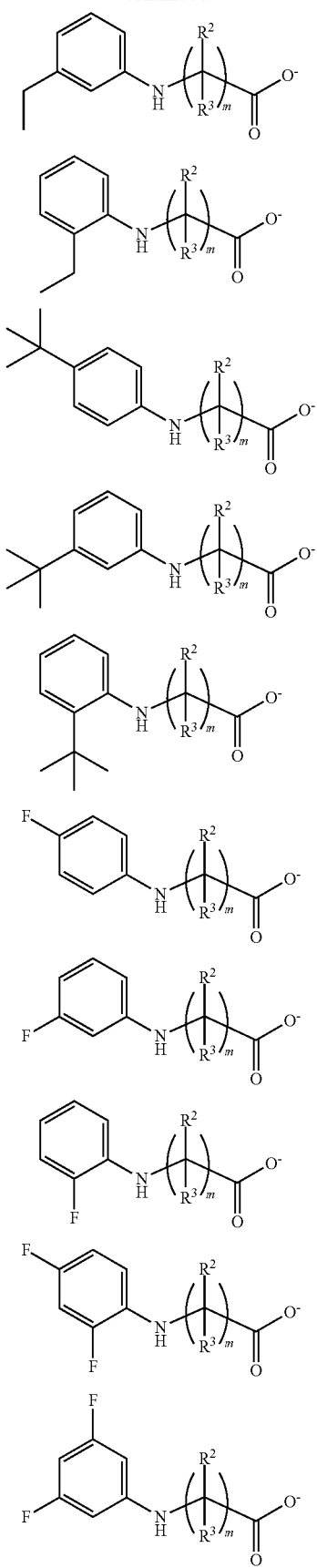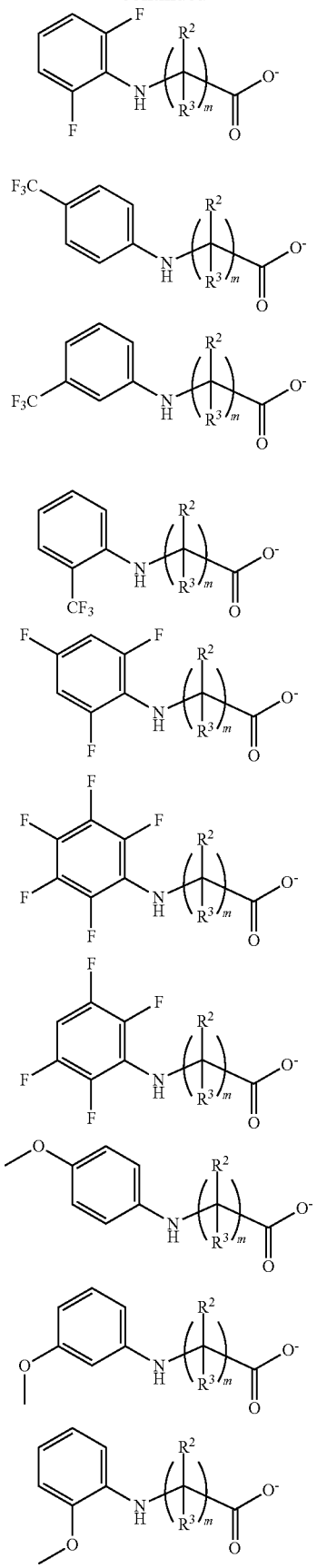

-continued
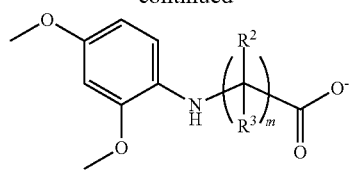
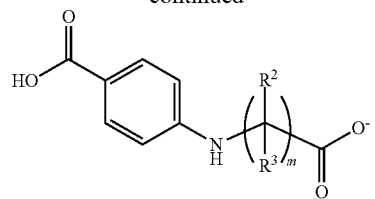
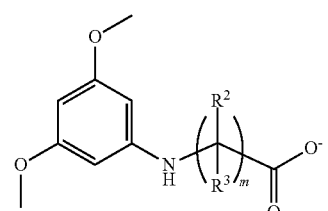
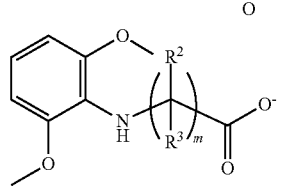
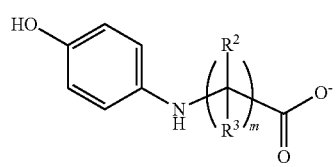
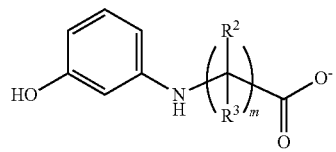
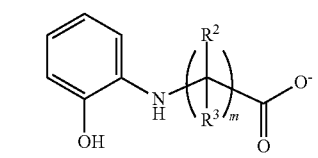
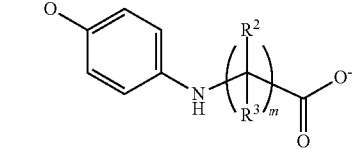
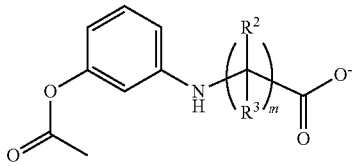
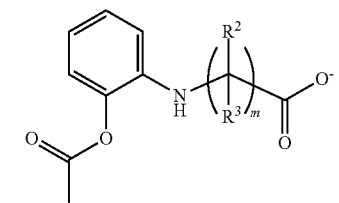

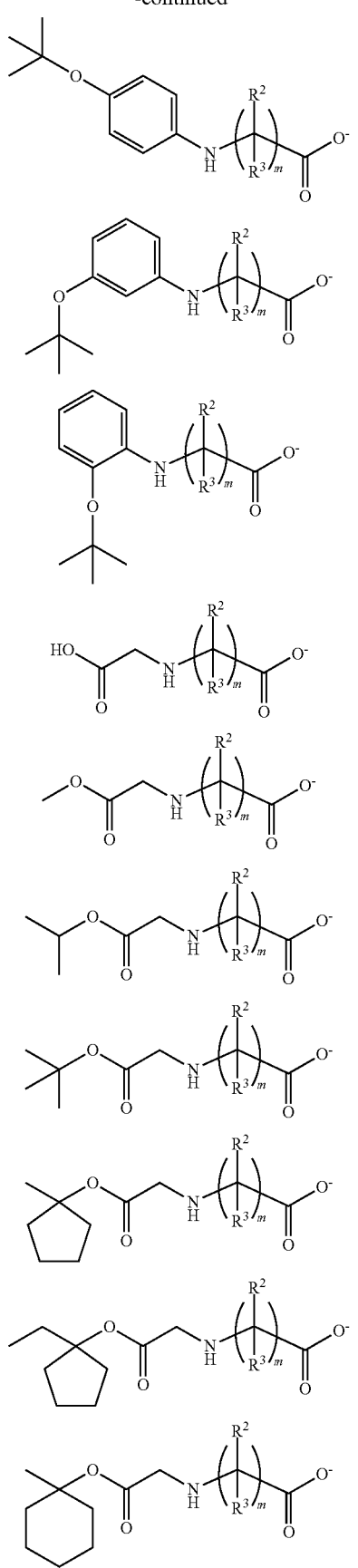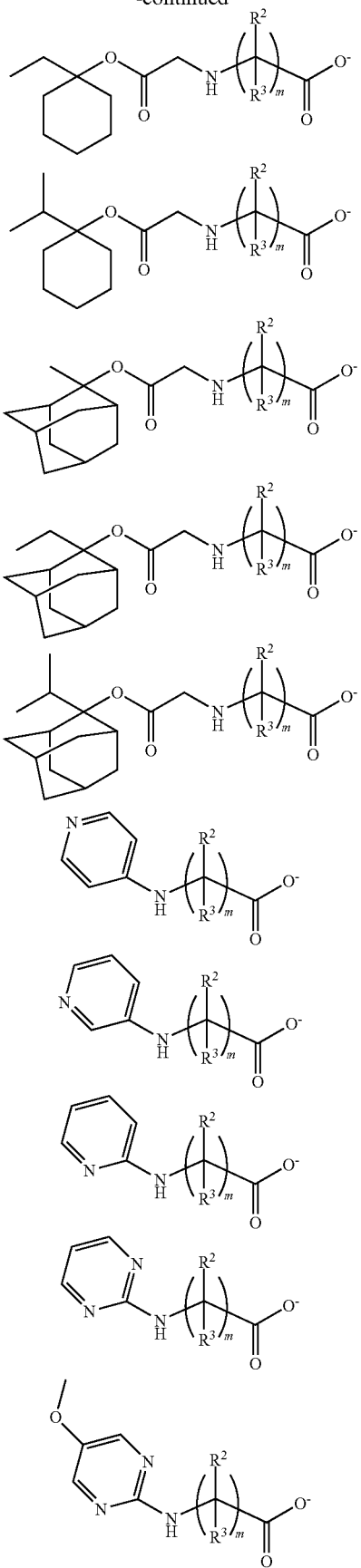

-continued

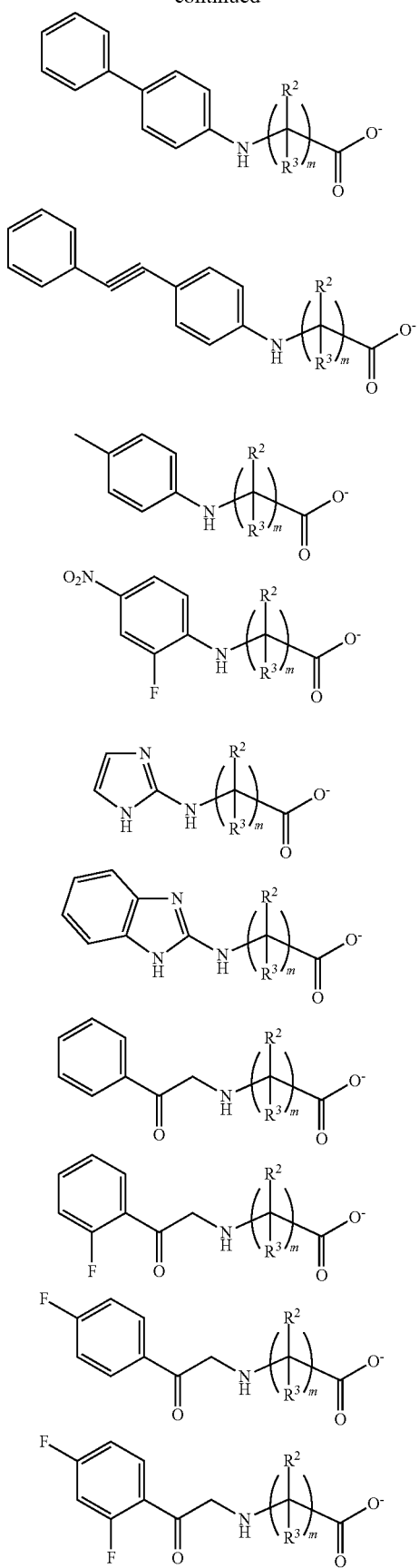
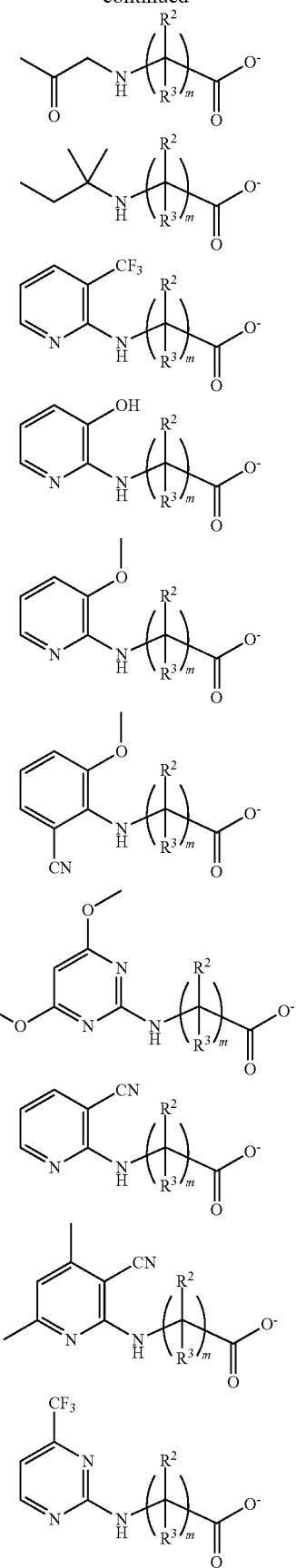

-continued
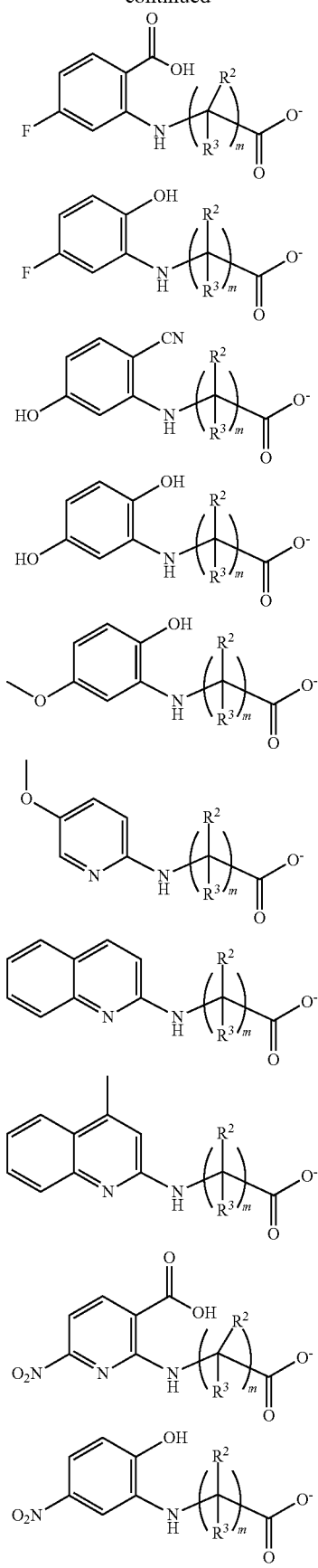
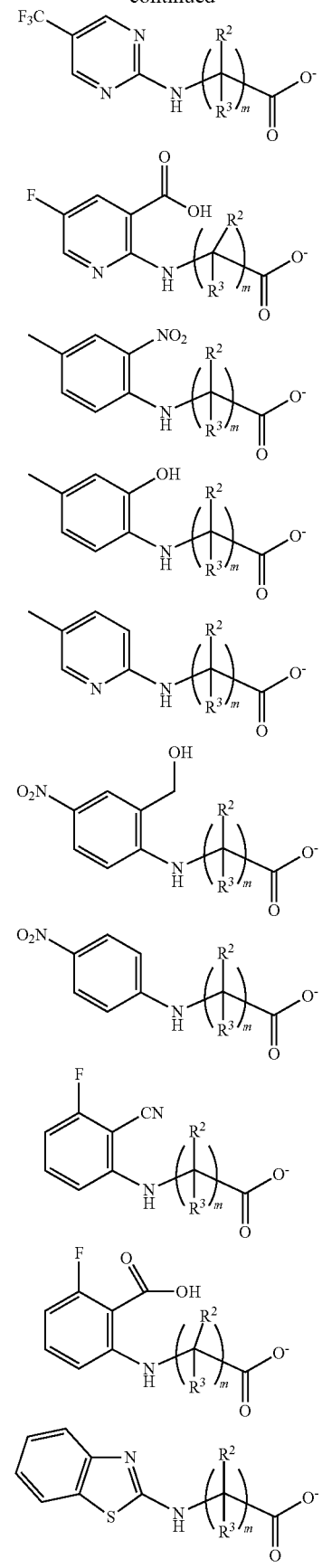

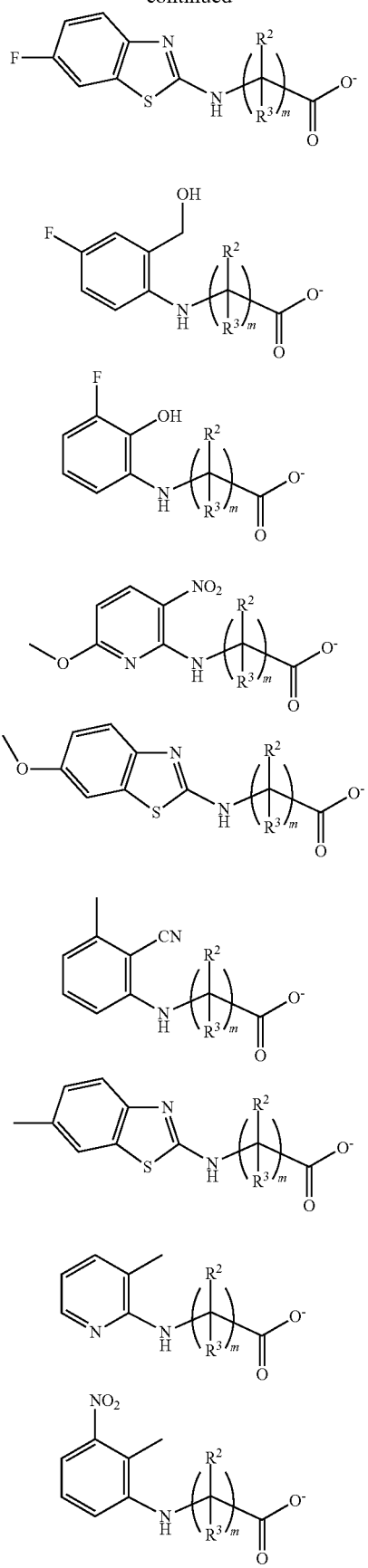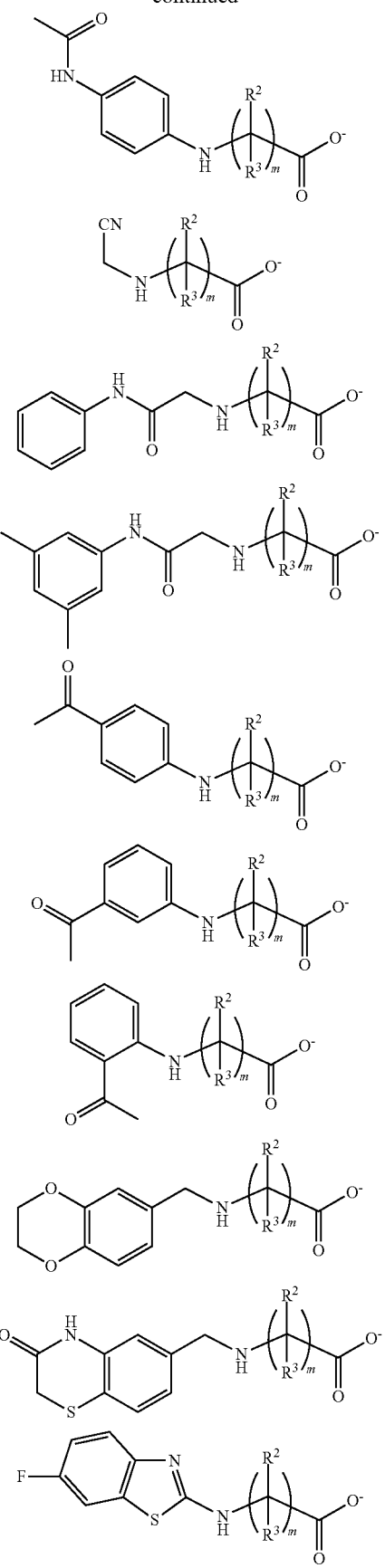

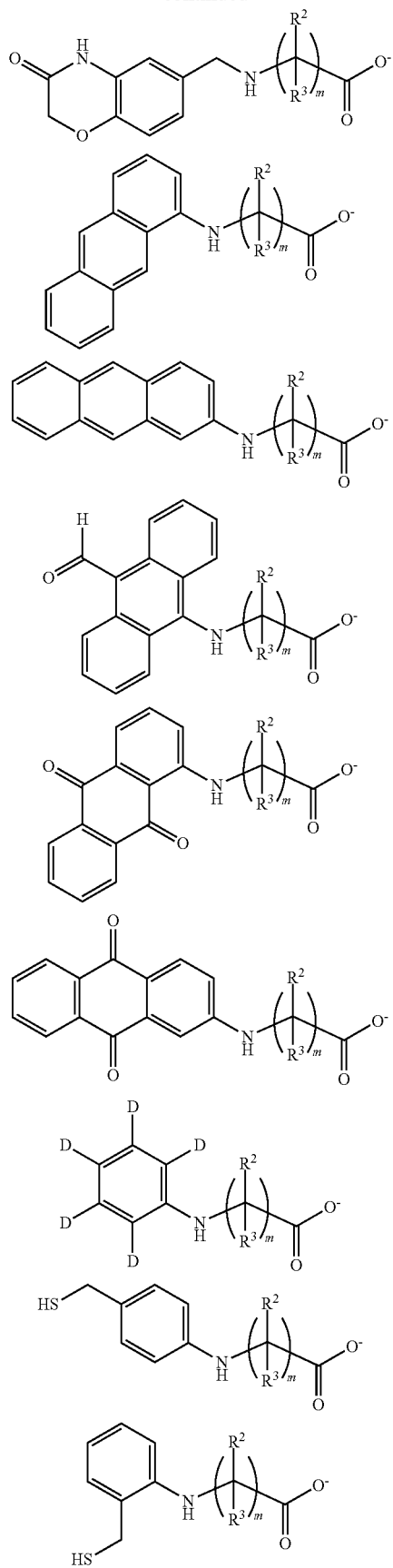
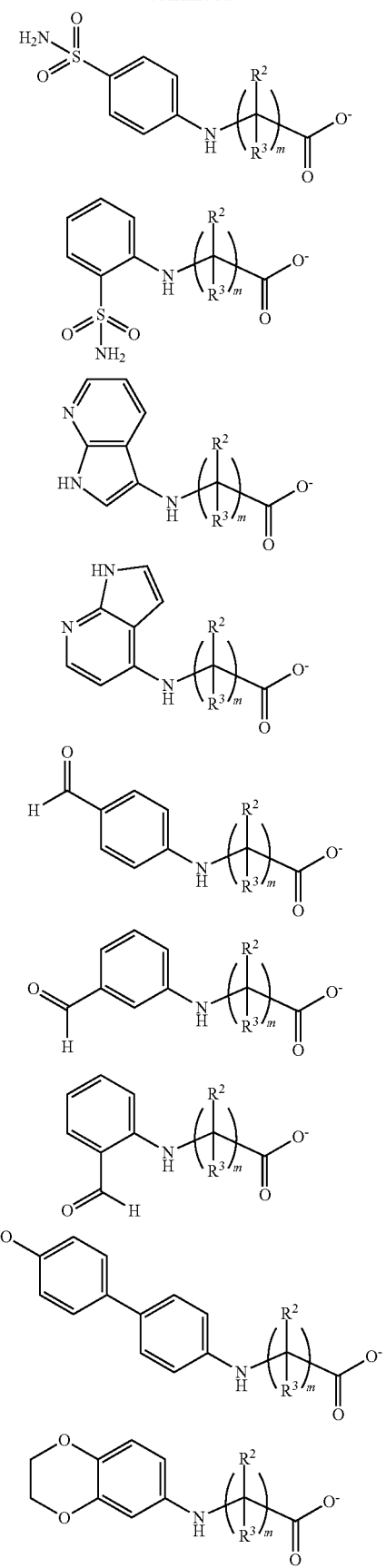

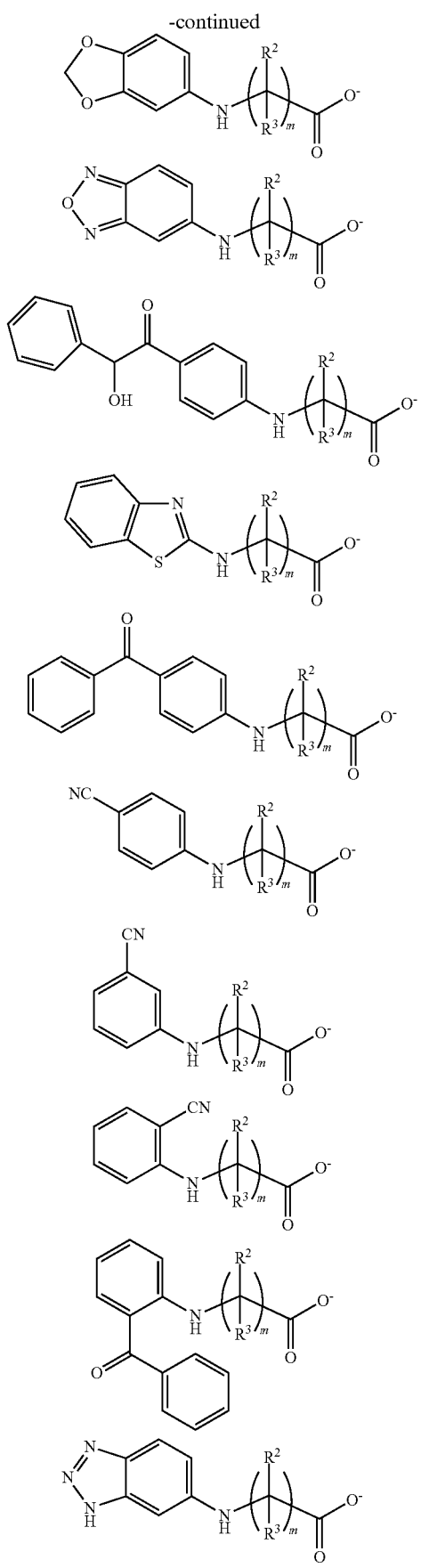
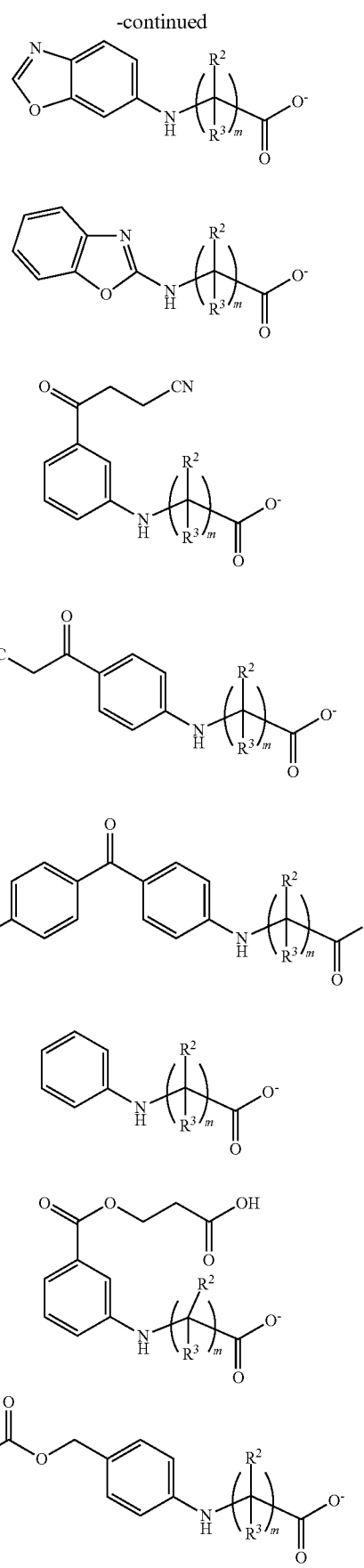

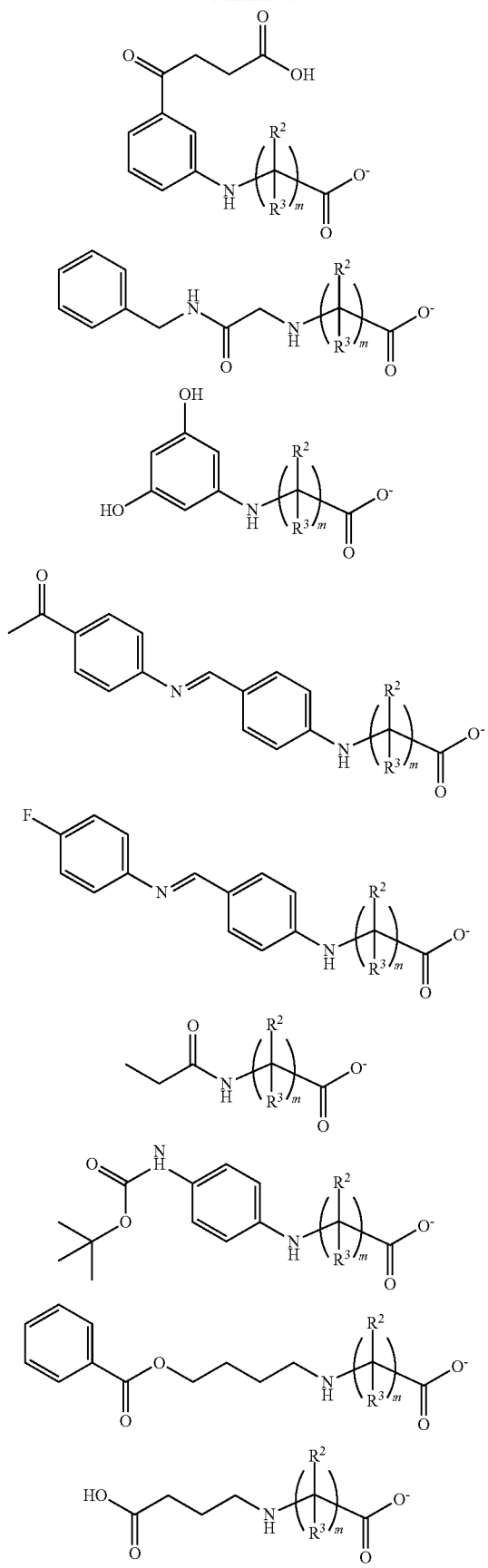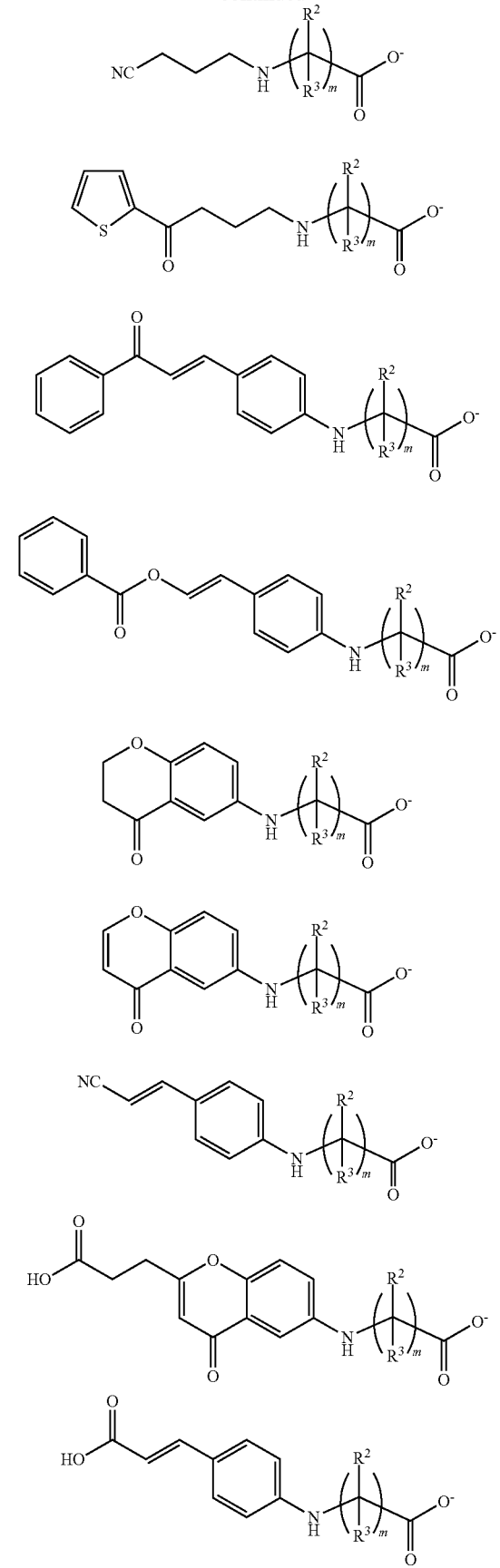

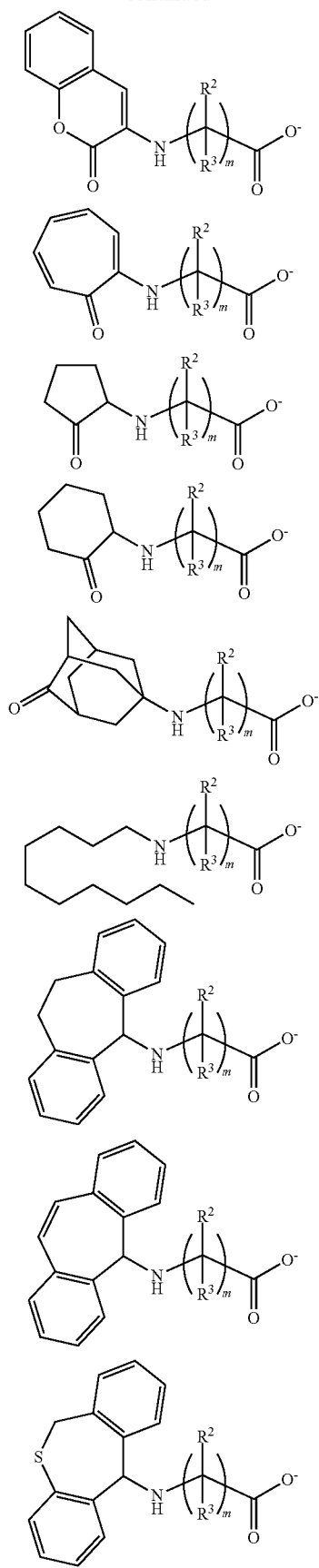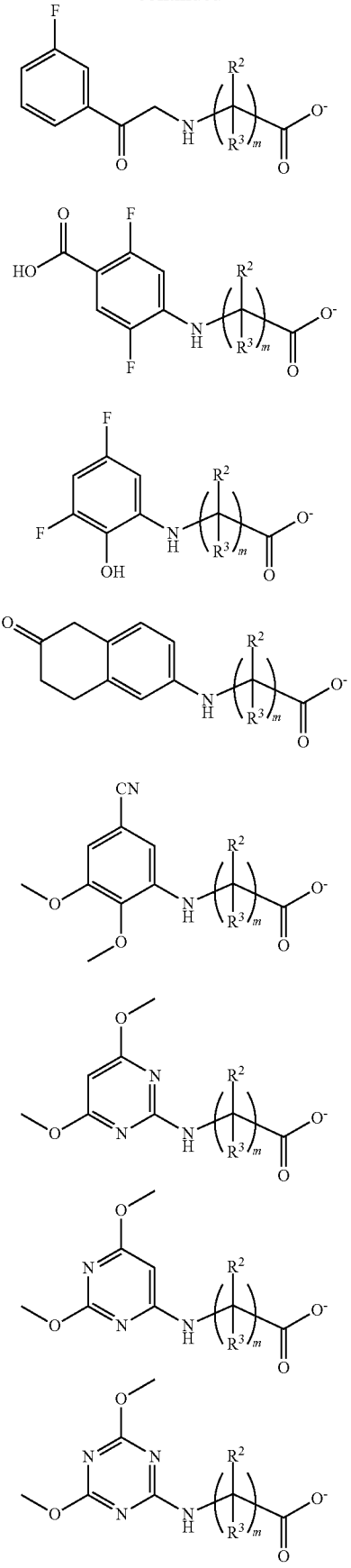

-continued
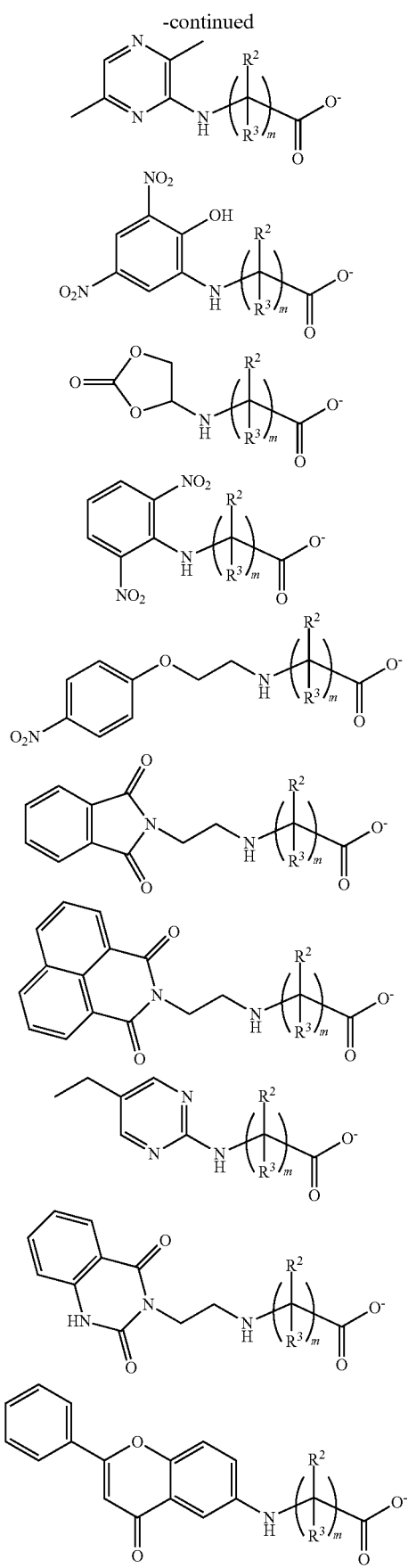
-continued
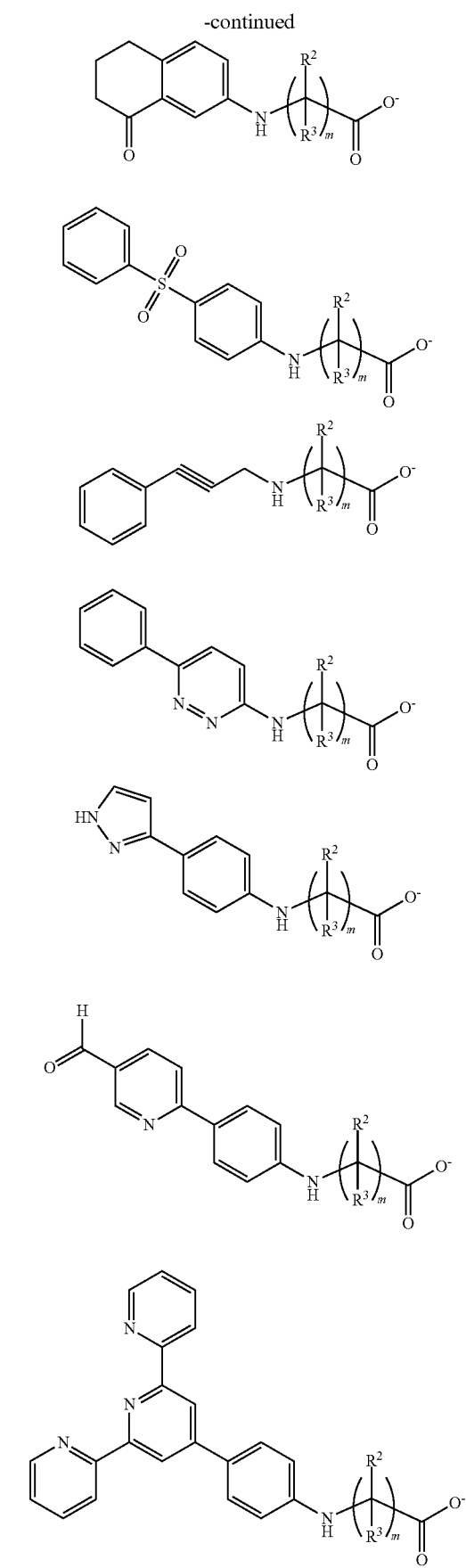

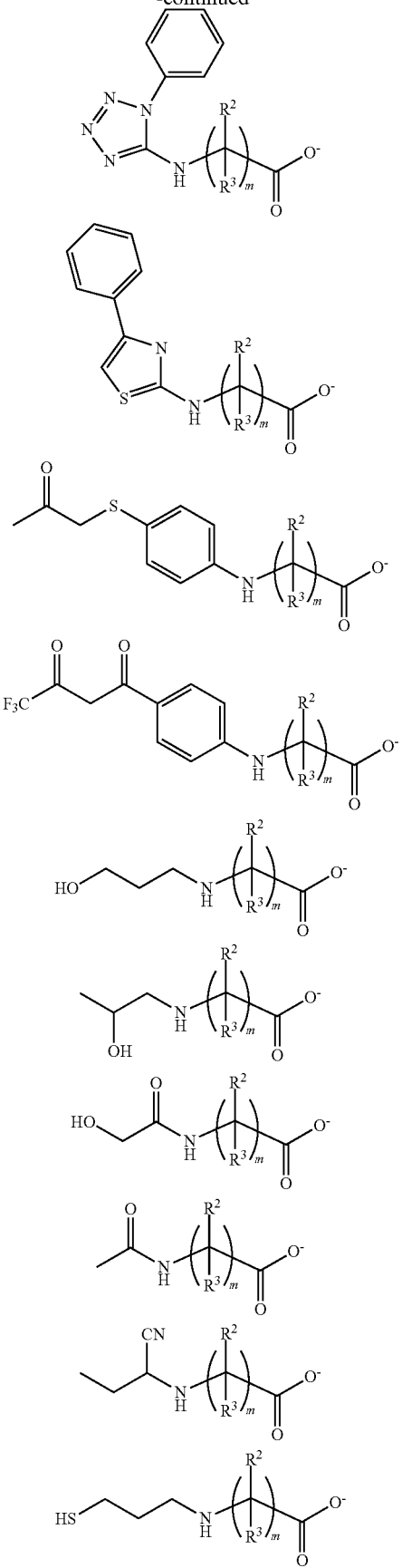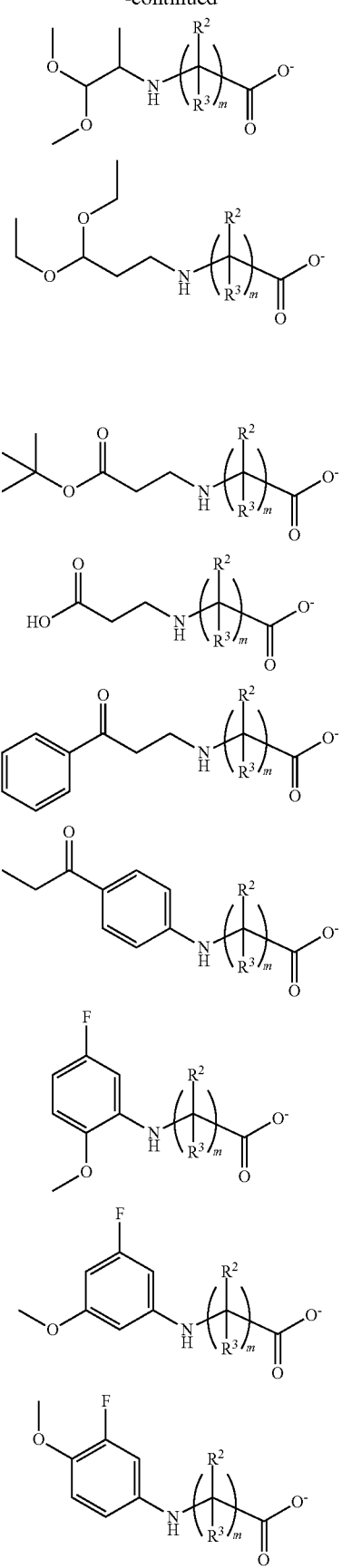

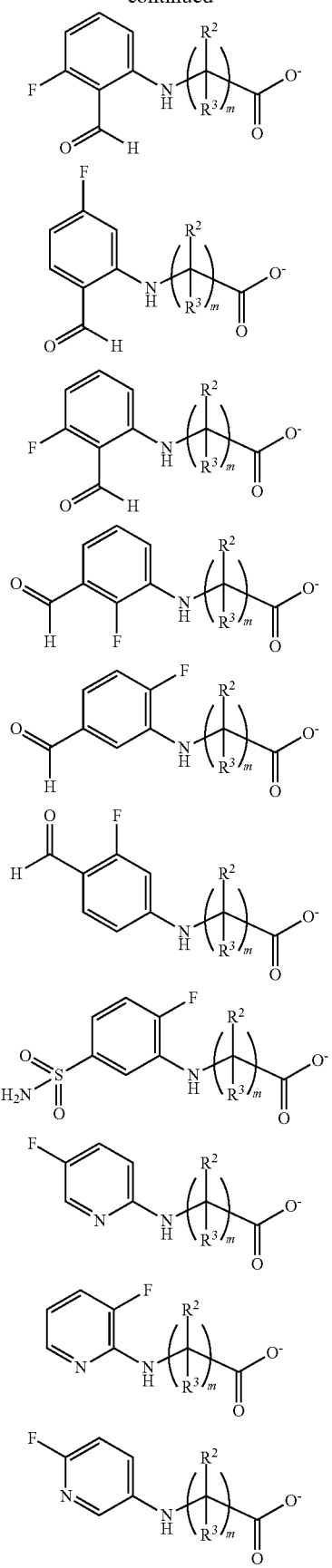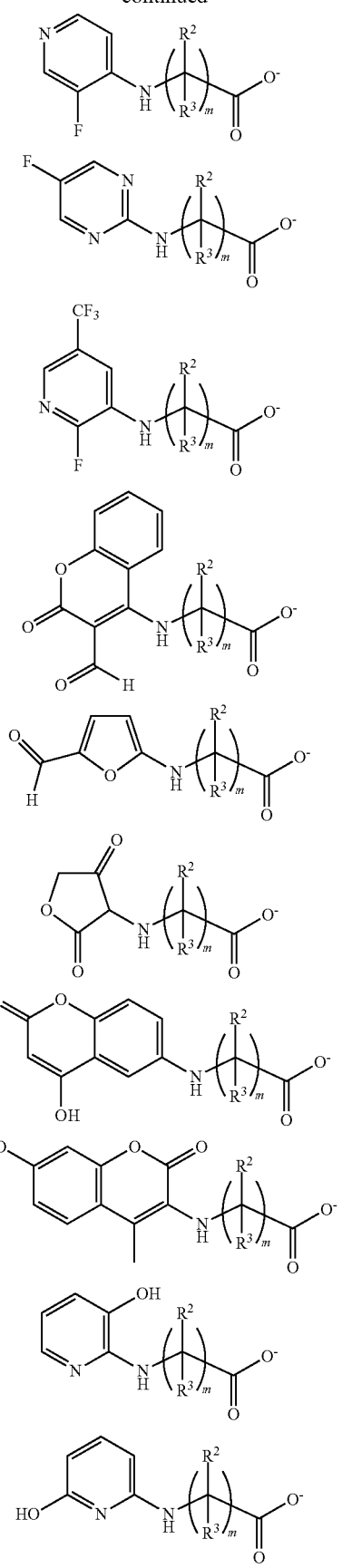

-continued

-continued
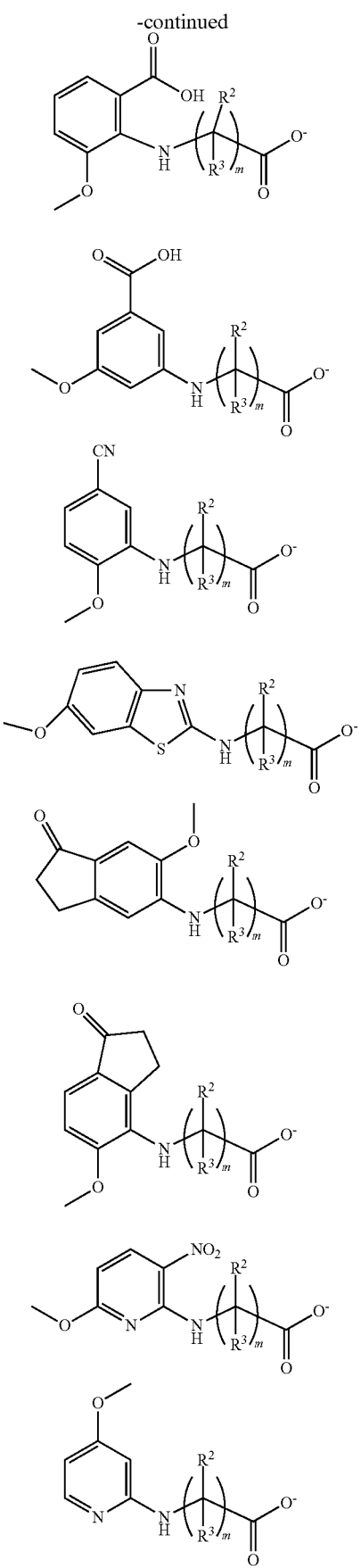
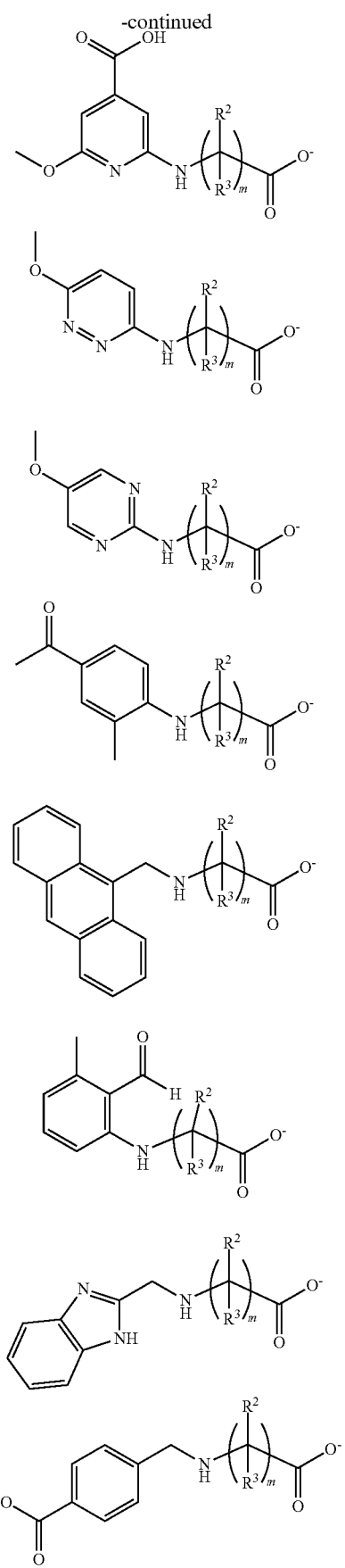

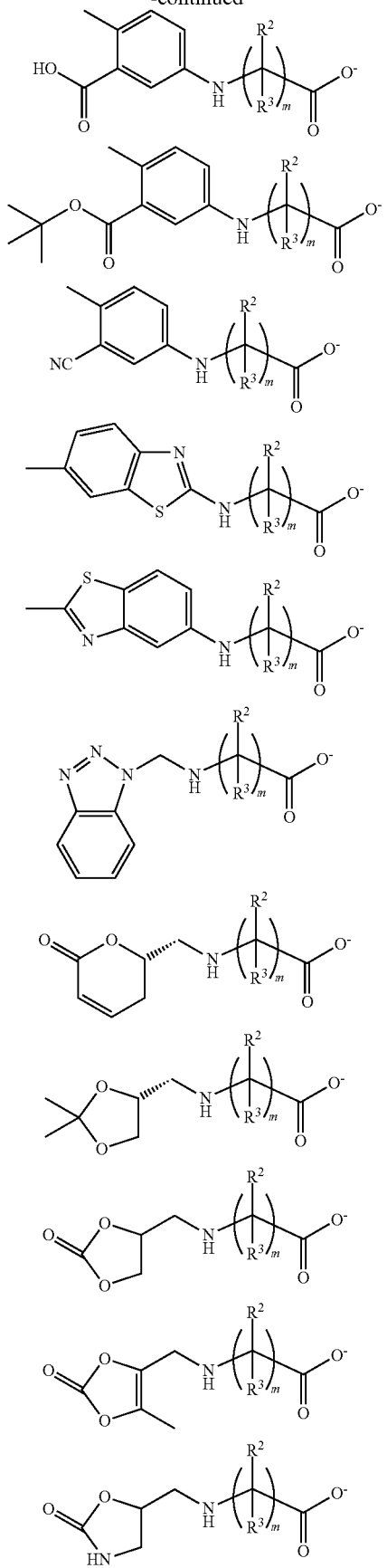
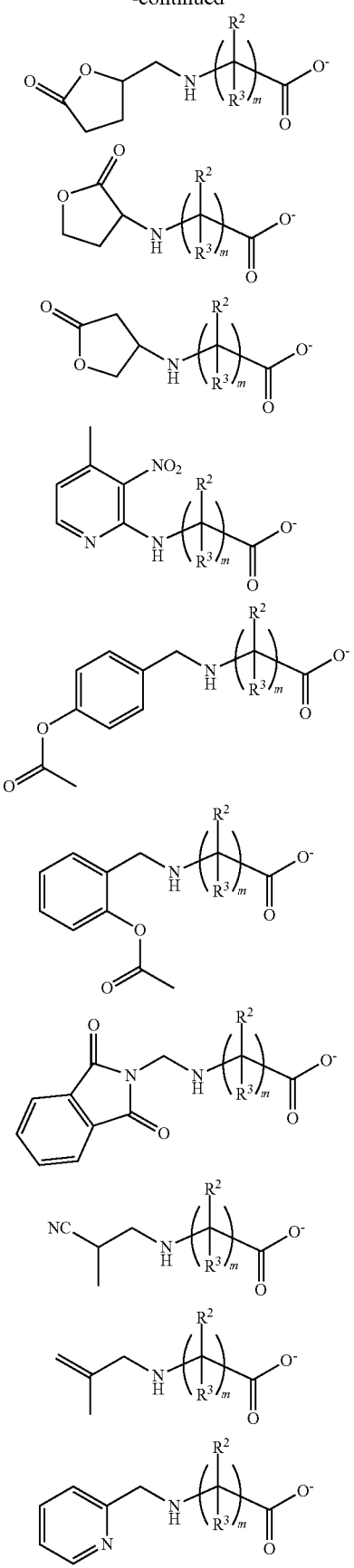

71
-continued
72
-continued
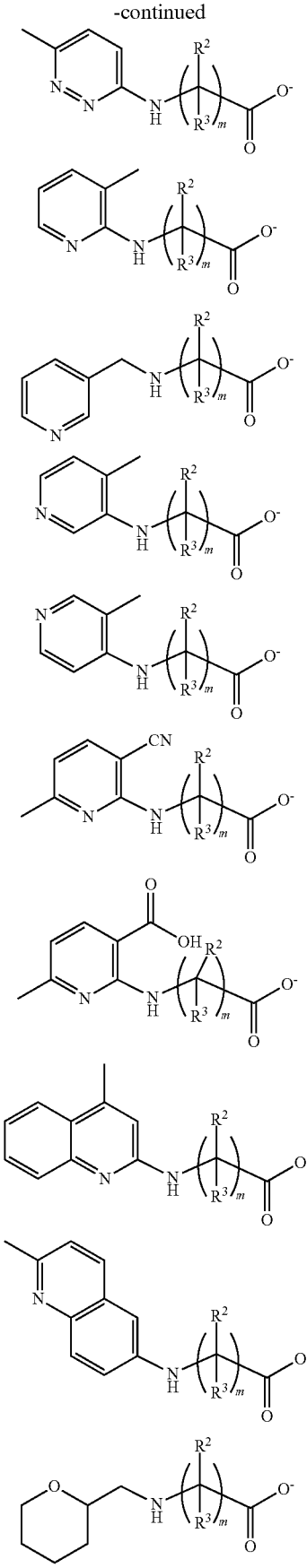
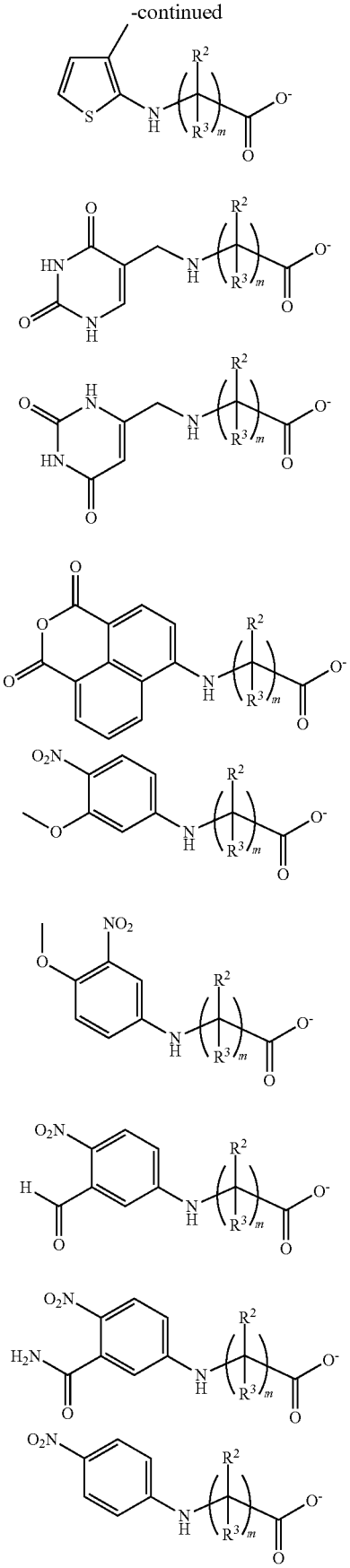

-continued
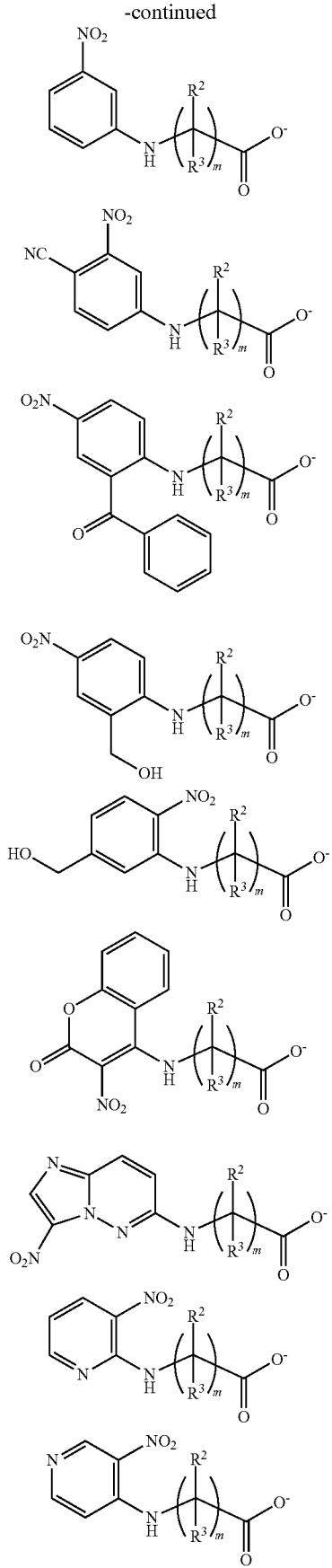
-continued
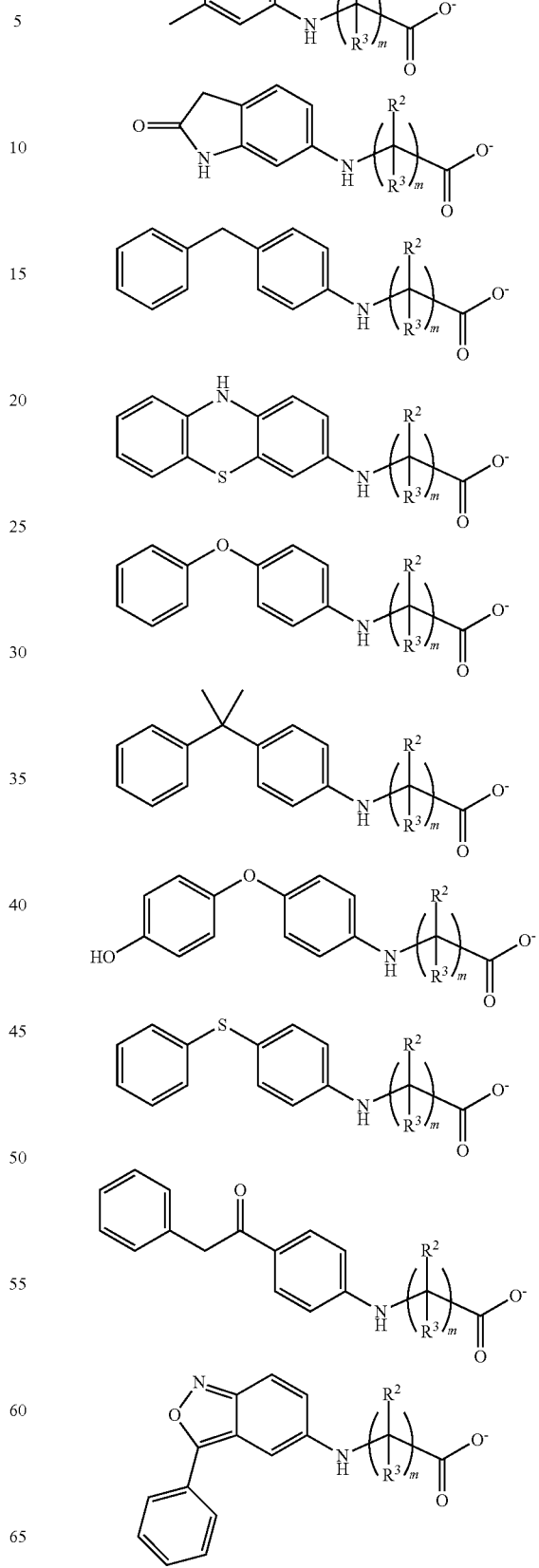

75
-continued
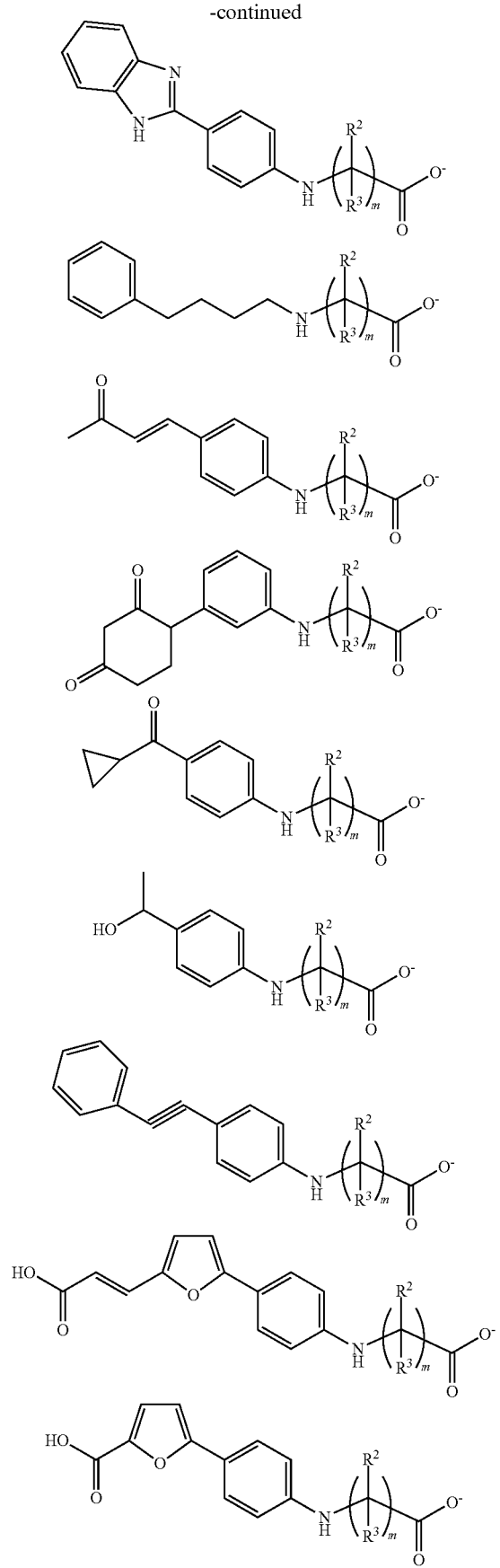
76
-continued
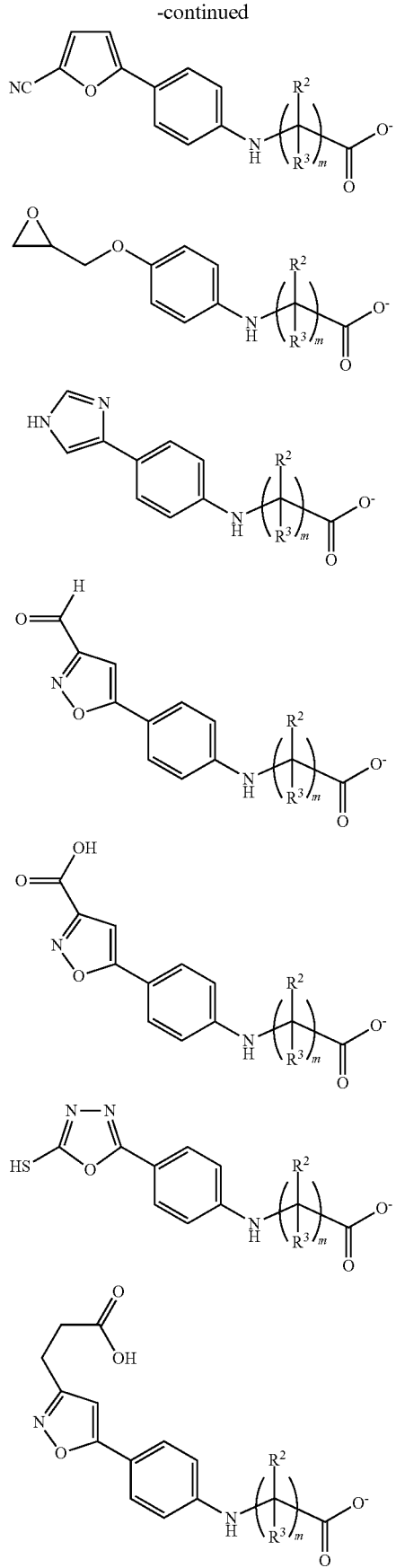

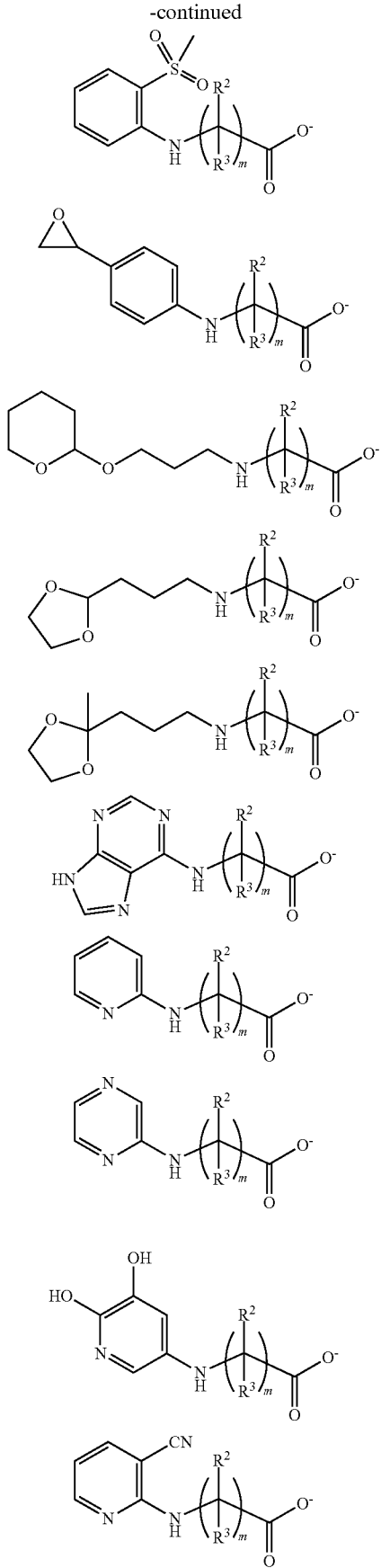

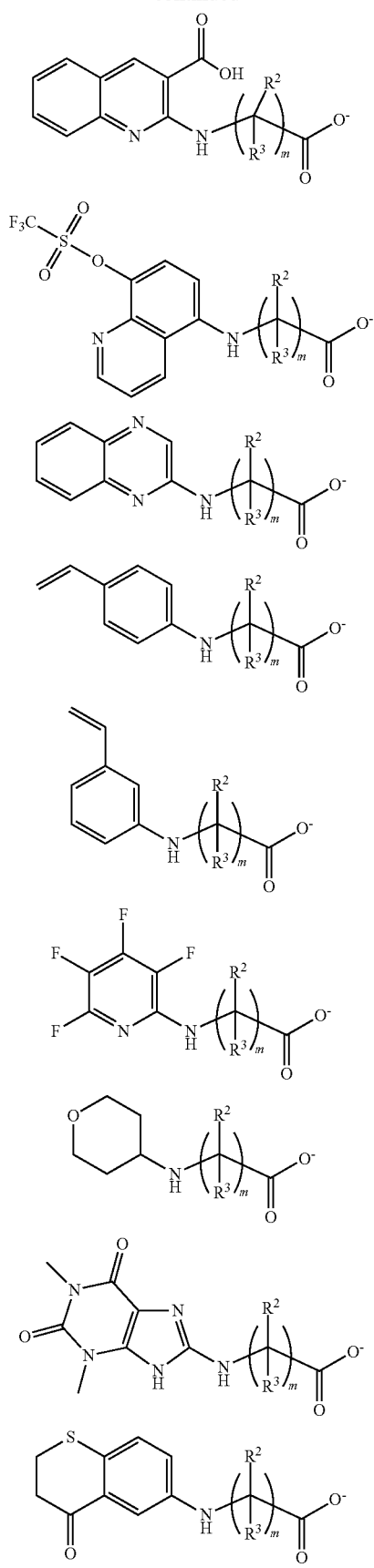
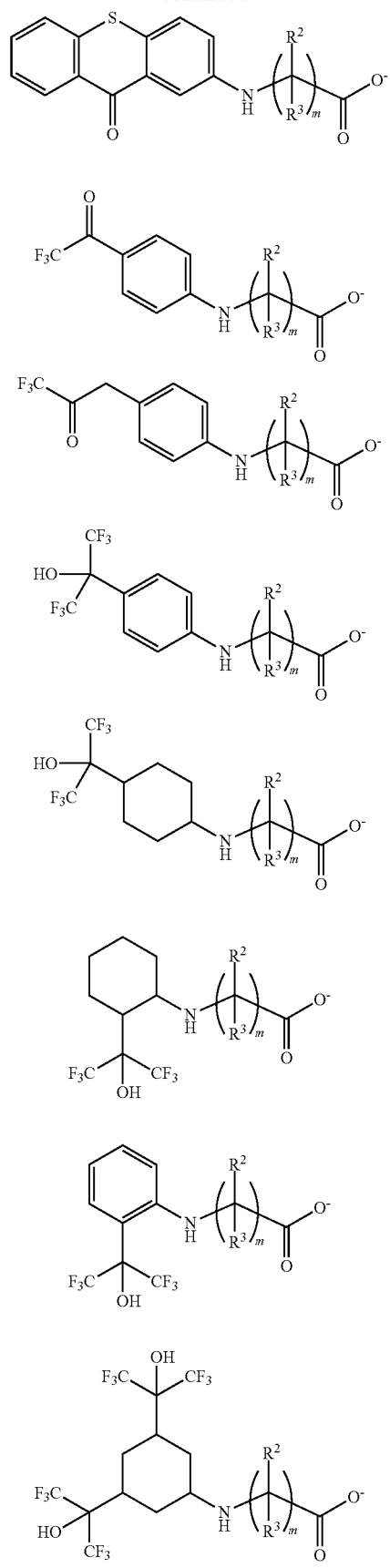

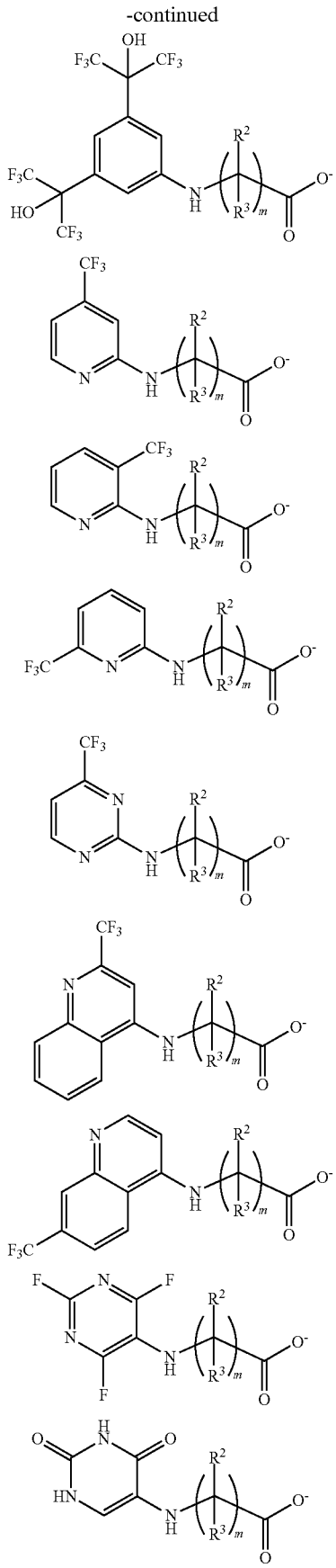
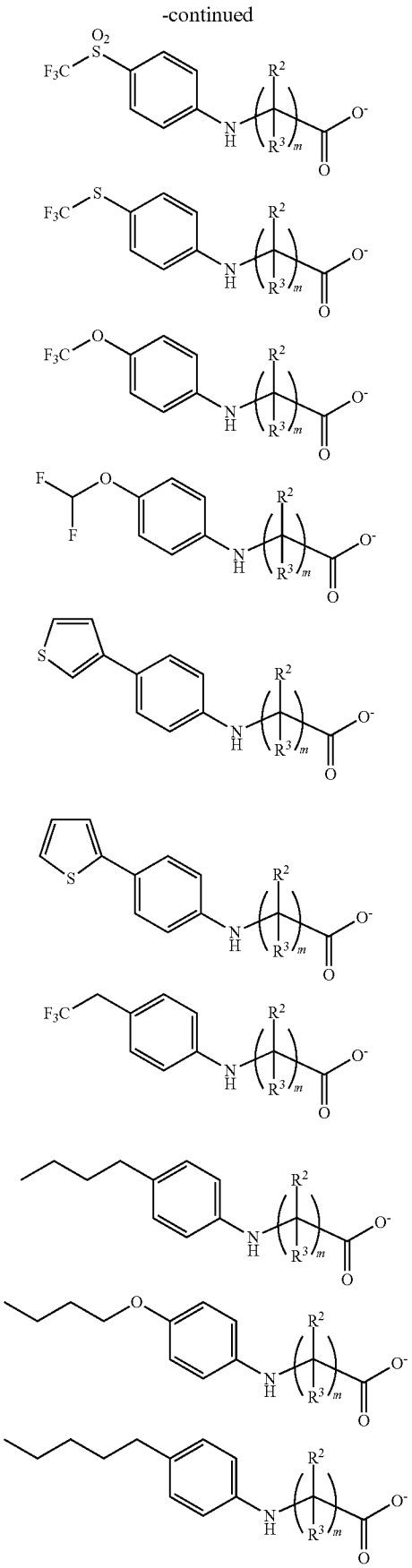

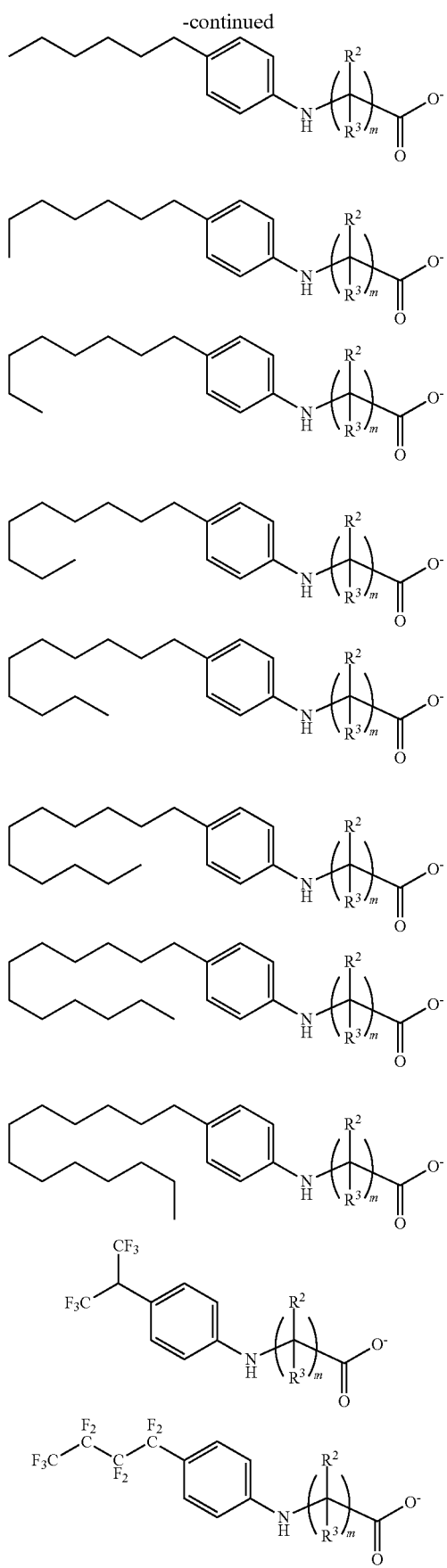
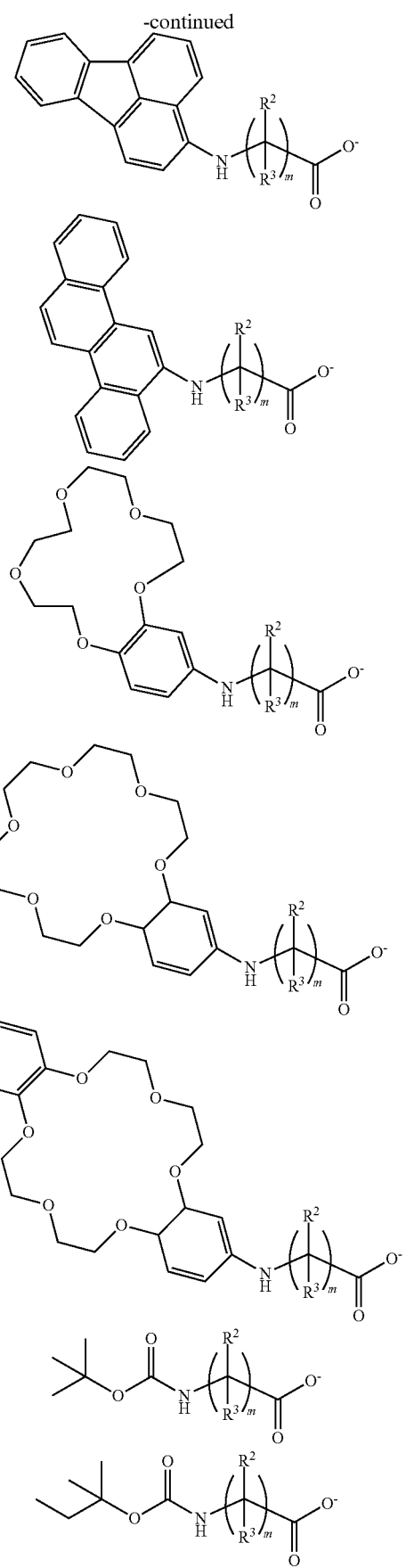

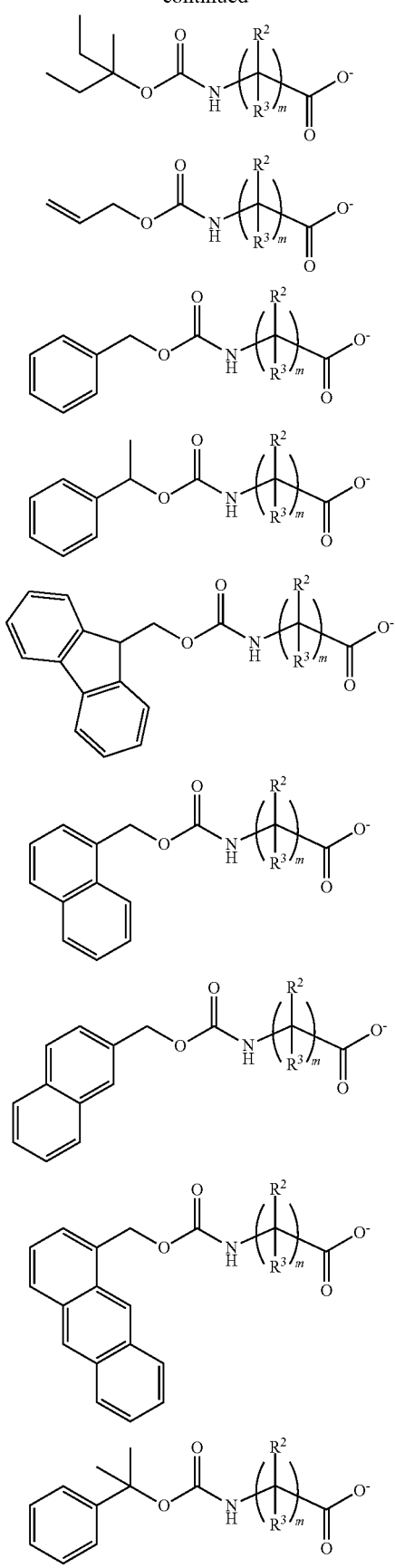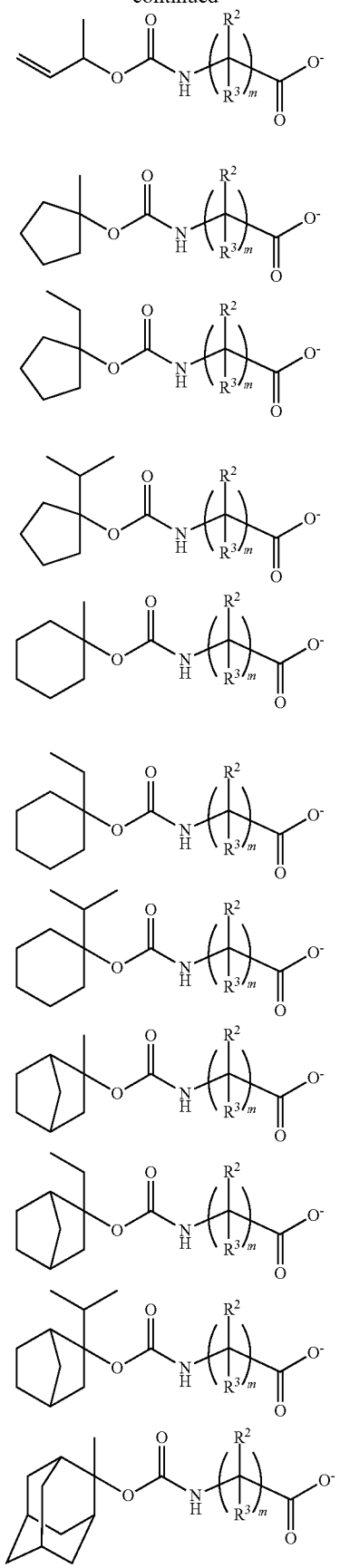

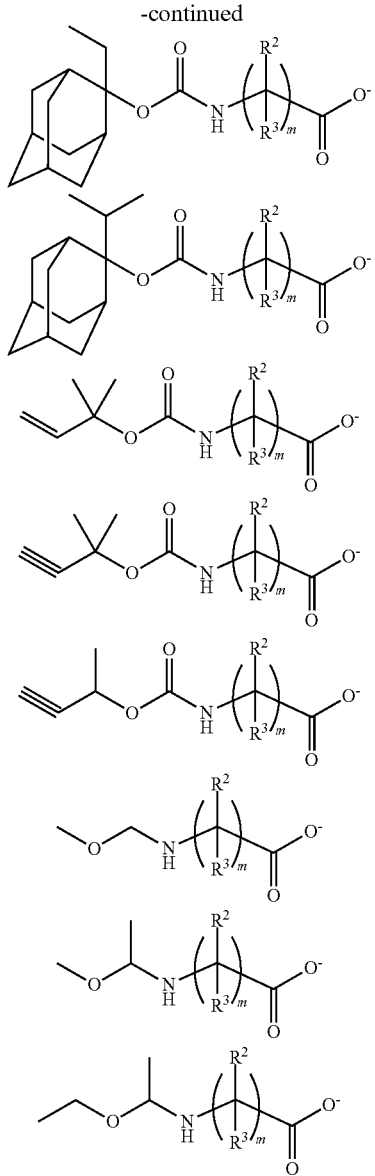

Herein $R^2$, $R^3$ and m are as defined above, and D is deuterium.

For the synthesis of the acid generator having formula (1), reference may be made to JP-A 2007-145797, JP-A 2008-106045, JP-A 2009-007327, and JP-A 2009-258695.

While the chemically amplified resist composition comprises the basic compound of formula (1) and a base polymer to be described below, the basic compound of formula (1) is preferably present in the composition in an amount of 0.001 to 20 parts by weight, more preferably 0.01 to 10 parts by weight per 100 parts by weight of the base polymer.

In the embodiment wherein chemically amplified resist compositions are positive, the base polymer comprises recurring units having an acid labile group. Suitable recurring units having an acid labile group include recurring units of (meth) acrylate, styrenecarboxylic acid and vinylnaphthalenecarboxylic acid having an acid labile group substituted thereon, as represented by unit (a1) in the general formula (2), and recurring units of hydroxystyrene having an acid labile group substituted thereon, as represented by unit (a2) in the general formula (2).

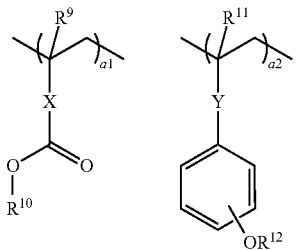

Herein, $R^9$ and $R^{11}$ which may be the same or different is hydrogen or methyl. X is a single bond, a linking group of 1 to 12 carbon atoms having an ester moiety or lactone ring, phenylene group, or naphthylene group. Y is a single bond or ester group. $R^{10}$ and $R^{12}$ each are an acid labile group.

The recurring units (a1) having an acid labile group are preferably derived from (meth)acrylic acid, styrenecarboxylic acid and vinylnaphthalenecarboxylic acid by substituting an acid labile group for the hydrogen atom of carboxyl group. Illustrative, non-limiting, examples of recurring units (a1) are given below.

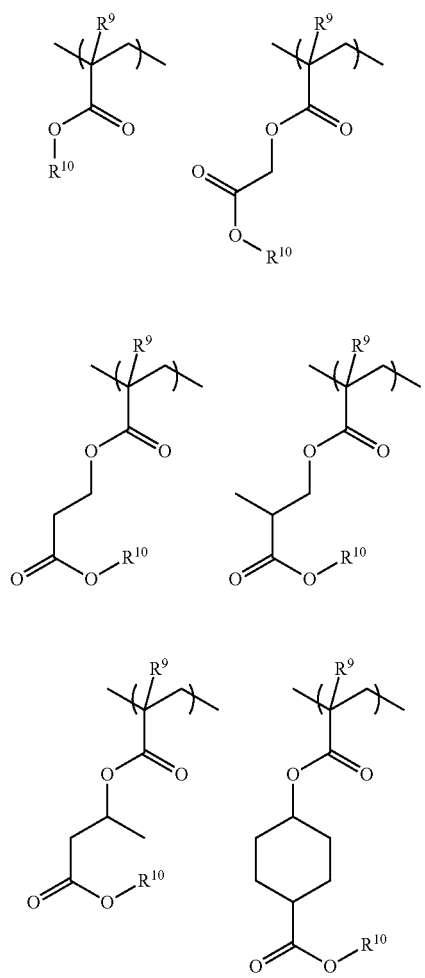

-continued

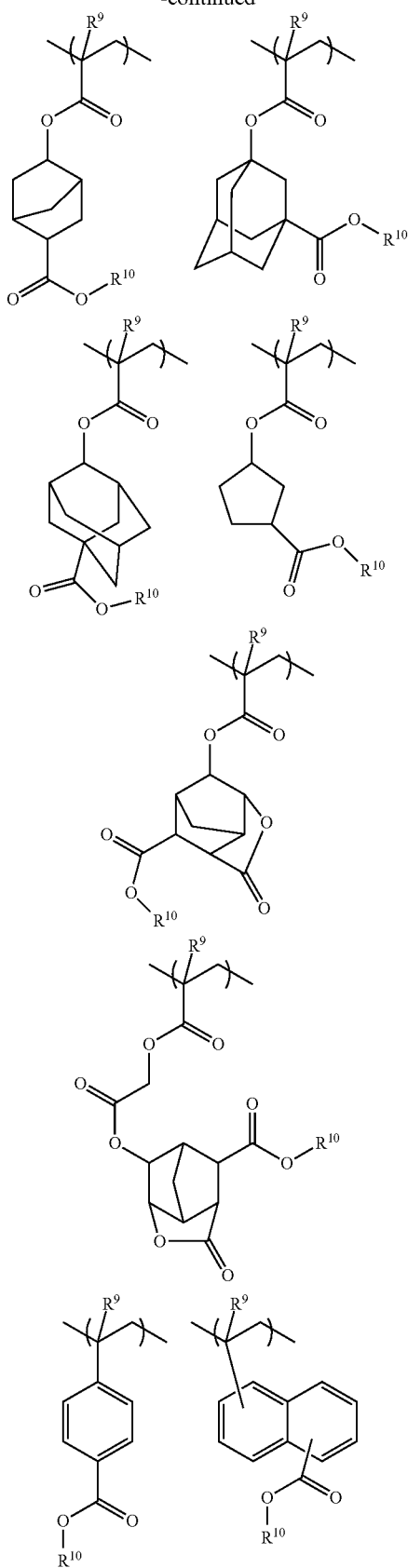

Herein R⁹ and R¹⁰ are as defined above.

The acid labile groups represented by $R^1$ in formula (1), i.e., basic compound and $R^{10}$ and $R^{12}$ in the recurring units (a1) and (a2) may be selected from a variety of such groups and may be the same or different. They are described in JP-A 2013-080033 and JP-A 2013-083821.

Typical acid labile groups are represented by the following formulae (AL-10) to (AL-12).

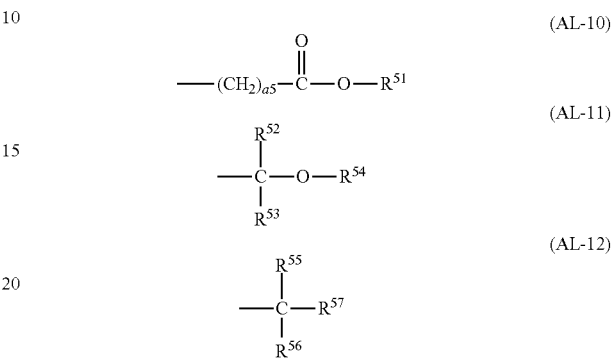

In formulae (AL-10) and (AL-11), $R^{51}$ and $R^{54}$ each are a monovalent hydrocarbon group, typically straight, branched or cyclic alkyl group, of 1 to 40 carbon atoms, more specifically 1 to 20 carbon atoms, which may contain a heteroatom such as oxygen, sulfur, nitrogen or fluorine. $R^{52}$ and $R^{53}$ each are hydrogen or a monovalent hydrocarbon group, typically straight, branched or cyclic $C_1$-$C_{20}$ alkyl group, which may contain a heteroatom such as oxygen, sulfur, nitrogen or fluorine. The subscript "a5" is an integer of 0 to 10, and especially 1 to 5. Alternatively, a pair of $R^{52}$ and $R^{53}$, $R^{52}$ and $R^{54}$, or $R^{53}$ and $R^{54}$ may bond together to form a ring, specifically aliphatic ring, with the carbon atom or the carbon and oxygen atoms to which they are attached, the ring having 3 to 20 carbon atoms, especially 4 to 16 carbon atoms.

In formula (AL-12), $R^{55}$, $R^{56}$ and $R^{57}$ each are a monovalent hydrocarbon group, typically straight, branched or cyclic $C_1$-$C_{20}$ alkyl group, which may contain a heteroatom such as oxygen, sulfur, nitrogen or fluorine. Alternatively, a pair of $R^{55}$ and $R^{56}$, $R^{55}$ and $R^{57}$, or $R^{56}$ and $R^{57}$ may bond together to form a ring, specifically aliphatic ring, with the carbon atom to which they are attached, the ring having 3 to 20 carbon atoms, especially 4 to 16 carbon atoms.

In addition to recurring units (a1) of (meth)acrylate, styrenecarboxylic acid and vinylnaphthalenecarboxylic acid having an acid labile group substituted thereon, and recurring units (a2) of hydroxystyrene having an acid labile group substituted thereon, the base polymer in the chemically amplified positive resist composition may have further copolymerized therein recurring units (b) having a phenolic hydroxyl group as an adhesive group. Examples of suitable monomers from which recurring units (b) having a phenolic hydroxyl group are derived are given below.

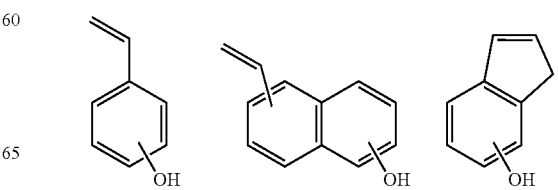

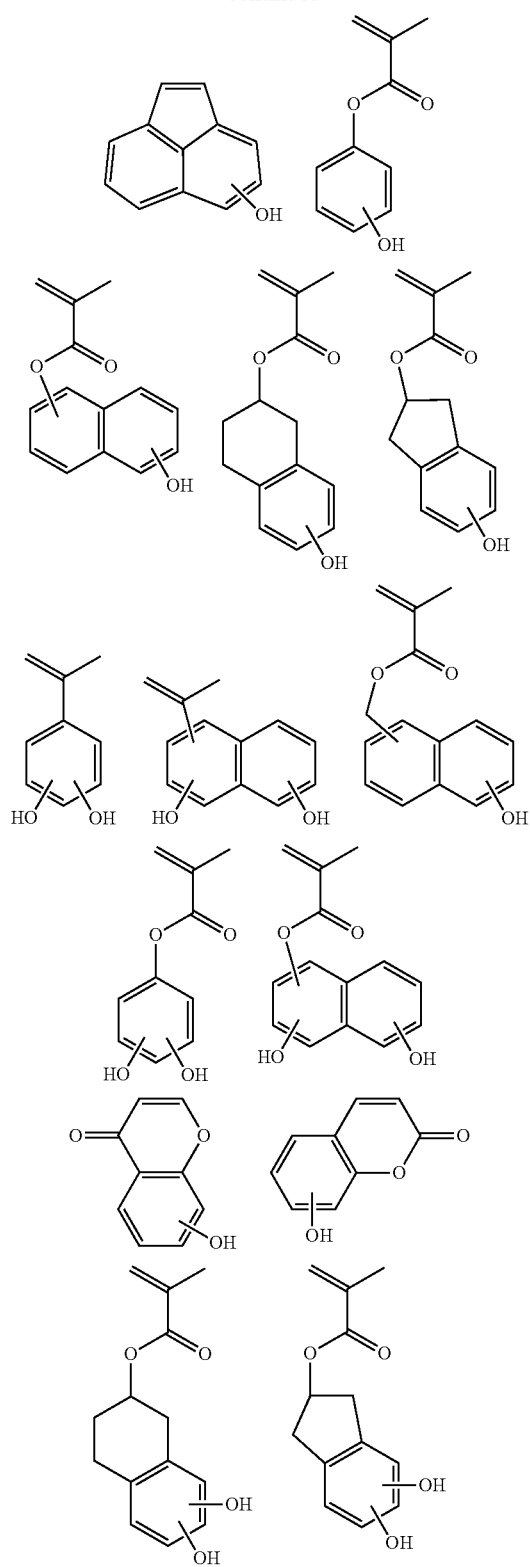
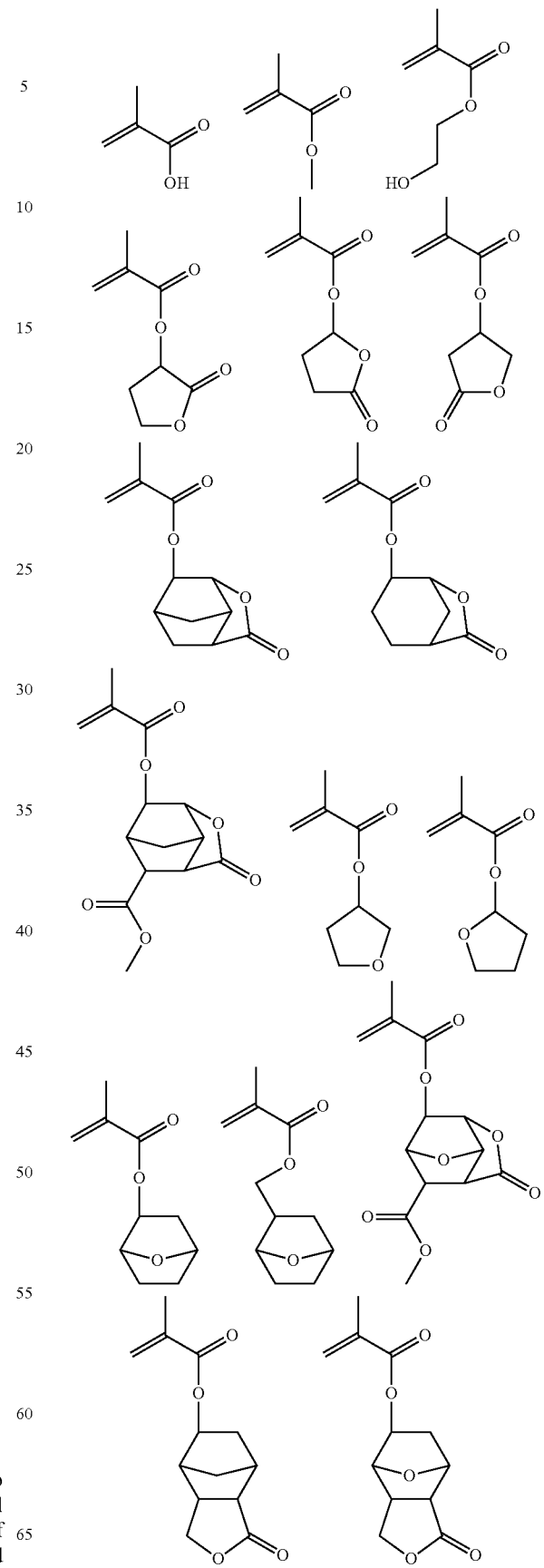
Further, recurring units (c) having another adhesive group selected from hydroxyl, lactone ring, ether, ester, carbonyl and cyano groups may also be copolymerized. Examples of suitable monomers from which recurring units (c) are derived are given below.

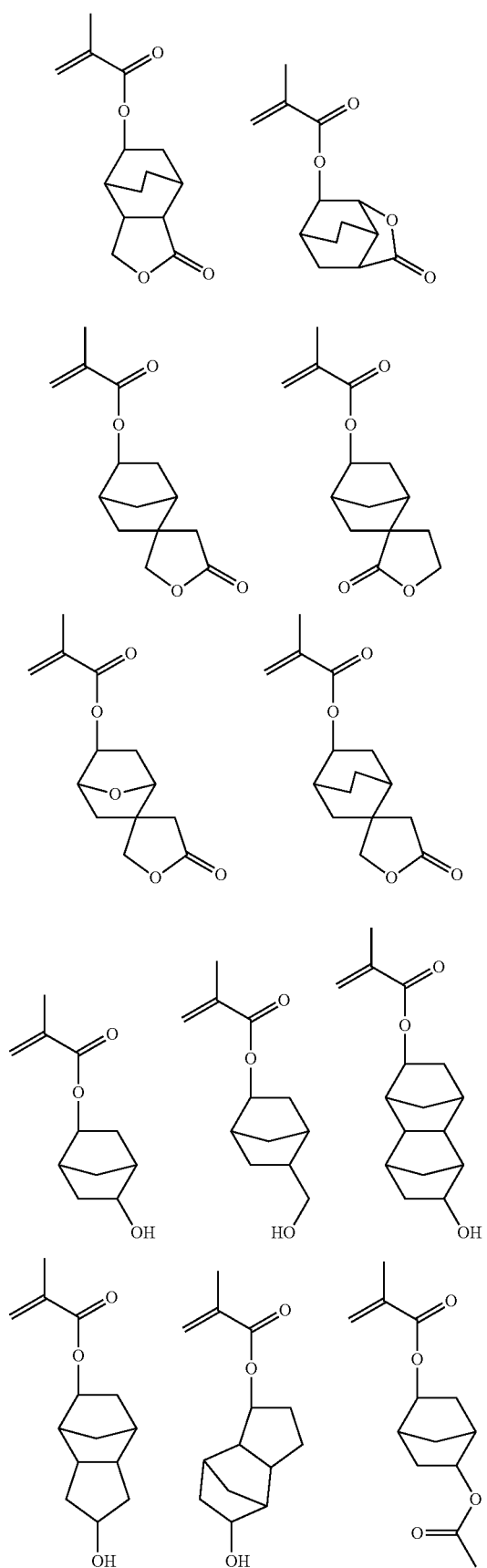
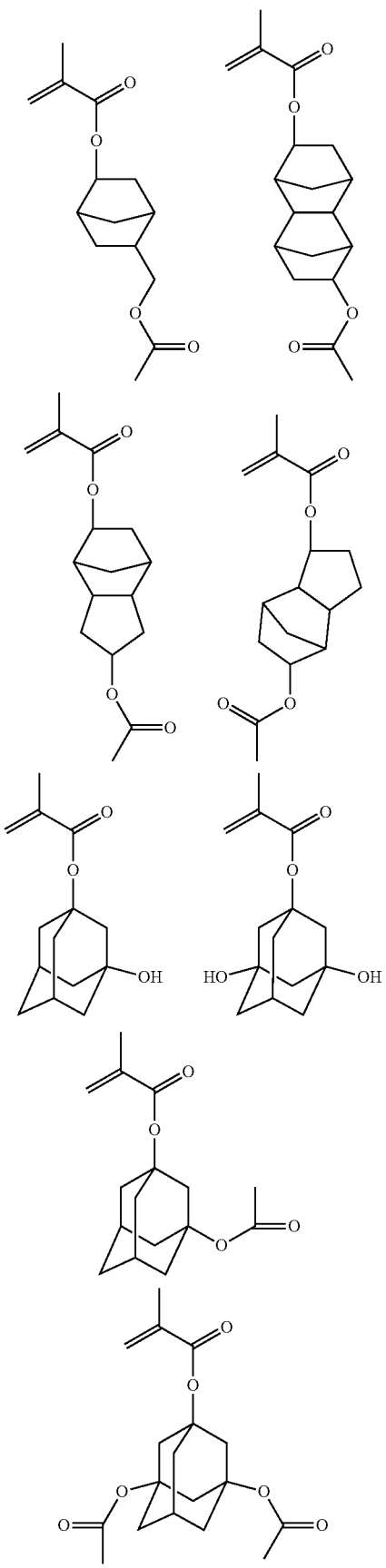

95
-continued
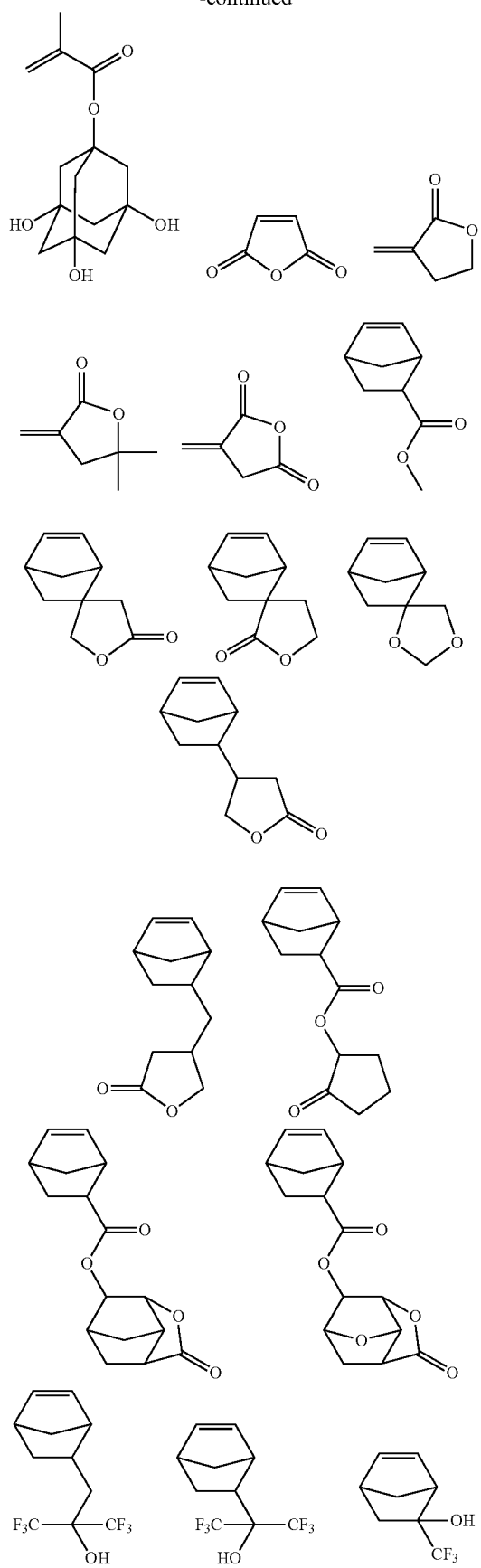
96
-continued
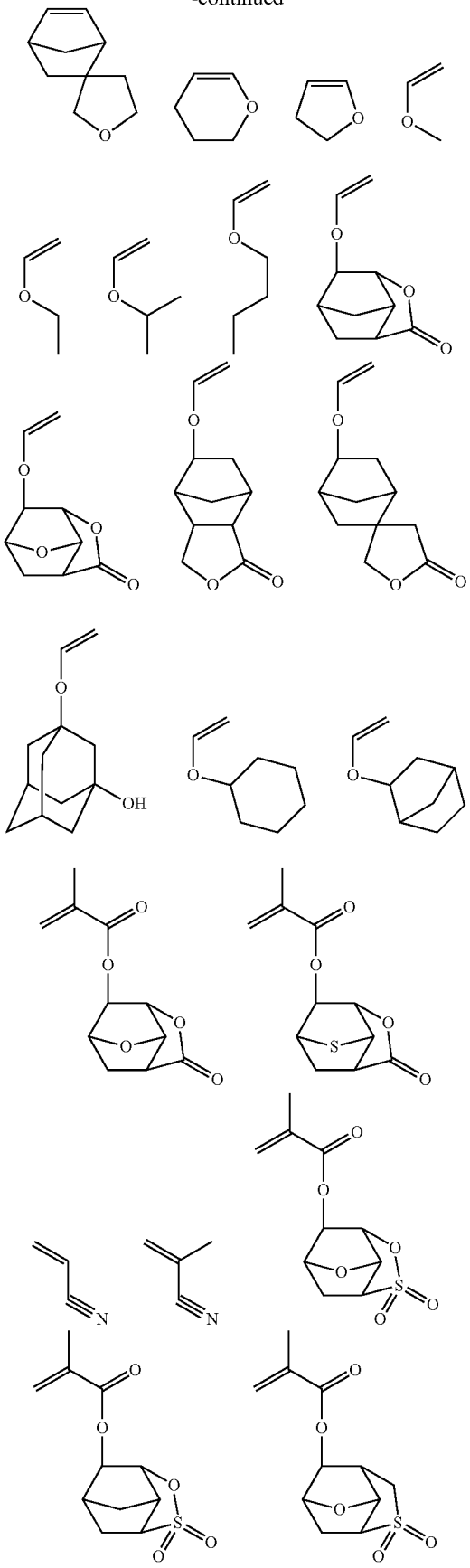

97
-continued
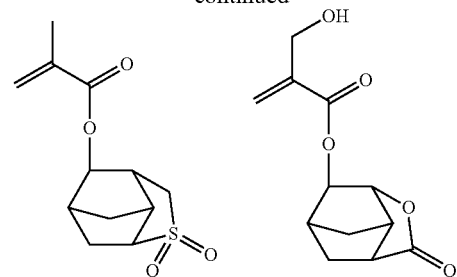
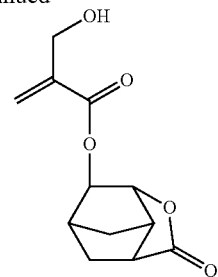
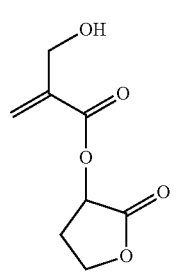
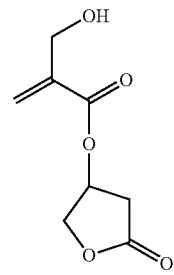
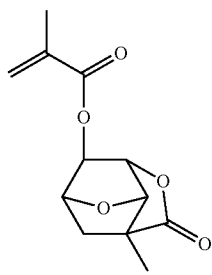
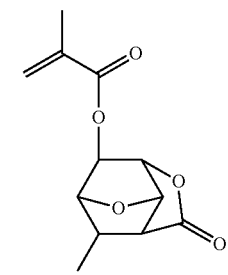
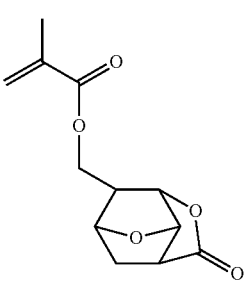
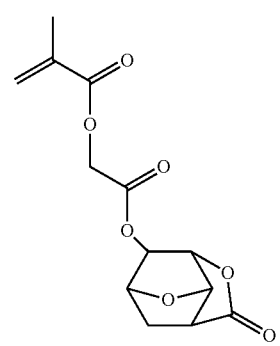
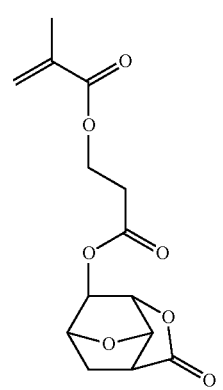
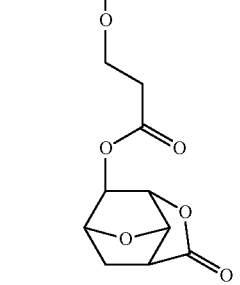
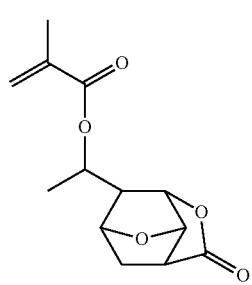
98
-continued
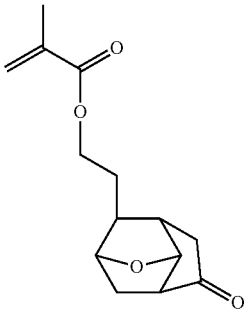
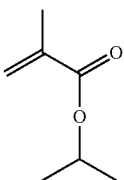
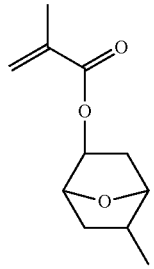
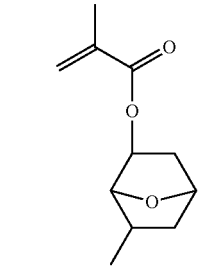
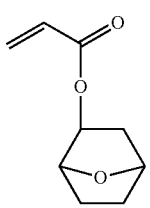
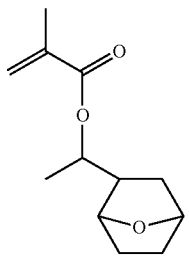
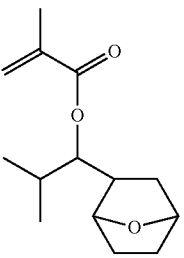
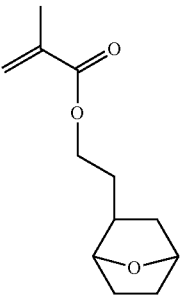
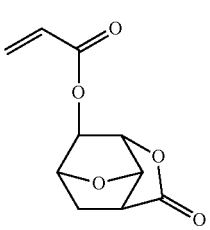

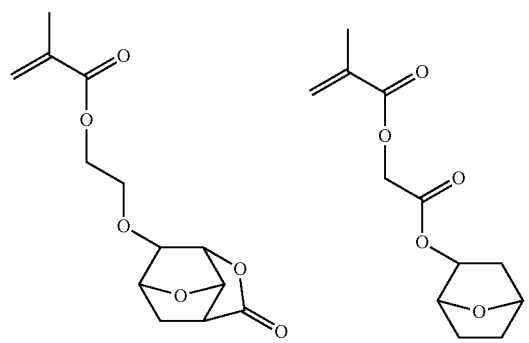
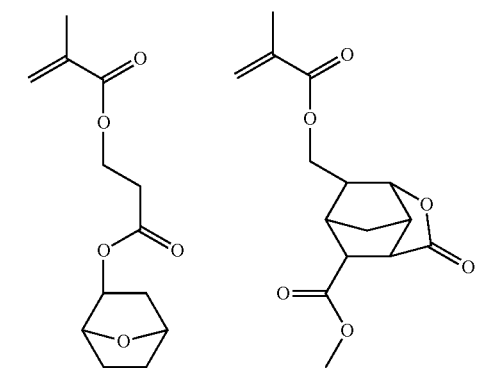
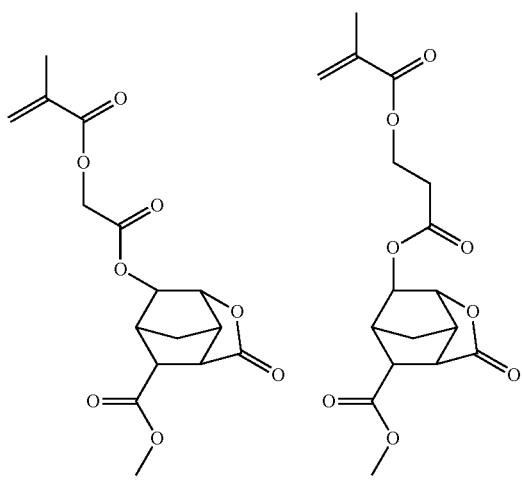
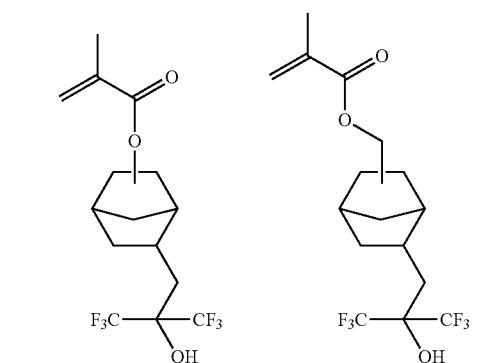
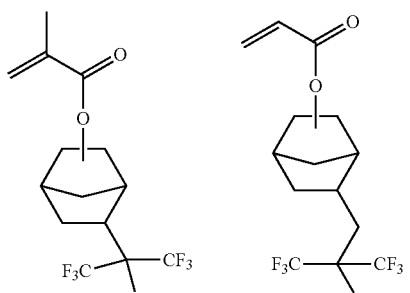
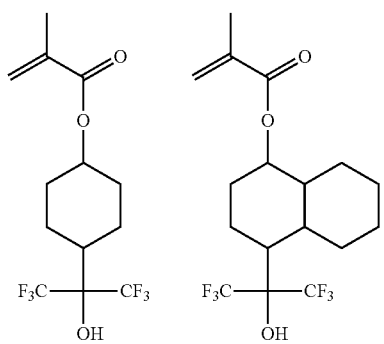
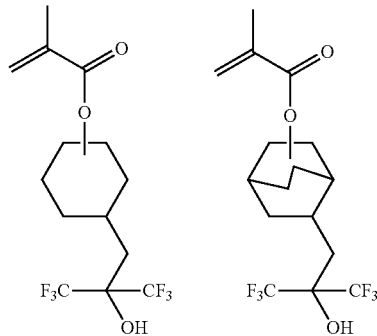
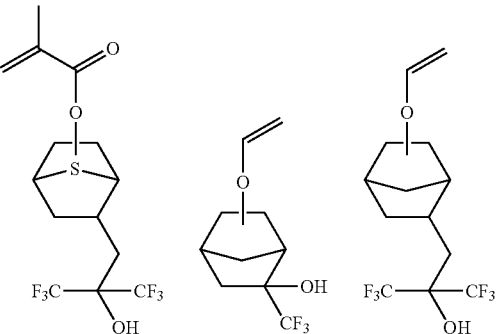

101
-continued
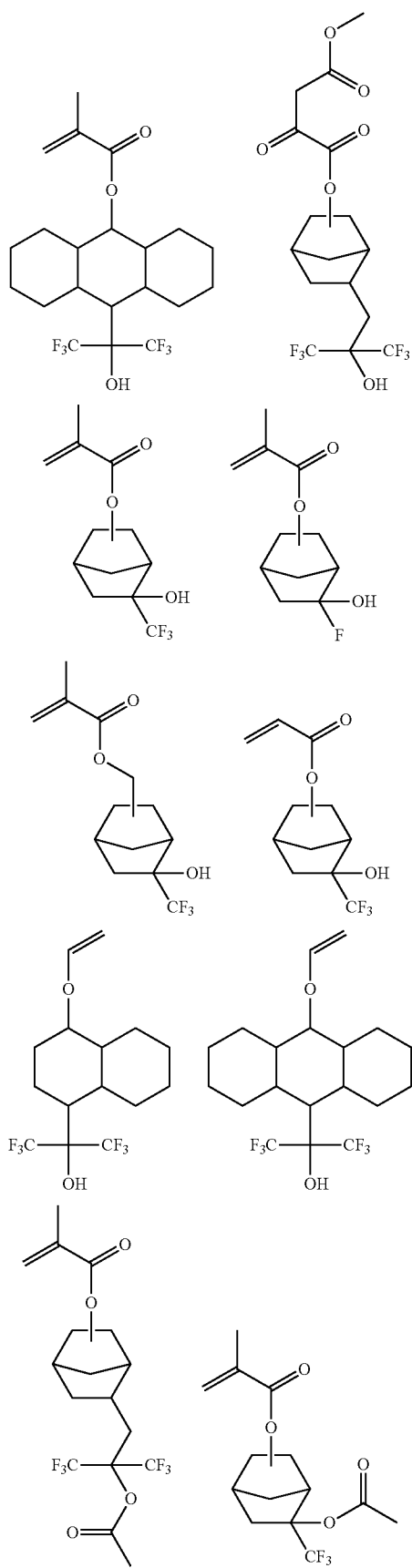
102
-continued
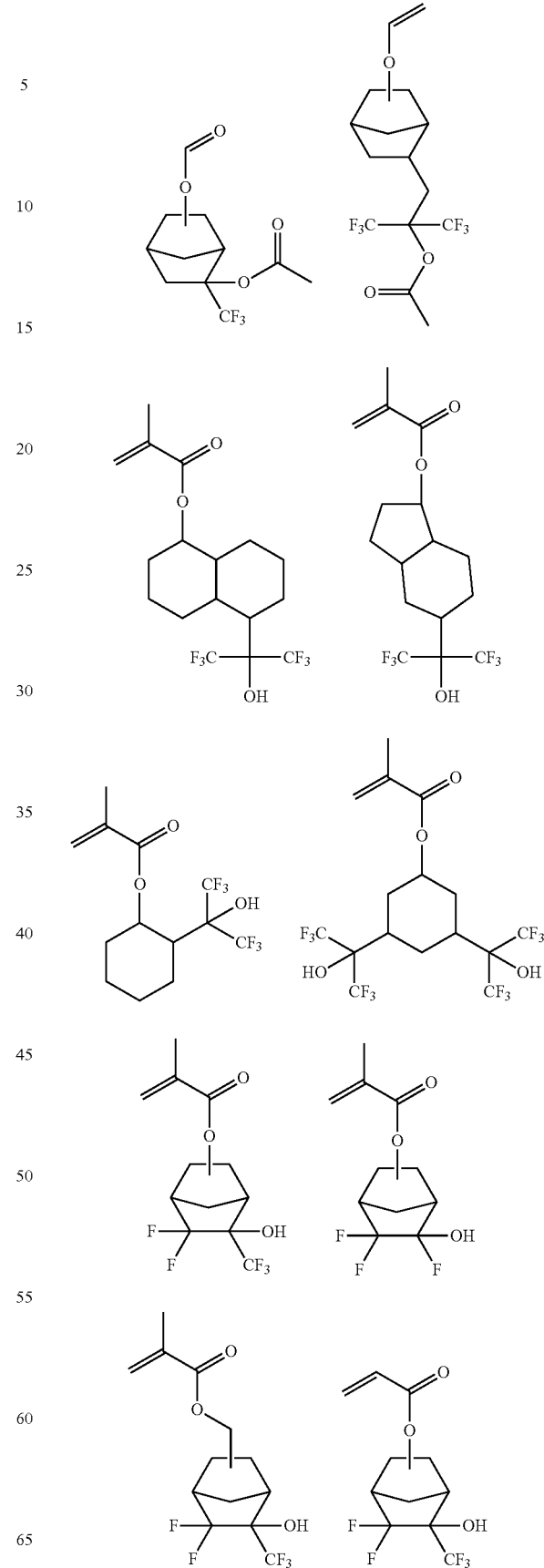

103
-continued
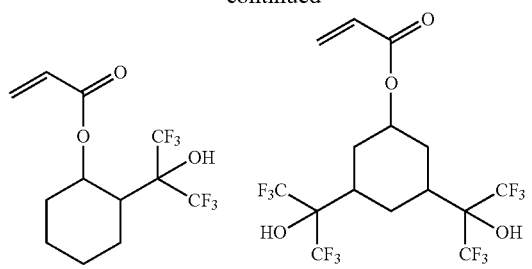
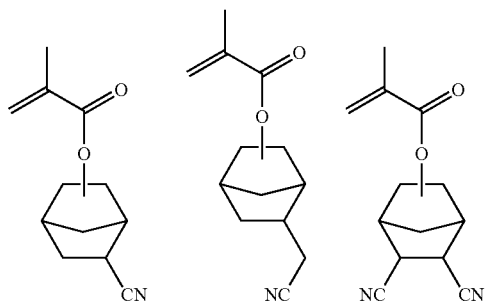
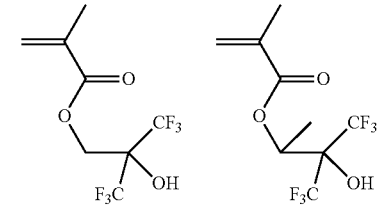
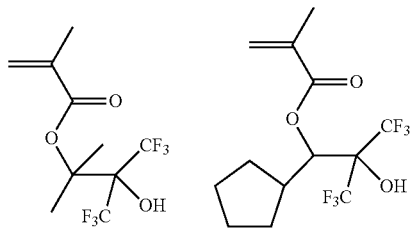
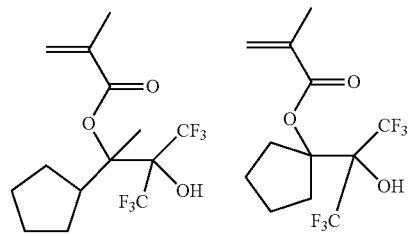
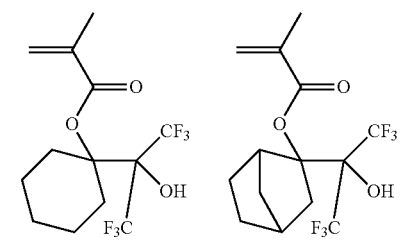
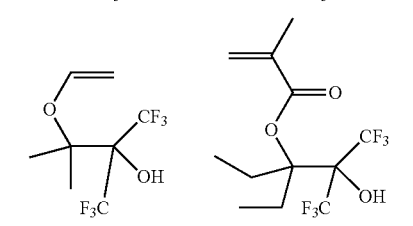
104
-continued
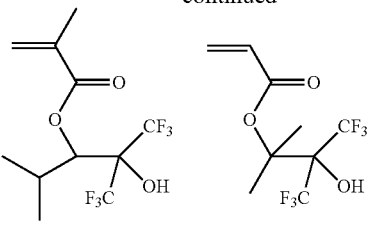
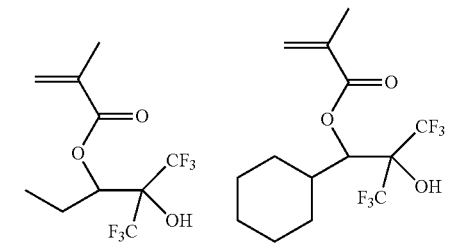
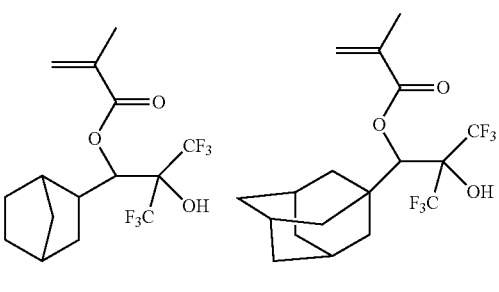
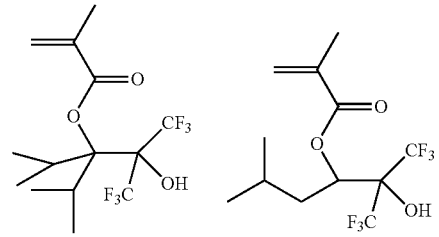
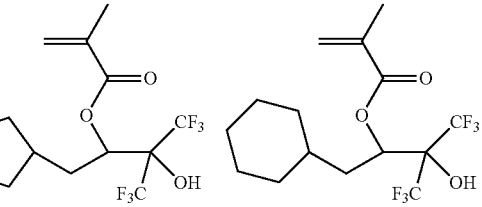
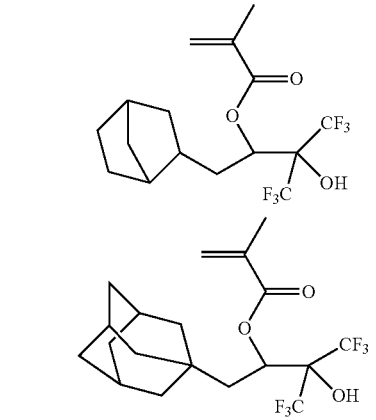

105
-continued
106
-continued
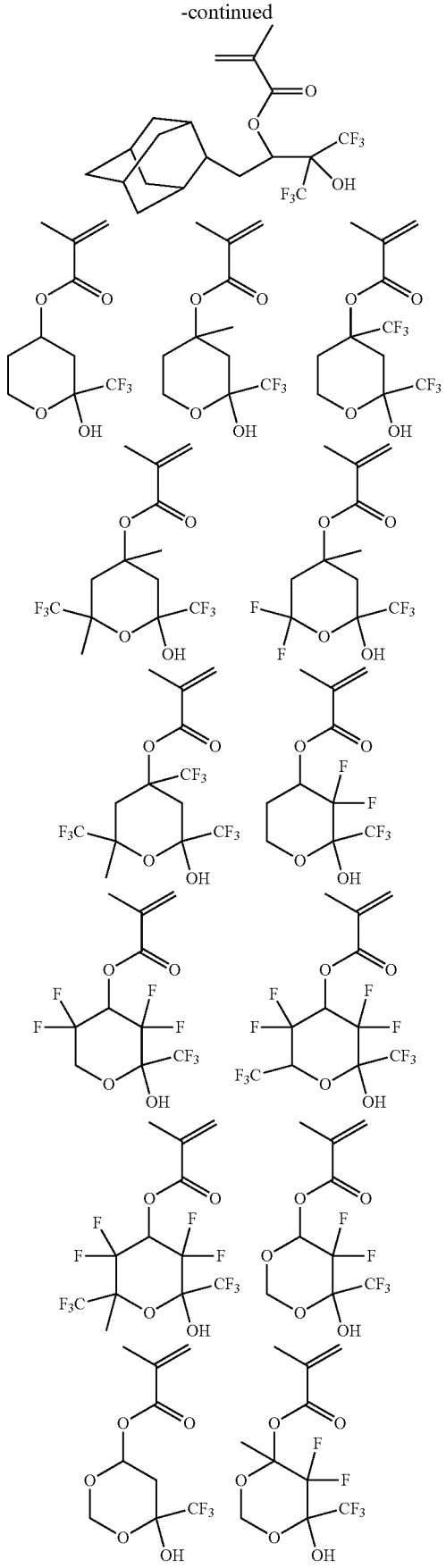
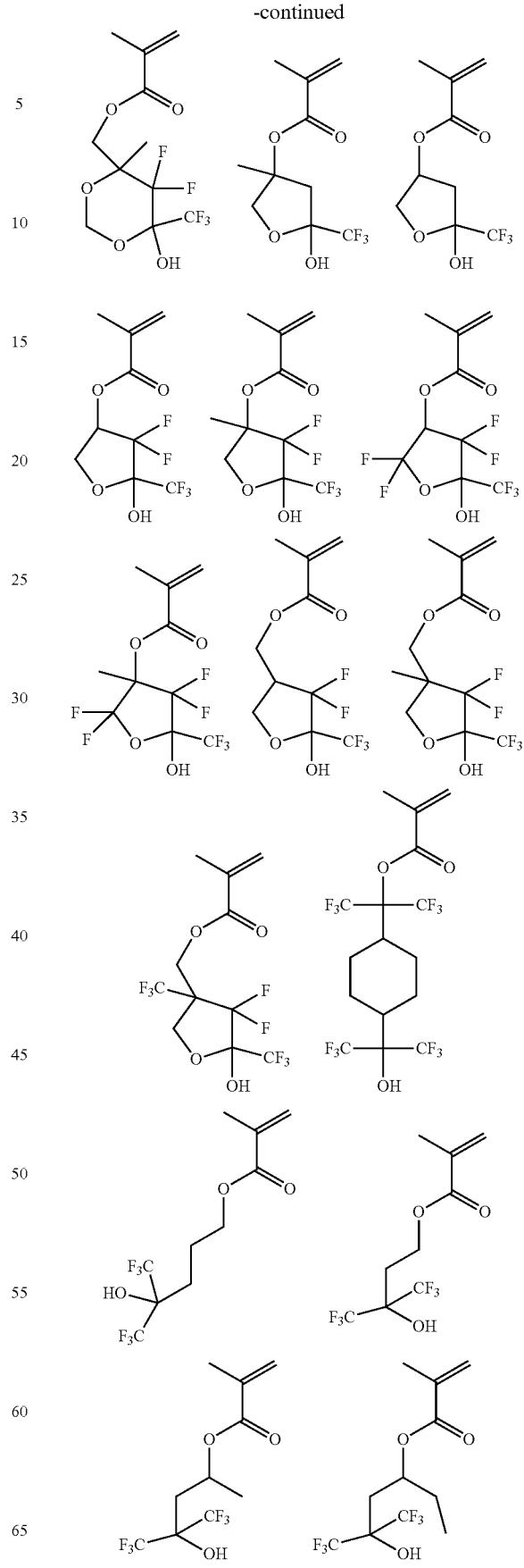

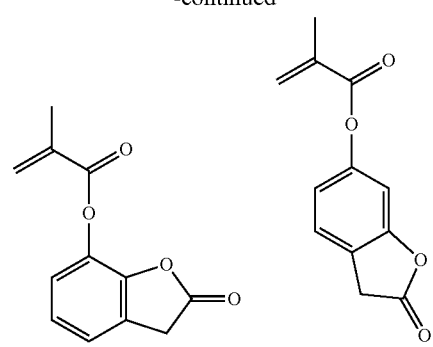
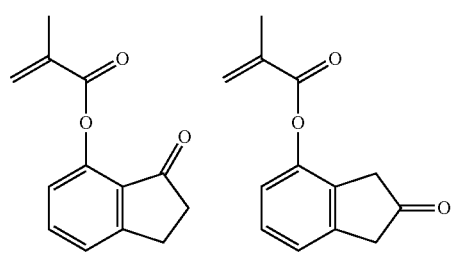
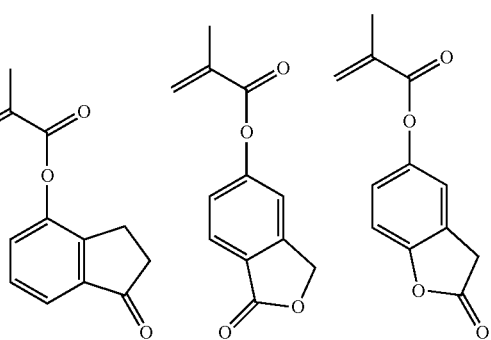
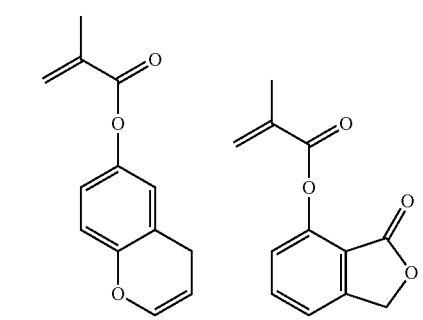
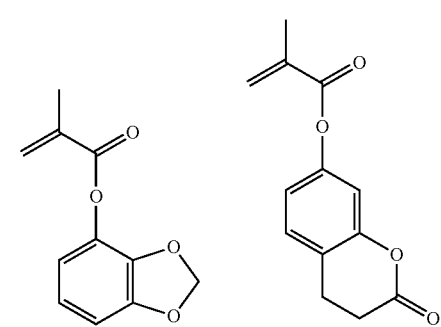
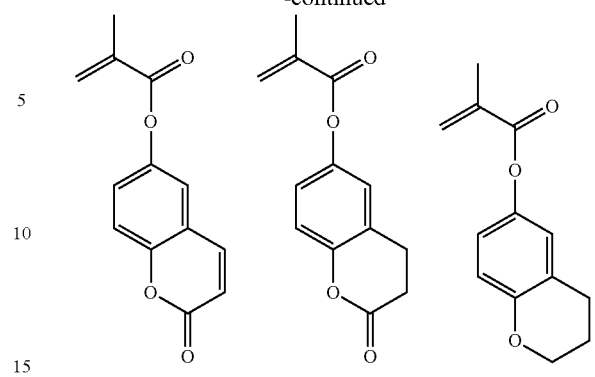
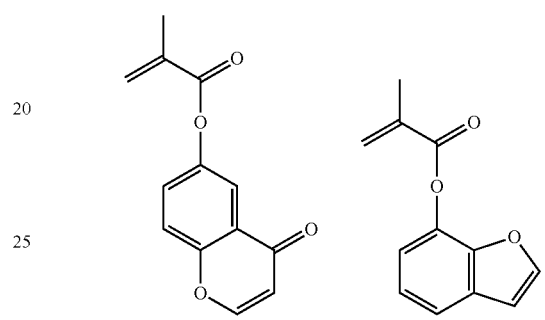
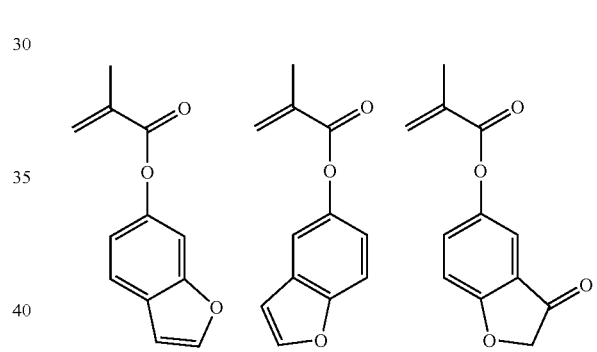
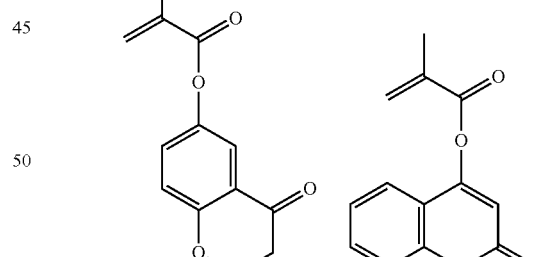
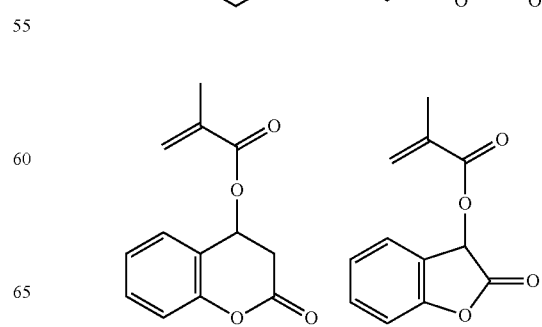

-continued

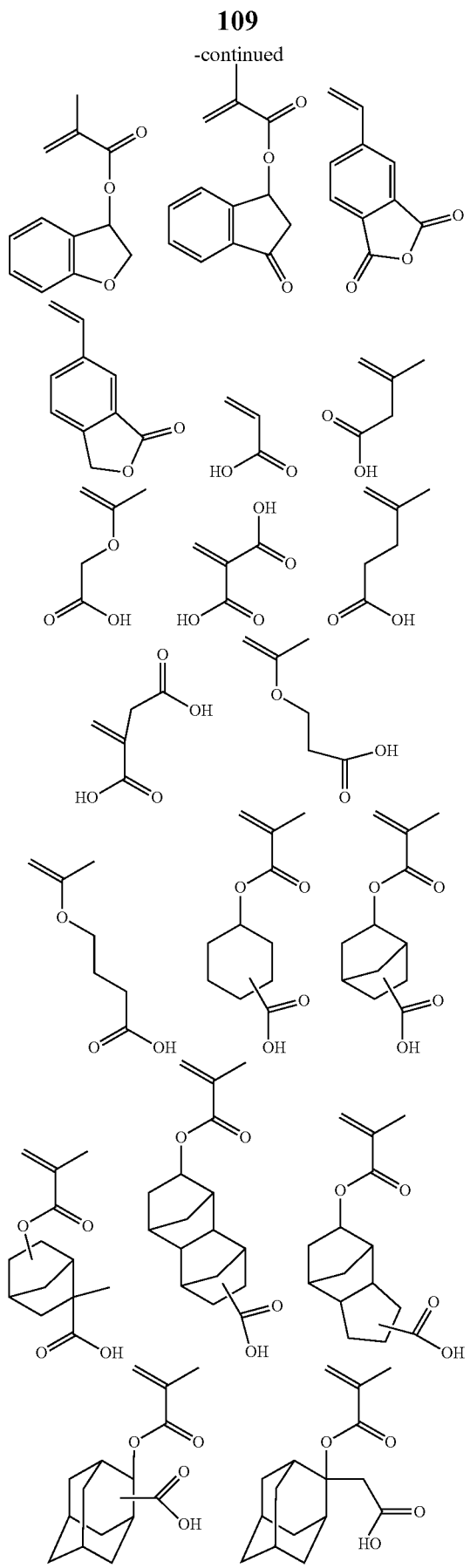

-continued

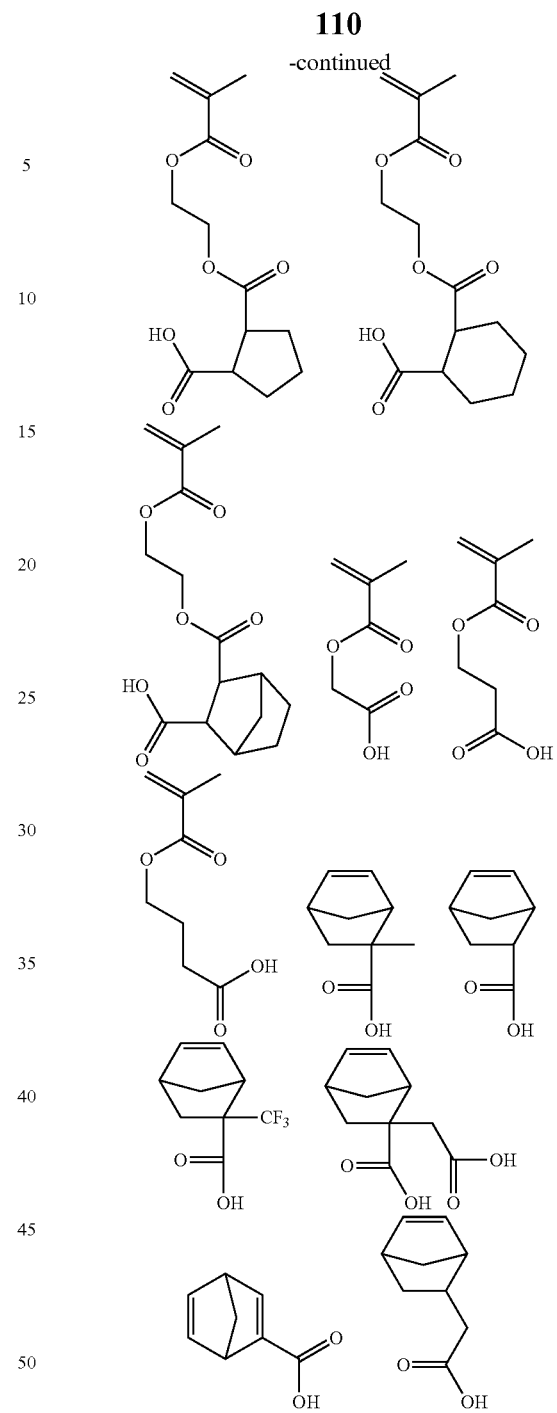

In the case of a monomer having a hydroxyl group, the hydroxyl group may be replaced by an acetal group susceptible to deprotection with acid, typically ethoxyethoxy, prior to polymerization, and the polymerization be followed by deprotection with weak acid and water. Alternatively, the hydroxyl group may be replaced by an acetyl, formyl, pivaloyl or similar group prior to polymerization, and the polymerization be followed by alkaline hydrolysis.

In another preferred embodiment, the copolymer may have further copolymerized therein recurring units (d) selected from units of indene, benzofuran, benzothiophene, acenaphthylene, chromone, coumarin, and norbornadiene, or derivatives thereof. Suitable monomers are exemplified below.

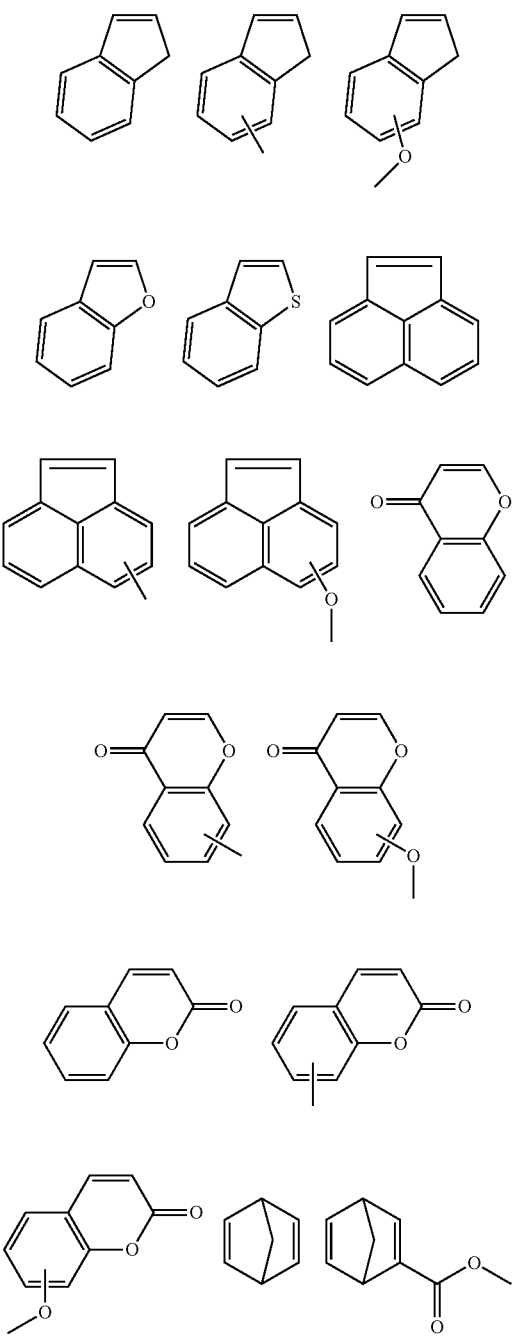

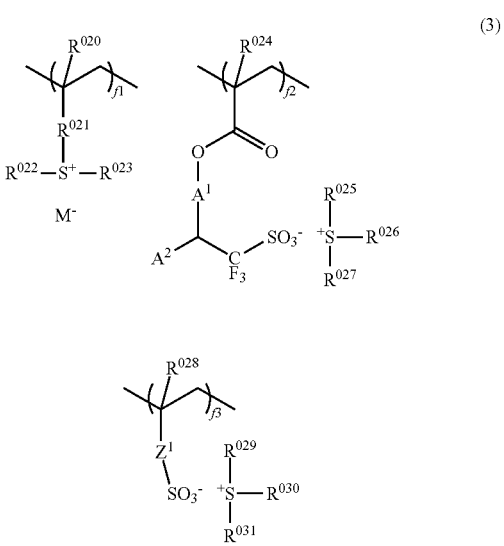

Herein $R^{020}$, $R^{024}$ and $R^{028}$ each are hydrogen or methyl. $R^{021}$ is a single bond, phenylene, —O—$R^{033}$—, or —C(=O)—$Y^1$—$R^{033}$— wherein $Y^1$ is oxygen or NH and $R^{033}$ is a straight, branched or cyclic $C_1$-$C_6$ alkylene group, alkenylene group or phenylene group, which may contain a carbonyl (—CO—), ester (—COO—), ether (—O—) or hydroxyl moiety. $R^{022}$, $R^{023}$, $R^{025}$, $R^{026}$, $R^{027}$, $R^{029}$, $R^{030}$, and $R^{031}$ are each independently a straight, branched or cyclic $C_1$-$C_{12}$ alkyl group which may contain a carbonyl, ester or ether moiety, or a $C_6$-$C_{12}$ aryl group, $C_7$-$C_{20}$ aralkyl group, or thiophenyl group. $A^1$ is a single bond, -$A^0$-C(=O)—O—, -$A^0$-O— or -$A^0$-O—C(=O)—, wherein $A^0$ is a straight, branched or cyclic $C_1$-$C_{12}$ alkylene group which may contain a carbonyl, ester or ether moiety. $A^2$ is hydrogen, $CF_3$ or carbonyl group. $Z^1$ is a single bond, methylene, ethylene, phenylene, fluorinated phenylene, —O—$R^{032}$—, or —C(=O)—$Z^2$—$R^{032}$— wherein $Z^2$ is oxygen or NH and $R^{032}$ is a straight, branched or cyclic $C_1$-$C_6$ alkylene, phenylene, fluorinated phenylene, trifluoromethyl-substituted phenylene or alkenylene group, which may contain a carbonyl, ester, ether or hydroxyl moiety. M is a non-nucleophilic counter ion, and f1, f2 and f3 are in the range: $0 \leq f1 \leq 0.5$, $0 \leq f2 \leq 0.5$, $0 \leq f3 \leq 0.5$, and $0 \leq f1+f2+f3 \leq 0.5$.

Examples of the monomer from which recurring units (f1) of sulfonium salt in formula (3) are derived are shown below.

Besides the recurring units described above, further recurring units (e) can be copolymerized, examples of which include styrene, vinylnaphthalene, vinyl anthracene, vinylpyrene, methyleneindene, vinylpyridine, and vinylcarbazole.

In a further embodiment, an acid generator (f) in the form of an onium salt having polymerizable olefin may be copolymerized with the foregoing monomers. JP-A 2005-084365 discloses sulfonium salts having polymerizable olefin capable of generating a sulfonic acid and similar iodonium salts. JP-A 2006-178317 discloses a sulfonium salt having sulfonic acid directly attached to the main chain.

In this embodiment, the polymer may have further copolymerized therein recurring units having a sulfonium salt (f1) to (f3) represented by the general formula (3).

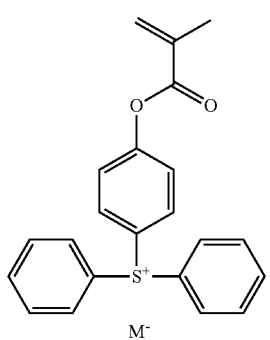

113
-continued
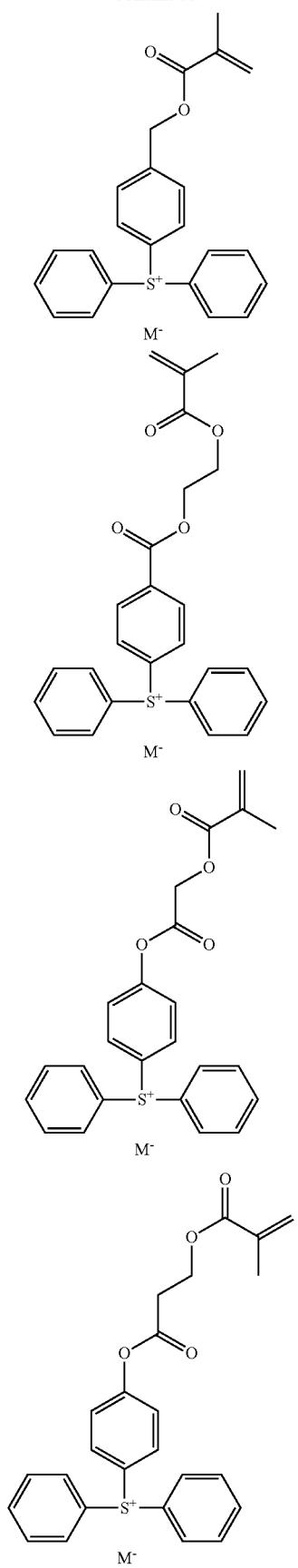
114
-continued
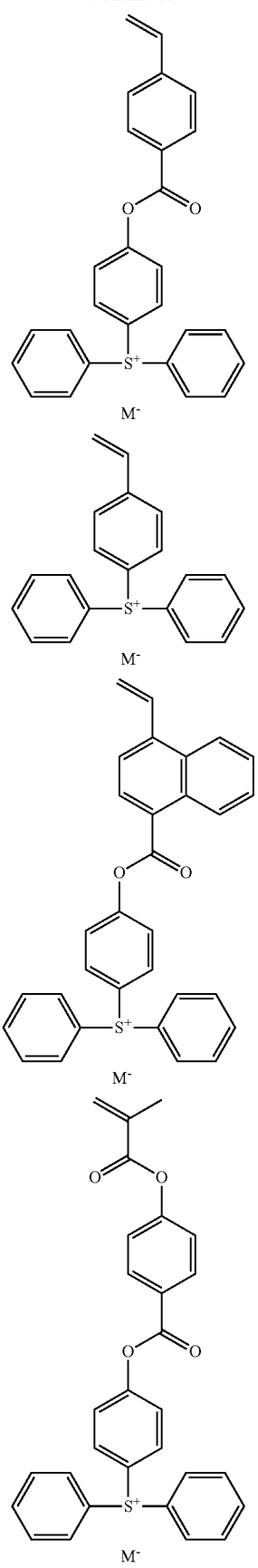

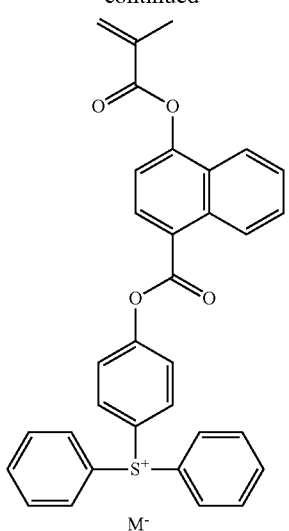

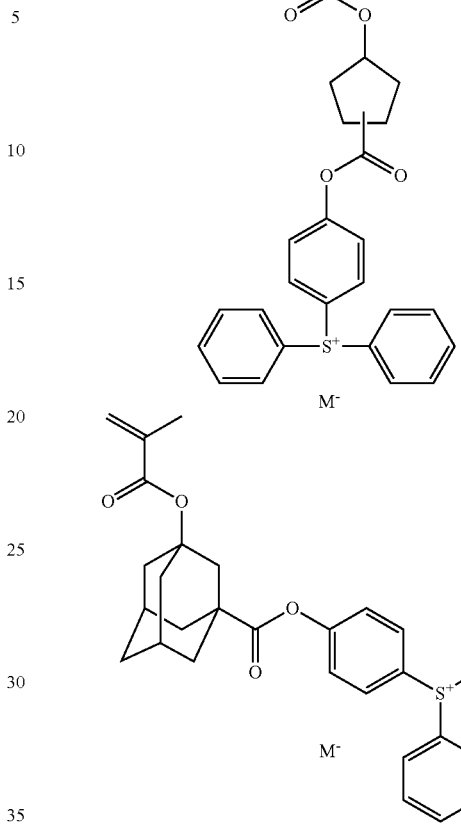

Herein, M⁻ is a non-nucleophilic counter ion.

Examples of the non-nucleophilic counter ion M⁻ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imides such as bis(trifluoromethylsulfonyl)imide, bis(perfluoroethylsulfonyl)imide and bis(perfluorobutylsulfonyl)imide; methides such as tris(trifluoromethylsulfonyl)methide and tris(perfluoroethylsulfonyl)methide.

Also included are sulfonates having fluorine substituted at α-position as represented by the general formula (K-1) and sulfonates having fluorine substituted at α- and β-positions as represented by the general formula (K-2).

$$R^{102}-F_2C-SO_3^- \quad (K\text{-}1)$$

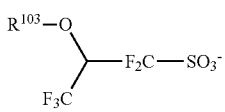
(K-2)

In formula (K-1), $R^{102}$ is hydrogen, or a straight, branched or cyclic $C_1$-$C_{20}$ alkyl group, $C_2$-$C_{20}$ alkenyl group, or $C_6$-$C_{20}$ aryl group, which may have an ether, ester, carbonyl moiety, lactone ring, or fluorine atom. In formula (K-2), $R^{103}$ is hydrogen, or a straight, branched or cyclic $C_1$-$C_{30}$ alkyl or acyl group, $C_2$-$C_{20}$ alkenyl group, or $C_6$-$C_{20}$ aryl or aryloxy group, which may have an ether, ester, carbonyl moiety or lactone ring.
Examples of the monomer from which recurring units (f2) of sulfonium salt in formula (3) are derived are shown below.
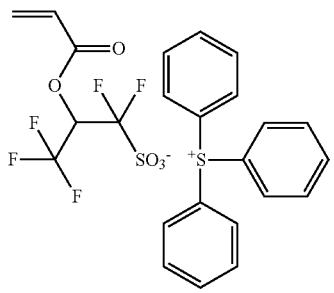
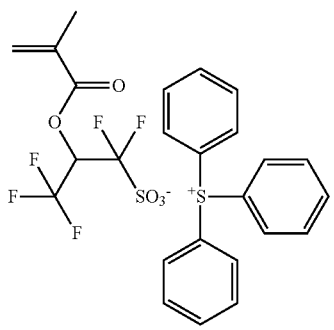
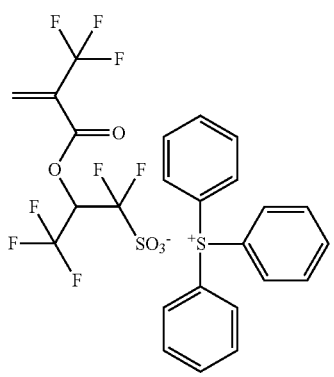
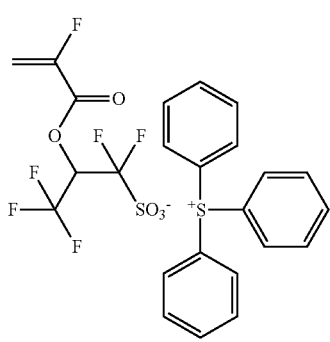
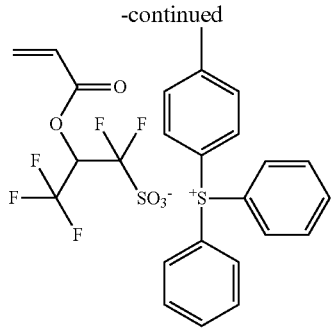
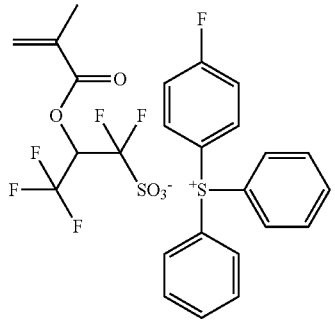
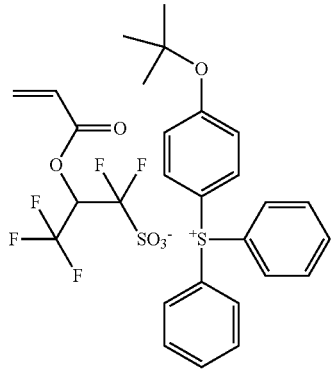
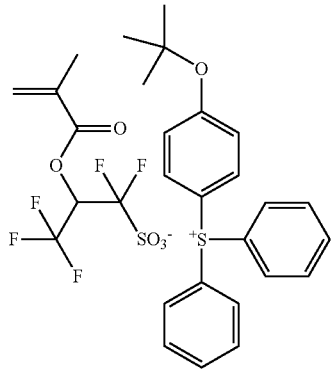
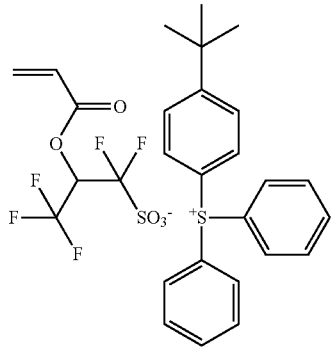

119
-continued
120
-continued
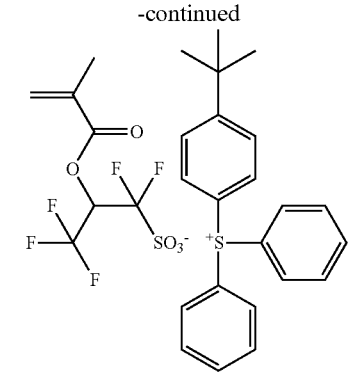
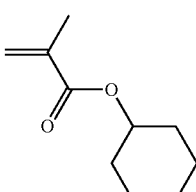
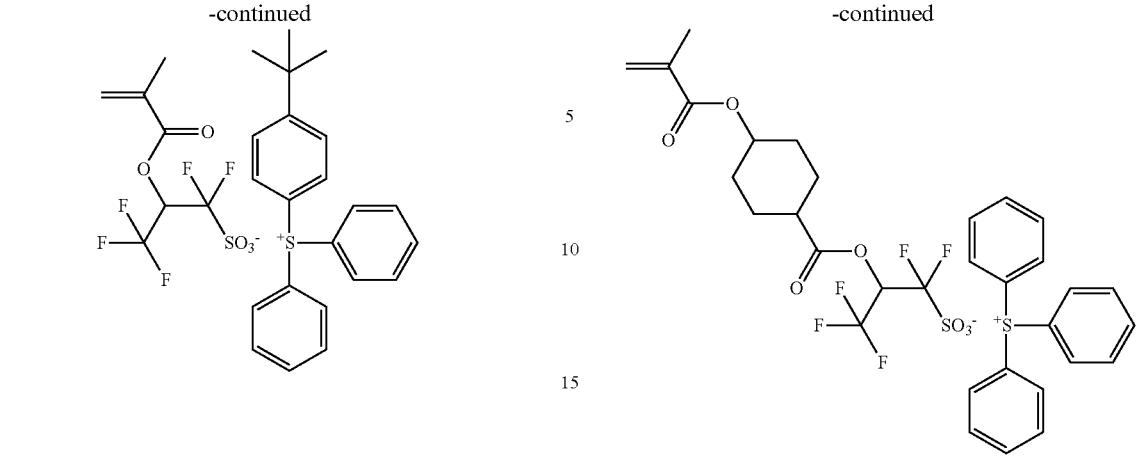
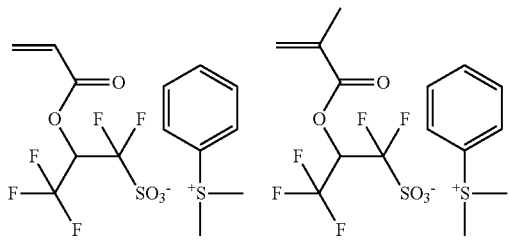
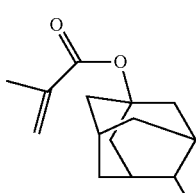
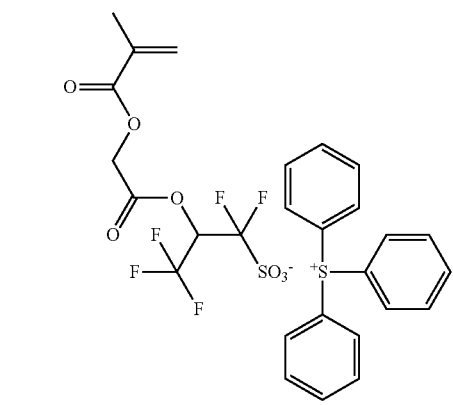
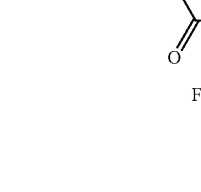
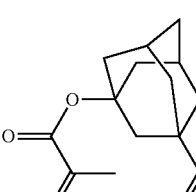
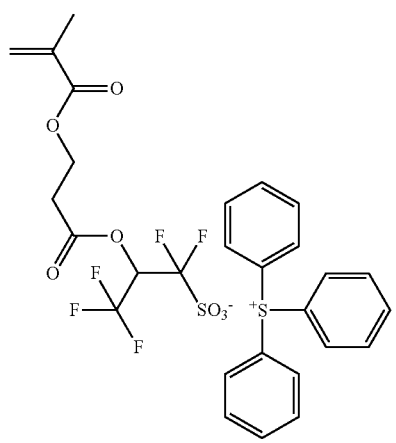
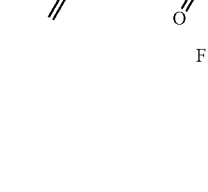
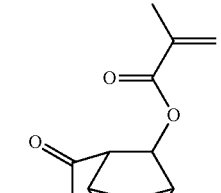
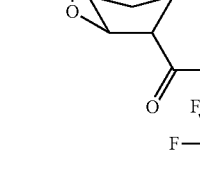

121
-continued
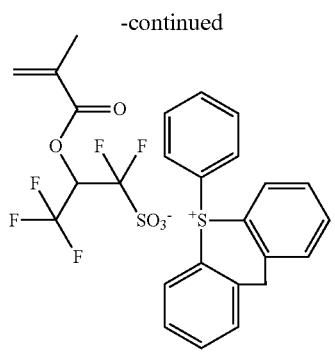
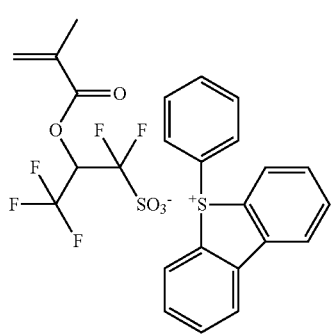
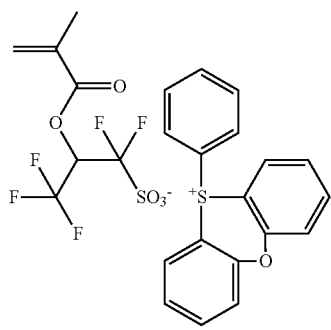
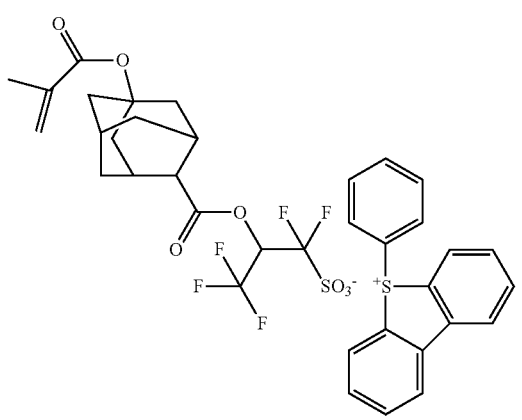
122
-continued
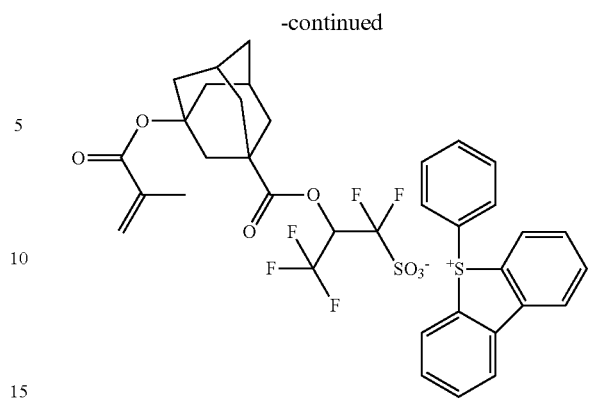
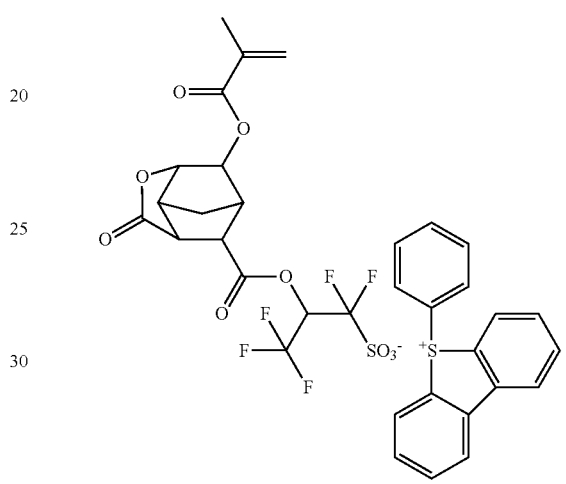
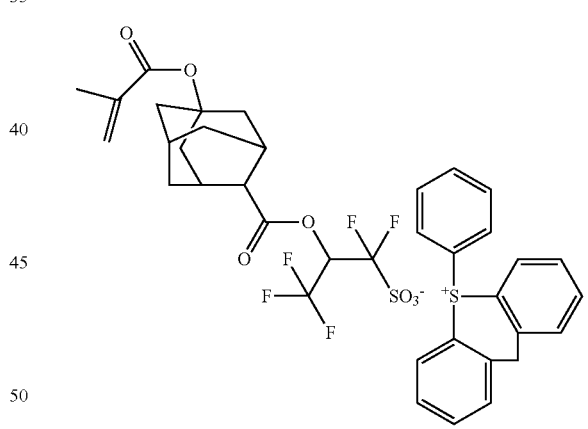
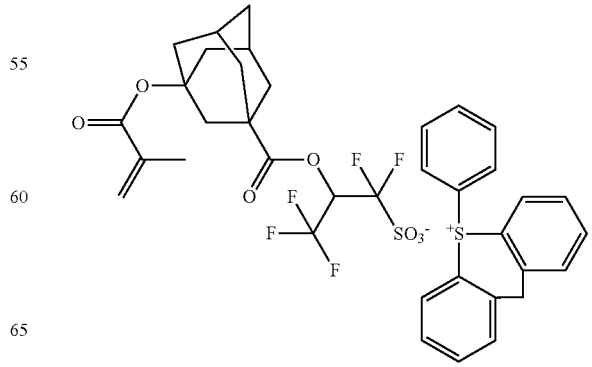

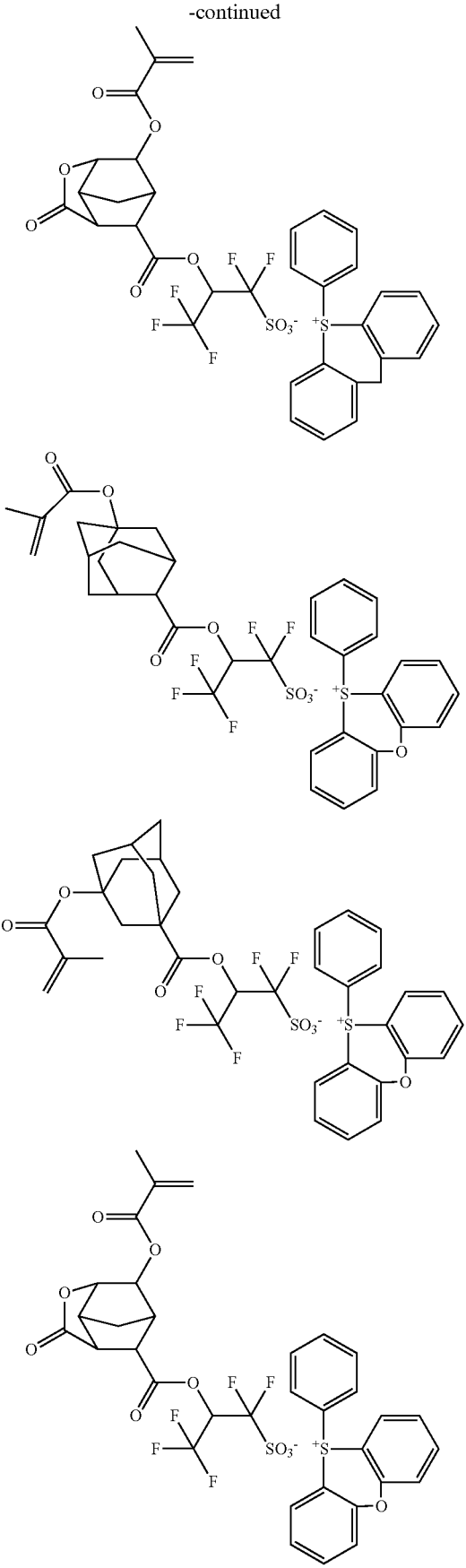
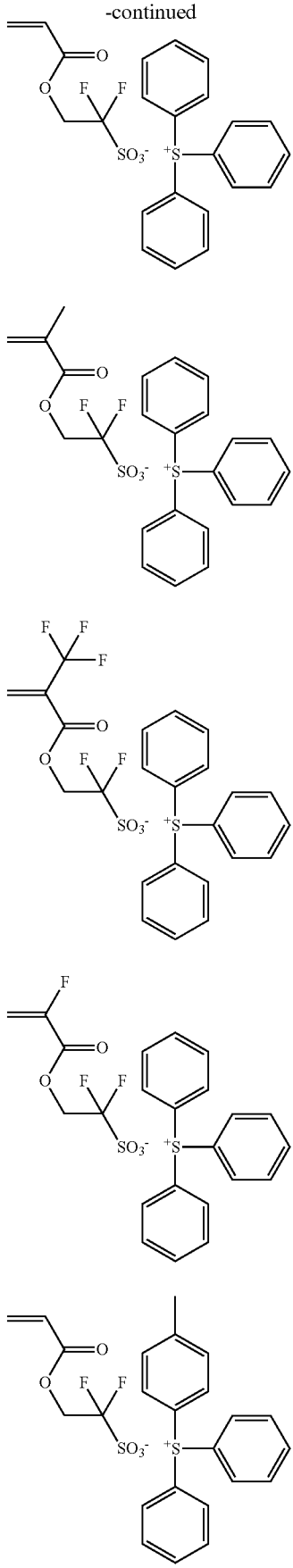

125
-continued
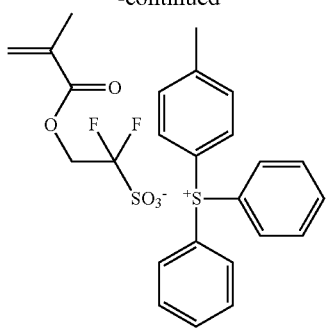
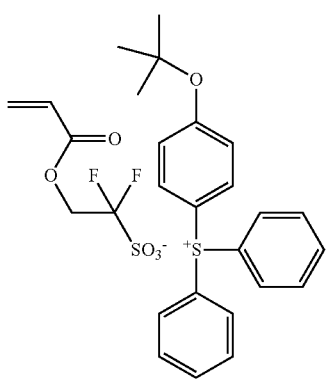
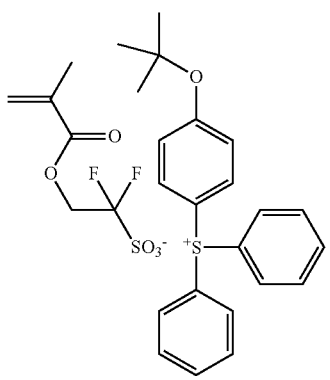
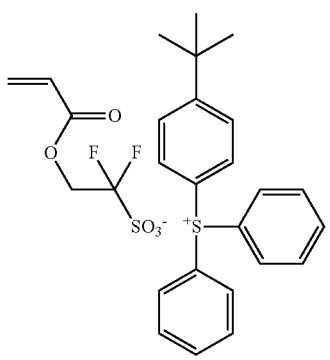
126
-continued
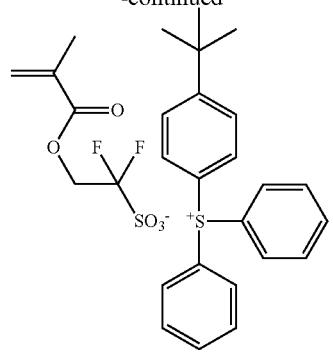
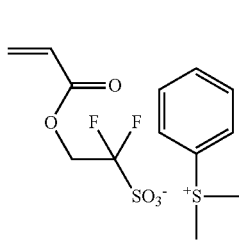 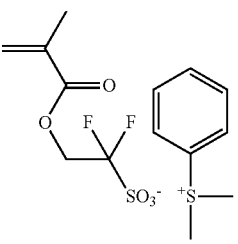
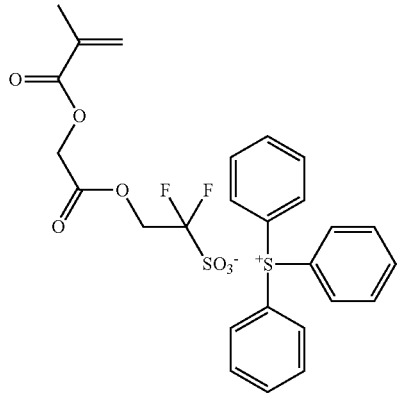
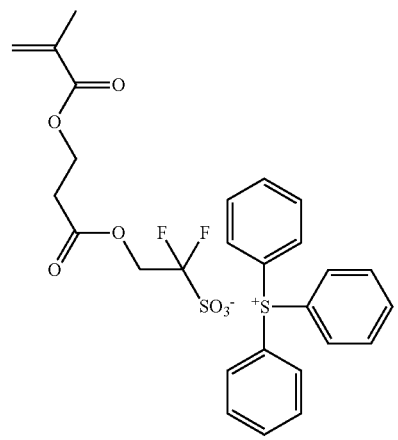

-continued
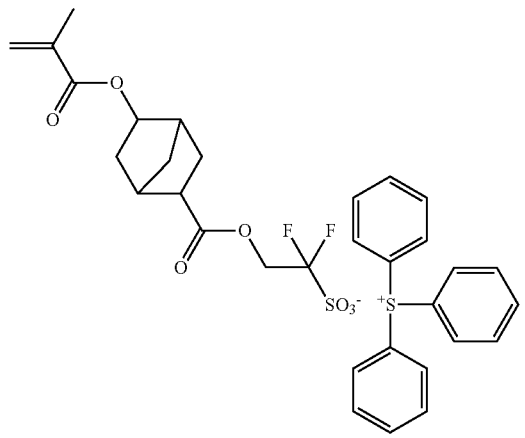
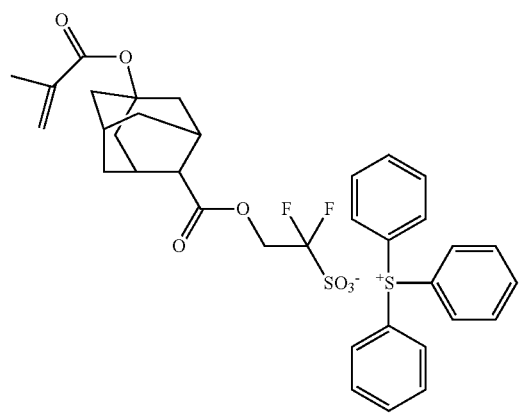
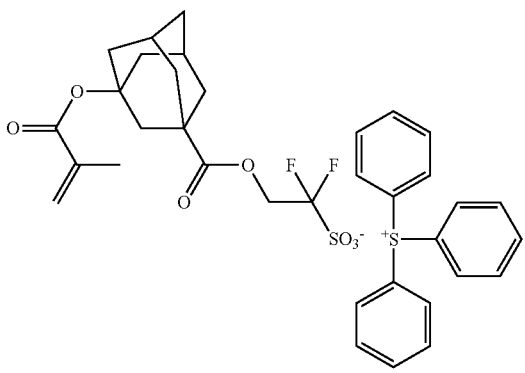
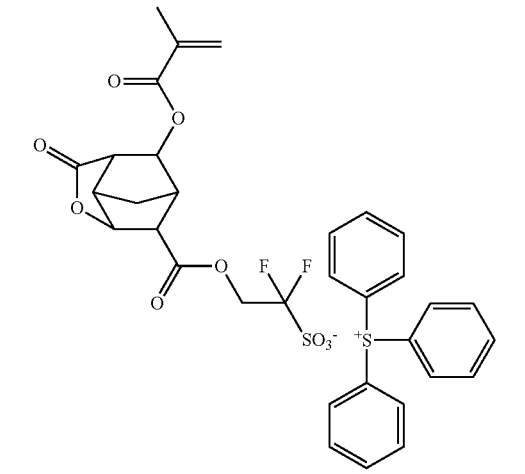
Examples of the monomer from which recurring units (f3) of sulfonium salt in formula (3) are derived are shown below.
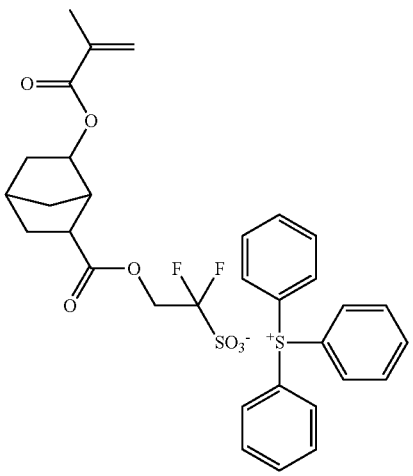
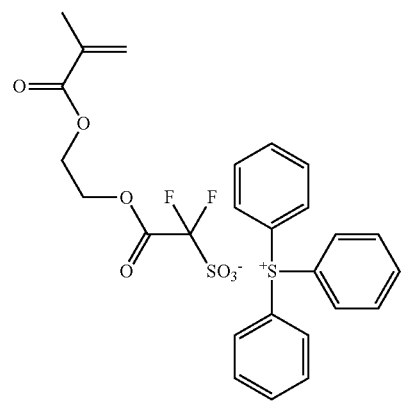
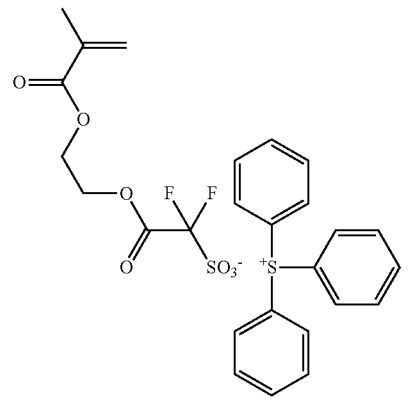
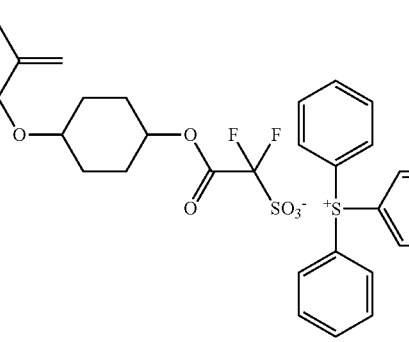
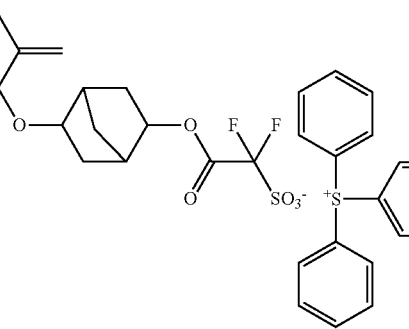

129
-continued
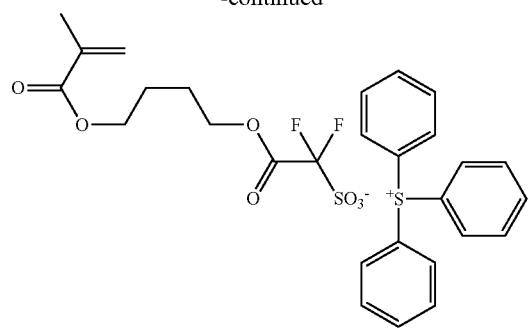
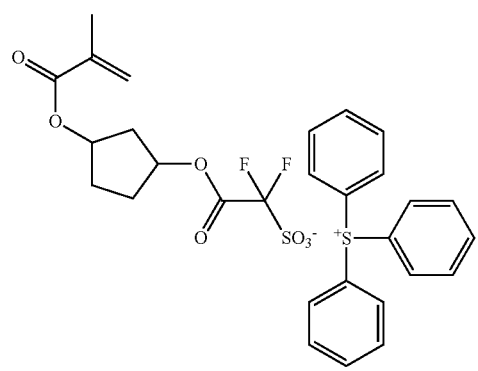
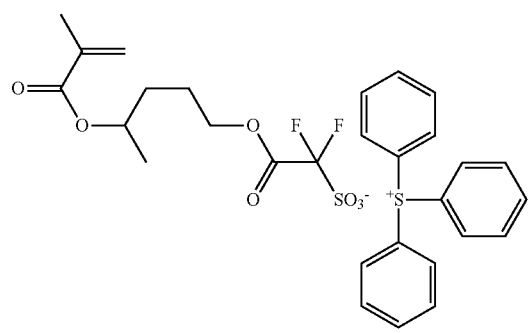
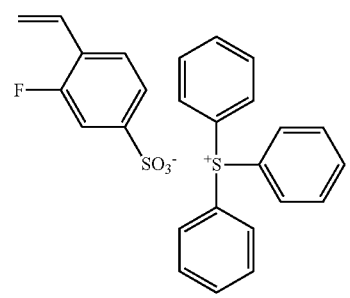
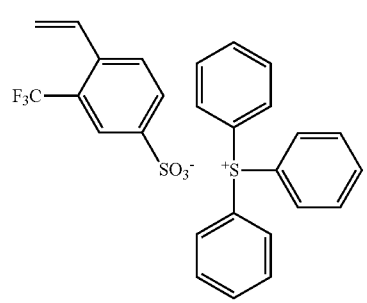
130
-continued
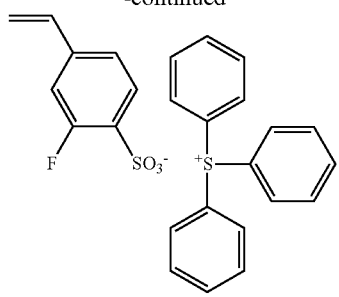
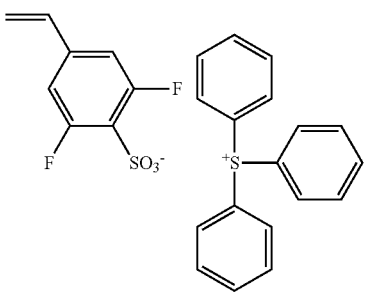
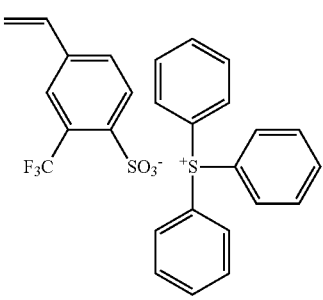
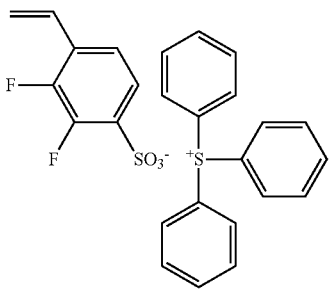
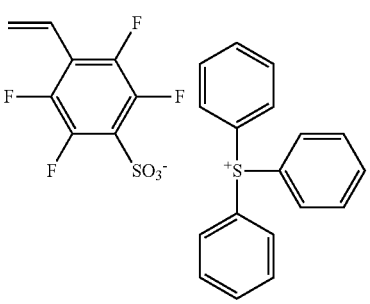

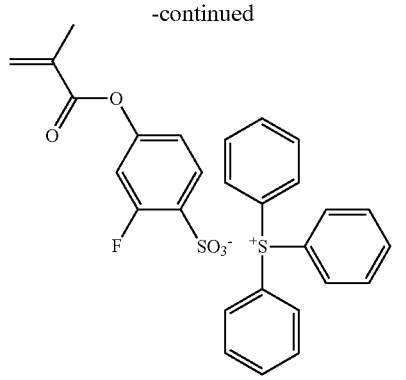
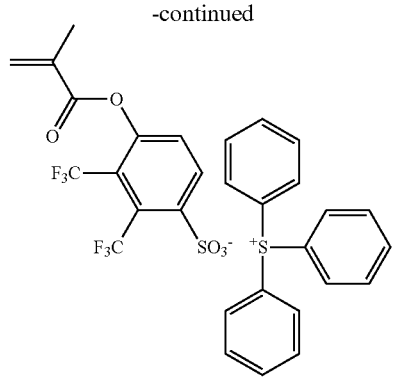

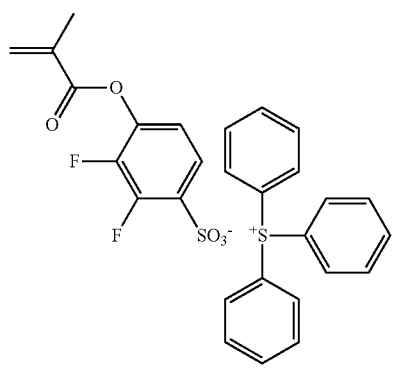
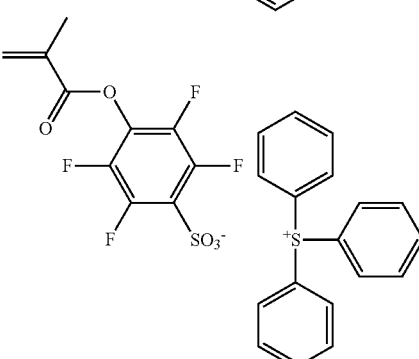

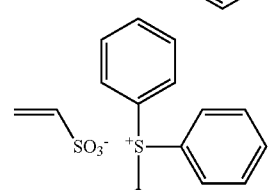

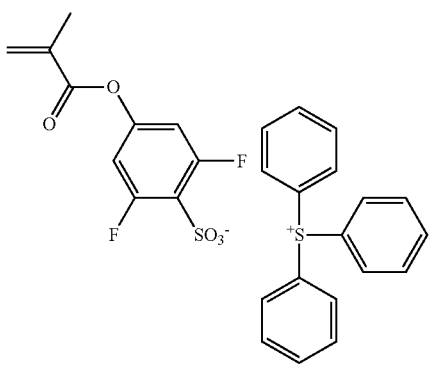
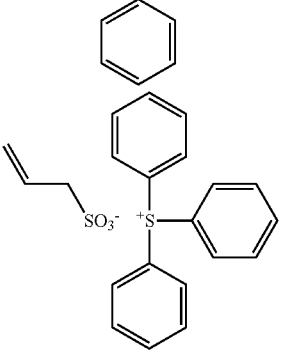

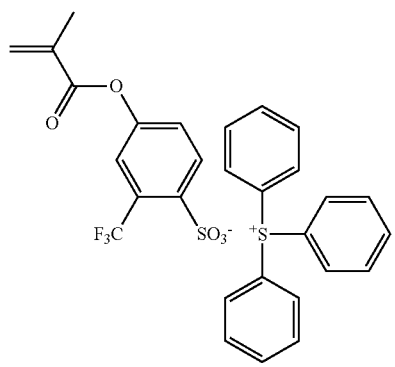

Onium salts such as sulfonium salts, iodonium salts and ammonium salts of sulfonic acids which are not fluorinated at α-position as described in US 2008153030 (JP-A 2008-158339) and similar onium salts of carboxylic acid may also be used as the quencher. While an α-fluorinated sulfonic acid, imidic acid, and methidic acid are necessary to deprotect the acid labile group of carboxylic acid ester, an α-non-fluorinated sulfonic acid and a carboxylic acid are released by salt exchange with an α-non-fluorinated onium salt. An α-non-fluorinated sulfonic acid and a carboxylic acid function as a quencher because they do not induce deprotection reaction. In particular, since sulfonium salts and iodonium salts of an α-non-fluorinated sulfonic acid and a carboxylic acid are photodegradable, those portions receiving a high light intensity are reduced in quenching capability and increased in the concentration of a α-fluorinated sulfonic acid, imidic acid, or methidic acid. As a result, the exposed portions are improved in contrast. When a negative tone pattern is formed using an organic solvent, the improvement in the contrast of exposed portions leads to an improvement in the rectangularity of negative pattern. Onium salts including sulfonium salts, iodonium salts and ammonium salts of an α-non-fluorinated sulfonic acid and a carboxylic acid are highly effective in controlling the diffusion of an α-fluorinated sulfonic acid, imidic acid and methidic acid. This is because the onium salt resulting from salt exchange is less mobile due to a higher molecular weight. In the event that a hole pattern is formed by negative tone development, since acid is generated in many regions, it is very important to control the diffusion of acid from the exposed area to the unexposed area. The addition of onium salts including sulfonium salts, iodonium salts and ammonium salts of an α-non-fluorinated sulfonic acid and a carboxylic acid as well as the amine quencher defined herein is very important from the aspect of acid diffusion control.

The attachment of an acid generator to the polymer main chain is effective in restraining acid diffusion, thereby preventing a reduction of resolution due to blur by acid diffusion. Also roughness (LER or LWR) is improved since the acid generator is uniformly distributed.

The base polymer for formulating the positive resist composition comprises recurring units (a1) and/or (a2) having an acid labile group as essential components and additional recurring units (b), (c), (d), (e), (f1), (f2) and/or (f3) as optional components. A copolymerization proportion of units (a1), (a2), (b), (c), (d), (e), (f1), (f2) and (f3) is: $0 \leq a1 < 1.0$, $0 \leq a2 < 1.0$, $0 < a1+a2 < 1.0$, $0 \leq b \leq 0.9$, $0 \leq c \leq 0.9$, $0 \leq d \leq 0.8$, $0 \leq e \leq 0.8$, $0 \leq f1 \leq 0.5$, $0 \leq f2 \leq 0.5$, and $0 \leq f3 \leq 0.5$; preferably $0 \leq a1 \leq 0.9$, $0 \leq a2 \leq 0.9$, $0.1 \leq a1+a2 \leq 0.9$, $0 \leq b \leq 0.8$, $0 \leq c \leq 0.8$, $0 \leq d \leq 0.7$, $0 \leq e \leq 0.7$, $0 \leq f1 \leq 0.4$, $0 \leq f2 \leq 0.4$, and $0 \leq f3 \leq 0.4$; and more preferably $0 \leq a1 \leq 0.8$, $0 \leq a2 \leq 0.8$, $0.1 \leq a1+a2 \leq 0.8$, $0 \leq b \leq 0.75$, $0 \leq c \leq 0.75$, $0 \leq d \leq 0.6$, $0 \leq e \leq 0.6$, $0 \leq f1 \leq 0.3$, $0 \leq f2 \leq 0.3$, and $0 \leq f3 \leq 0.3$. Note $a1+a2+b+c+d+e+f1+f2+f3=1.0$.

For the base polymer for formulating the negative resist composition, an acid labile group is not necessarily essential. The base polymer comprises recurring units (b), (c), (d), (e), (f1), (f2) and (f3) in a copolymerization proportion: $0 < b \leq 1.0$, $0 \leq c \leq 0.9$, $0 \leq d \leq 0.8$, $0 \leq e \leq 0.8$, $0 \leq f1 \leq 0.5$, $0 \leq f2 \leq 0.5$, and $0 \leq f3 \leq 0.5$; preferably $0.2 \leq b \leq 1.0$, $0 \leq c \leq 0.8$, $0 \leq d \leq 0.7$, $0 \leq e \leq 0.7$, $0 \leq f1 \leq 0.4$, $0 \leq f2 \leq 0.4$, and $0 \leq f3 \leq 0.4$; and more preferably $0.3 \leq b \leq 1.0$, $0 \leq c \leq 0.75$, $0 \leq d \leq 0.6$, $0 \leq e \leq 0.6$, $0 \leq f1 \leq 0.3$, $0 \leq f2 \leq 0.3$, and $0 \leq f3 \leq 0.3$. Note $b+c+d+e+f1+f2+f3=1.0$.

These polymers may be synthesized by any desired methods, for example, by dissolving one or more monomers selected from the monomers to form the recurring units (a1), (a2), (b), (c), (d), (e), (f1), (f2) and (f3) in an organic solvent, adding a radical polymerization initiator thereto, and effecting heat polymerization. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours.

When hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis as mentioned above, for thereby converting the polymer product to polyhydroxystyrene or hydroxypolyvinylnaphthalene. For alkaline hydrolysis, a base such as aqueous ammonia or triethylamine may be used. The reaction temperature is −20° C. to 100° C., preferably 0° C. to 60° C., and the reaction time is 0.2 to 100 hours, preferably 0.5 to 20 hours.

The polymer used in the resist composition should preferably have a weight average molecular weight (Mw) in the range of 1,000 to 500,000, and more preferably 2,000 to 30,000, as measured by GPC versus polystyrene standards using tetrahydrofuran as a solvent. With too low a Mw, the resist composition may become less heat resistant. A polymer with too high a Mw may lose alkaline solubility and give rise to a footing phenomenon after pattern formation.

If a multi-component polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

It is understood that a blend of two or more polymers which differ in compositional ratio, molecular weight or dispersity is acceptable.

The basic compound of formula (1) is advantageously used in a chemically amplified positive or negative resist composition having an acid generator added thereto. Specifically, the basic compound is added to the polymer serving as a base resin, which may be further combined with any desired components including an organic solvent, dissolution inhibitor, surfactant, crosslinker and the like to formulate a positive or negative resist composition. This positive or negative resist composition has a very high sensitivity in that the dissolution rate in developer of the polymer in exposed areas is accelerated by catalytic reaction. In addition, the resist film has a high dissolution contrast, resolution, exposure latitude, and process adaptability, and provides a good pattern profile after exposure, and minimal proximity bias because of restrained acid diffusion. By virtue of these advantages, the composition is fully useful in commercial application and suited as a pattern-forming material for the fabrication of VLSIs. Particularly when an acid generator is incorporated to formulate a chemically amplified positive resist composition capable of utilizing acid catalyzed reaction, the composition has a higher sensitivity and is further improved in the properties described above.

In the case of positive resist compositions, inclusion of a dissolution inhibitor may lead to an increased difference in dissolution rate between exposed and unexposed areas and a further improvement in resolution. In the case of negative resist compositions, a negative pattern may be formed by adding a crosslinker to reduce the dissolution rate of exposed area.

Any conventional basic compounds may be added along with the basic compound of formula (1) for further suppressing the diffusion rate of acid in the resist film or correcting the pattern profile. Addition of a surfactant may improve or control the coating characteristics of the resist composition.

Suitable conventional basic compounds include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, imide derivatives, and carbamate derivatives. Also included are primary, secondary, and tertiary amine compounds, specifically amine compounds having a hydroxyl, ether, ester, lactone ring, cyano, or sulfonic acid ester group as described in JP-A 2008-111103, paragraphs [0146] to [0164], and compounds having a carbamate group as described in JP 3790649.

The positive or negative resist composition may include an acid generator in order for the composition to function as a chemically amplified positive or negative resist composition in the pattern forming process defined herein. Typical of the acid generator used herein is a photoacid generator (PAG) capable of generating an acid in response to actinic light or radiation. It is any compound capable of generating an acid upon exposure to high-energy radiation although those acid generators capable of generating sulfonic acid, imidic acid or methidic acid are preferred. Preferred PAGs include sulfonium salts, iodonium salts, sulfonyldiazomethane, N-sulfonyloxyimide, and oxime-O-sulfonate acid generators. Exemplary acid generators are described in U.S. Pat. No. 7,537,880 (JP-A 2008-111103, paragraphs [0122] to [0142]).

While the resist composition of the invention should preferably comprise the base polymer, the basic compound of formula (1), and the acid generator, described above, it may further comprise an organic solvent, dissolution inhibitor, crosslinker, surfactant, acetylene alcohol, and conventional basic compound, alone or in combination.

Examples of the organic solvent used herein are described in JP-A 2008-111103, paragraphs [0144] to [0145] (U.S. Pat. No. 7,537,880). Exemplary solvents include ketones such as cyclohexanone, cyclopentanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, which may be used alone or in admixture.

Conventional basic compounds are described in JP-A 2008-111103, paragraphs [0146] to [0164]. Exemplary surfactants are described in JP-A 2008-111103, paragraphs [0165] to [0166].

The dissolution inhibitor which can be used herein is a compound having at least two phenolic hydroxyl groups on the molecule, in which an average of from 0 to 100 mol % of all the hydrogen atoms on the phenolic hydroxyl groups are replaced by acid labile groups or a compound having at least one carboxyl group on the molecule, in which an average of 50 to 100 mol % of all the hydrogen atoms on the carboxyl groups are replaced by acid labile groups, both the compounds having a weight average molecular weight of 100 to 1,000, and preferably 150 to 800. Typical are bisphenol A, trisphenol, phenolphthalein, cresol novolac, naphthalenecarboxylic acid, adamantanecarboxylic acid, and cholic acid derivatives in which the hydrogen atom on the hydroxyl or carboxyl group is replaced by an acid labile group, as described in US 2008090172 (JP-A 2008-122932, paragraphs [0155] to [0178]). Suitable acetylene alcohols are described in JP-A 2008-122932, paragraphs [0179] to [0182].

Suitable crosslinkers which can be used herein include melamine compounds, guanamine compounds, glycoluril compounds and urea compounds having substituted thereon at least one group selected from among methylol, alkoxymethyl and acyloxymethyl groups, epoxy compounds, isocyanate compounds, azide compounds, and compounds having a double bond such as an alkenyl ether group. These compounds may be used as an additive or introduced into a polymer side chain as a pendant. Hydroxy-containing compounds may also be used as the crosslinker. Of the foregoing crosslinkers, examples of suitable epoxy compounds include tris(2,3-epoxypropyl) isocyanurate, trimethylolmethane triglycidyl ether, trimethylolpropane triglycidyl ether, and triethylolethane triglycidyl ether. Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof. Examples of the guanamine compound include tetramethylol guanamine, tetramethoxymethyl guanamine, tetramethylol guanamine compounds having 1 to 4 methylol groups methoxymethylated and mixtures thereof, tetramethoxyethyl guanamine, tetraacyloxyguanamine, tetramethylol guanamine compounds having 1 to 4 methylol groups acyloxymethylated and mixtures thereof. Examples of the glycoluril compound include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylol urea, tetramethoxymethyl urea, tetramethylol urea compounds having 1 to 4 methylol groups methoxymethylated and mixtures thereof, and tetramethoxyethyl urea.

Suitable isocyanate compounds include tolylene diisocyanate, diphenylmethane diisocyanate, hexamethylene diisocyanate and cyclohexane diisocyanate. Suitable azide compounds include 1,1'-biphenyl-4,4'-bisazide, 4,4'-methylidenebisazide, and 4,4'-oxybisazide. Examples of the alkenyl ether group-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

Also useful are quenchers of polymer type as described in U.S. Pat. No. 7,598,016 (JP-A 2008-239918). The polymeric quencher segregates at the resist surface after coating and thus enhances the rectangularity of resist pattern. When a protective film is applied as is often the case in the immersion lithography, the polymeric quencher is also effective for preventing a film loss of resist pattern or rounding of pattern top.

In preferred embodiments, the respective components are used in the following amounts, provided that all amounts are expressed in parts by weight relative to 100 parts by weight of the base polymer. An amount of the PAG used is 0.1 to 50 parts, and more preferably 1 to 40 parts. An amount of the organic solvent used is 100 to 10,000 parts, and more preferably 200 to 8,000 parts. In positive resist compositions, an amount of the dissolution inhibitor blended is 0 to 50 parts, and more preferably 5 to 40 parts. In negative resist compositions, an amount of the crosslinker blended is 0.1 to 50 parts, and more preferably 1 to 40 parts. An amount of the surfactant blended is 0.0001 to 10 parts. An amount of the acetylene alcohol blended is 0 to 5 parts. An amount of the conventional basic compound other than the basic compound of formula (1) is 0 to 5 parts, and more preferably 0 to 4 parts. An amount of the polymeric quencher is 0 to 5 parts, and more preferably 0 to 4 parts.

Process

The positive resist composition, typically chemically amplified positive resist composition comprising a base polymer, a basic compound of formula (1), and an acid generator in an organic solvent is used in the fabrication of various integrated circuits. Pattern formation using the resist composition may be performed by well-known lithography processes. The process generally involves coating, prebaking, exposure, post-exposure baking (PEB), and development. If necessary, any additional steps may be added.

The positive resist composition is first applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, MoSi, or $SiO_2$) by a suitable coating technique such as spin coating, roll coating, flow coating, dipping, spraying or doctor coating. The coating is prebaked on a hot plate at a temperature of 60 to 150° C. for 10 seconds to 30 minutes, preferably 80 to 120° C. for 30 seconds to 20 minutes. The resulting resist film is generally 0.1 to 2.0 µm thick.

The resist film is then exposed to a desired pattern of high-energy radiation such as UV, deep-UV, EB, x-ray, excimer laser light, γ-ray, synchrotron radiation or EUV (soft x-ray), directly or through a mask. The exposure dose is preferably about 1 to 200 mJ/cm$^2$, more preferably about 10 to 100 mJ/cm$^2$, or about 0.1 to 100 µC/cm$^2$, more preferably about 0.5 to 50 µC/cm$^2$. The resist film is further baked (PEB) on a hot plate at 60 to 150° C. for 10 seconds to 30 minutes, preferably 80 to 120° C. for 30 seconds to 20 minutes.

Thereafter the resist film is developed with a developer in the form of an aqueous base solution for 3 seconds to 3 minutes, preferably 5 seconds to 2 minutes by conventional techniques such as dip, puddle and spray techniques. A typical developer is a 0.1 to 10 wt %, preferably 2 to 5 wt % aqueous solution of tetramethylammonium hydroxide (TMAH), tetraethylammonium hydroxide (TEAH), tetrapropylammonium hydroxide (TPAH), or tetrabutylammonium hydroxide (TBAH). The resist film in the exposed area is dissolved in the developer whereas the resist film in the unexposed area is not dissolved. In this way, the desired positive pattern is formed on the substrate. Inversely in the case of negative resist, the exposed area of resist film is insolubilized and the unexposed area is dissolved in the developer. It is appreciated that the resist composition of the invention is best suited for micro-patterning using such high-energy radiation as KrF and ArF excimer laser, EB, EUV (soft x-ray), x-ray, γ-ray and synchrotron radiation.

In an alternative embodiment, a negative pattern may be formed via organic solvent development using a polymer having an acid labile group (for positive resist compositions). The developer used herein is preferably selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, butenyl acetate, isoamyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-sec-butyl ether, di-n-pentyl ether, diisopentyl ether, di-sec-pentyl ether, di-tert-amyl ether, and di-n-hexyl ether. The solvents may be used alone or in admixture. Besides the foregoing solvents, aromatic solvents may be used, for example, toluene, xylene, ethylbenzene, isopropylbenzene, tert-butylbenzene and mesitylene. Rinsing is effective for minimizing the risks of resist pattern collapse and defect formation. However, rinsing is not essential. If rinsing is omitted, the amount of solvent used may be reduced.

A hole or trench pattern after development may be shrunk by the thermal flow, RELACS® or DSA process. A hole pattern is shrunk by coating a shrink agent thereto, and baking such that the shrink agent may undergo crosslinking at the resist surface as a result of the acid catalyst diffusing from the resist layer during bake, and the shrink agent may attach to the sidewall of the hole pattern. The bake is at a temperature of 70 to 180° C., preferably 80 to 170° C., for a time of 10 to 300 seconds. The extra shrink agent is stripped and the hole pattern is shrunk.

EXAMPLE

Examples of the invention are given below by way of illustration and not by way of limitation. The abbreviation "pbw" is parts by weight. For all polymers, Mw and Mn are determined by GPC versus polystyrene standards using tetrahydrofuran solvent, and Mw/Mn designates molecular weight distribution or dispersity. For measurement of the hole size of a pattern, a scanning electron microscope (SEM) CG-4000 (Hitachi High-Technologies Corp.) was used.

Quenchers 1 to 50 in the form of carboxylic acid-generating acid generators used herein have the following structure.

Quencher 1
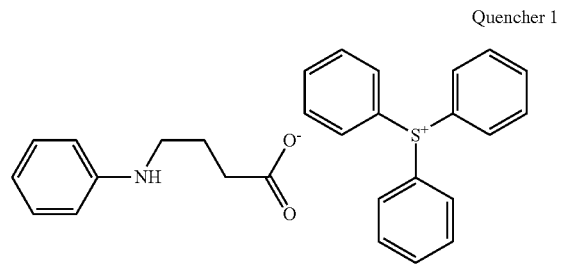
Quencher 2
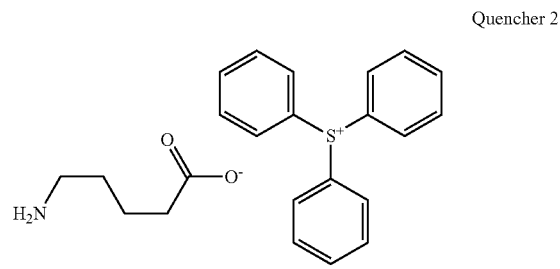
Quencher 3
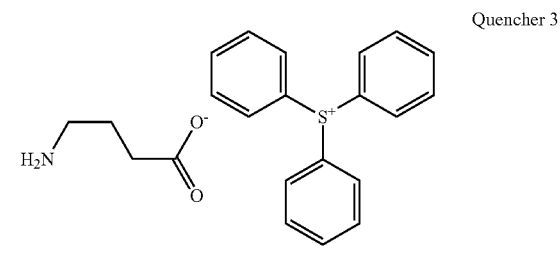
Quencher 4
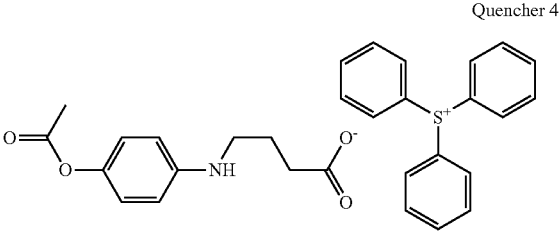
Quencher 5
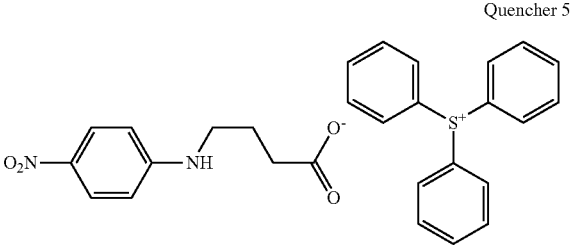
Quencher 6
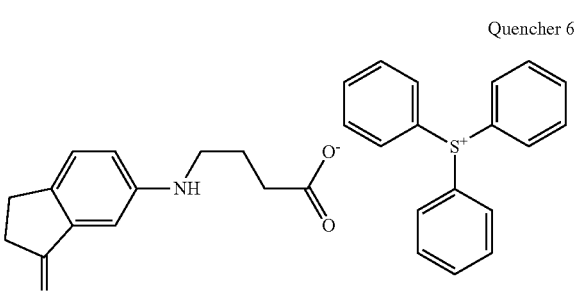
-continued
Quencher 7
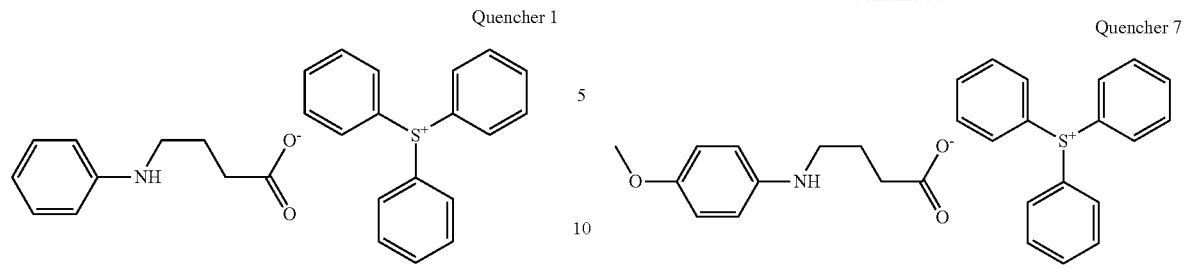
Quencher 8
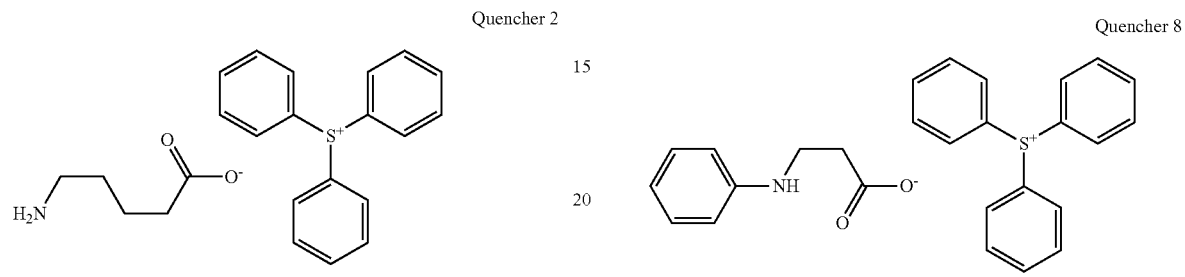
Quencher 9
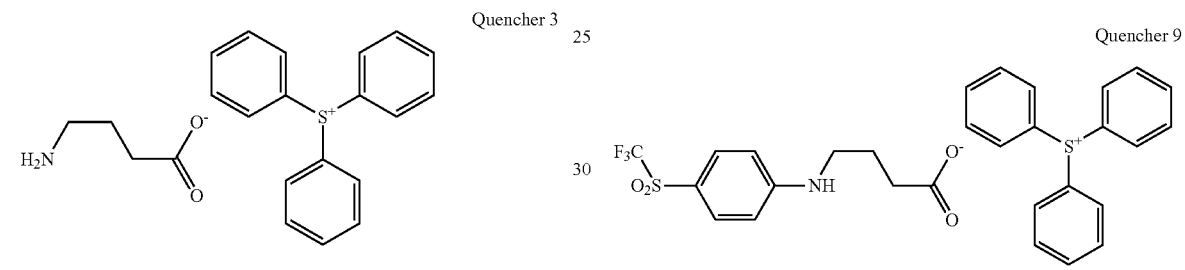
Quencher 10
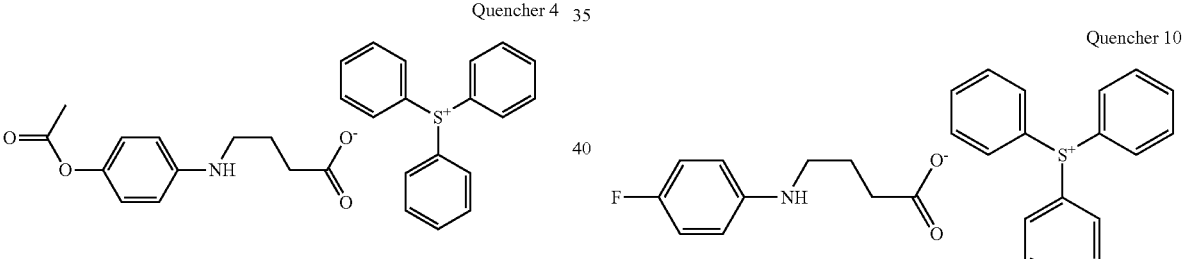
Quencher 11
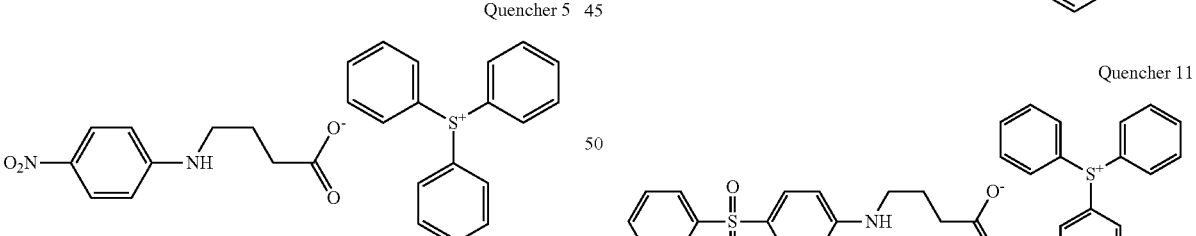
Quencher 12
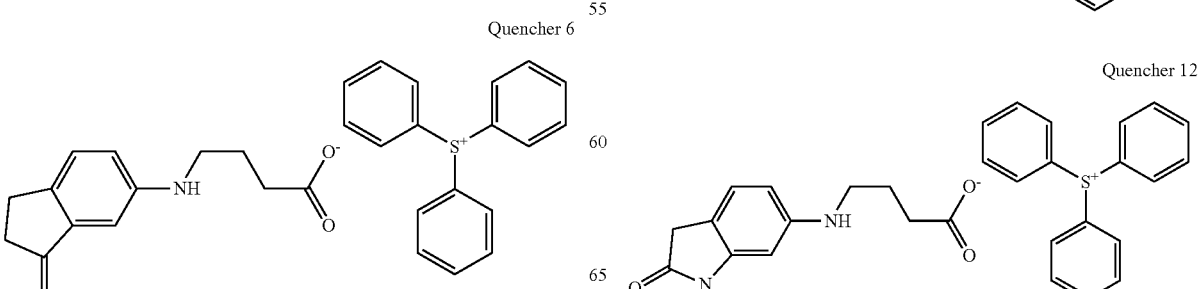

Quencher 13
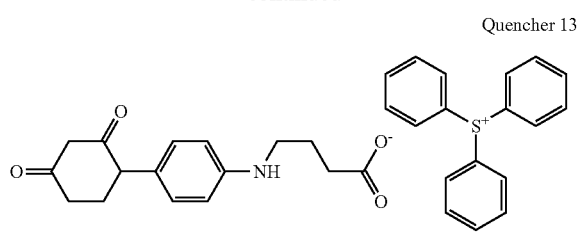
Quencher 19
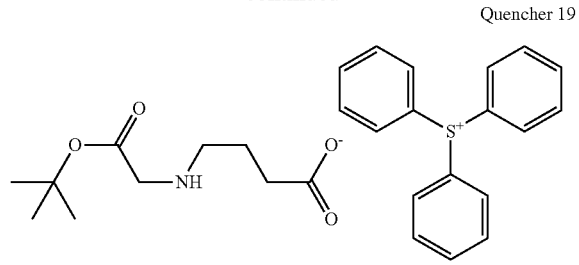
Quencher 14
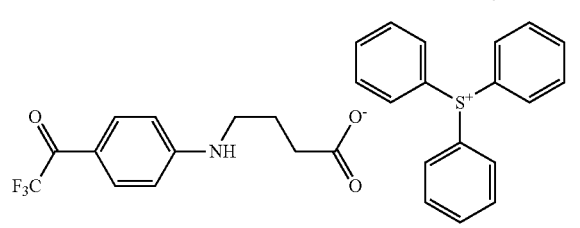
Quencher 20
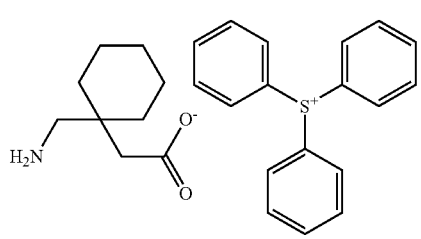
Quencher 15
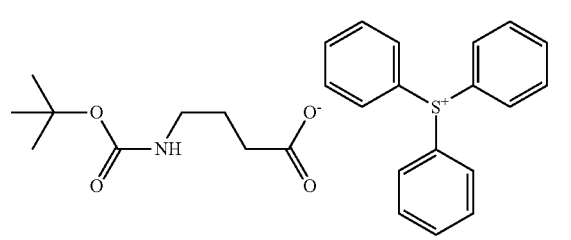
Quencher 21
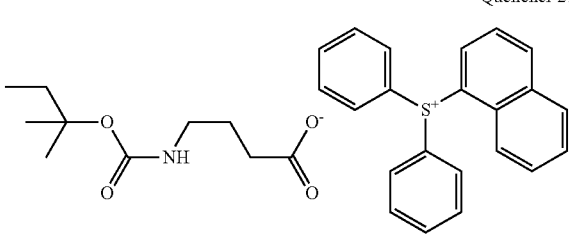
Quencher 16
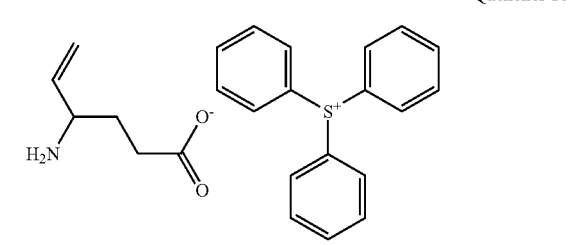
Quencher 22
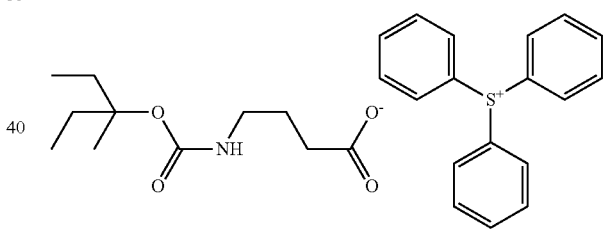
Quencher 17
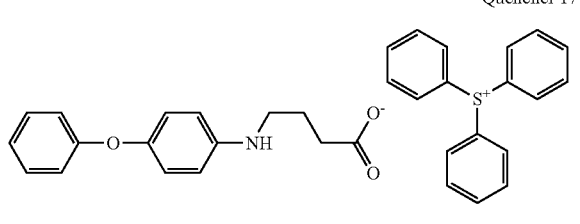
Quencher 23
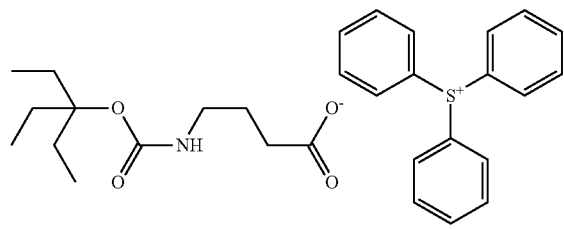
Quencher 18
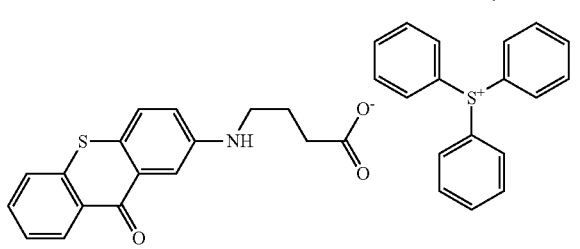
Quencher 24
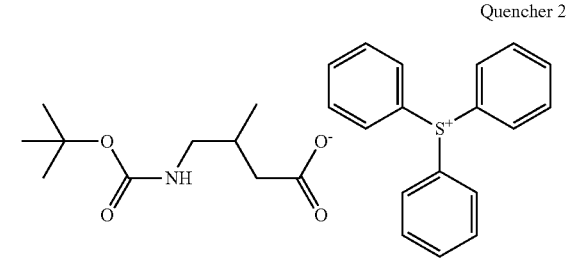

Quencher 25
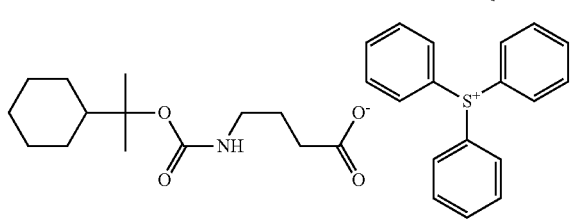
Quencher 31
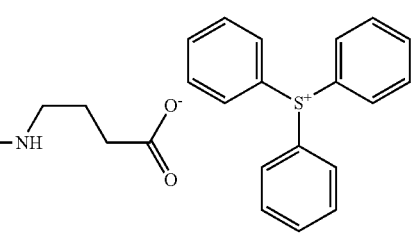
Quencher 26
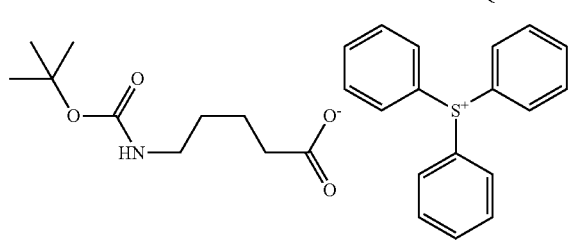
Quencher 32
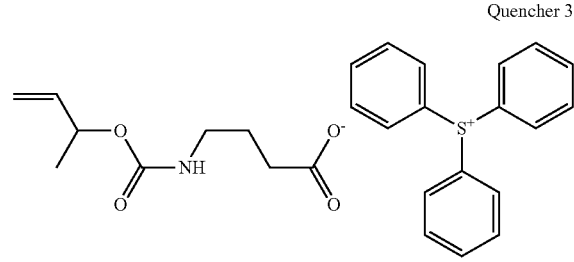
Quencher 27
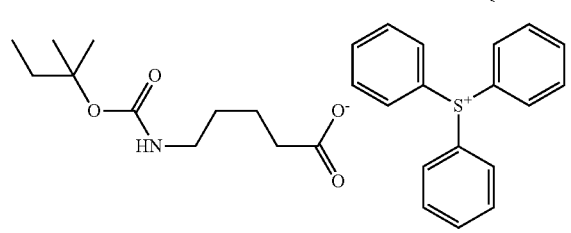
Quencher 33
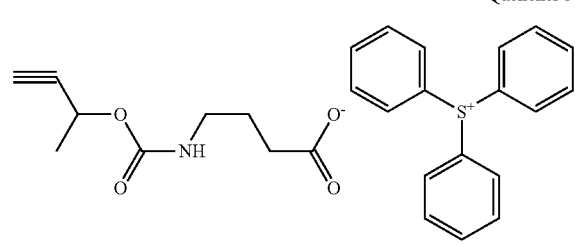
Quencher 28
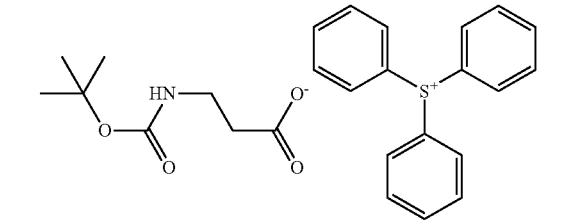
Quencher 34
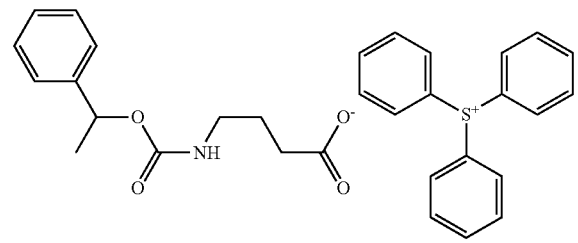
Quencher 29
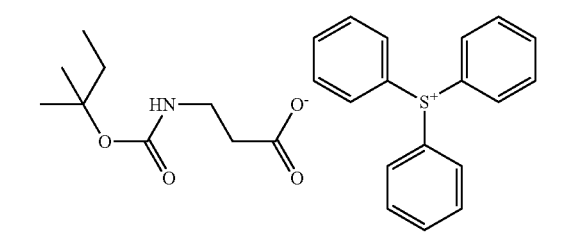
Quencher 35
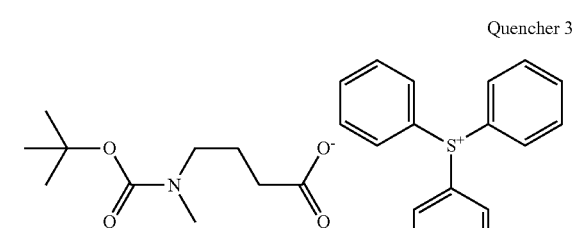
Quencher 30
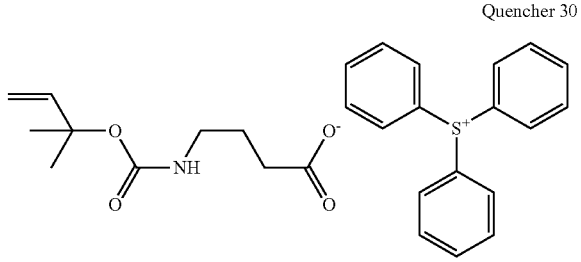
Quencher 36
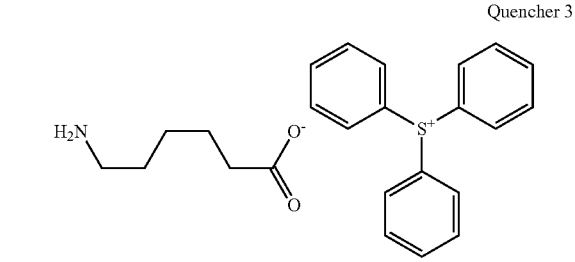

Quencher 37
Quencher 38
Quencher 39
Quencher 40
Quencher 41
Quencher 42
Quencher 43
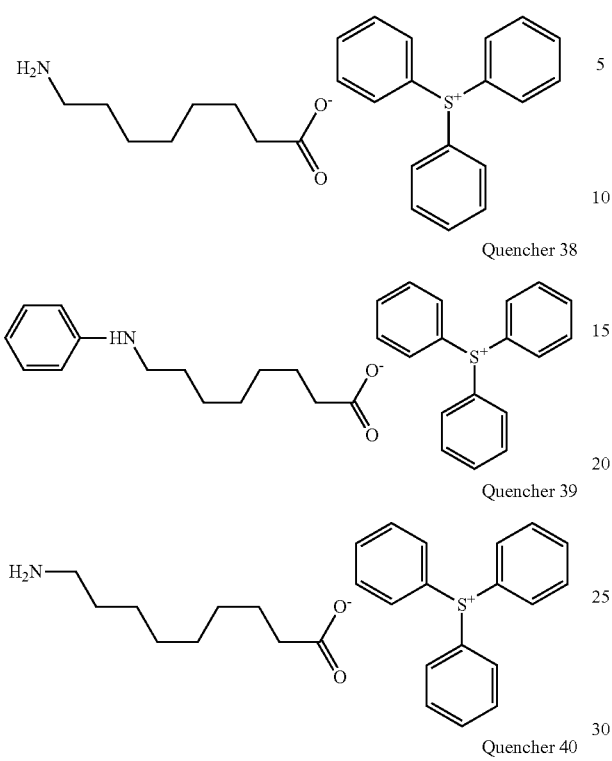
Quencher 44
Quencher 45
Quencher 46
Quencher 47
Quencher 48
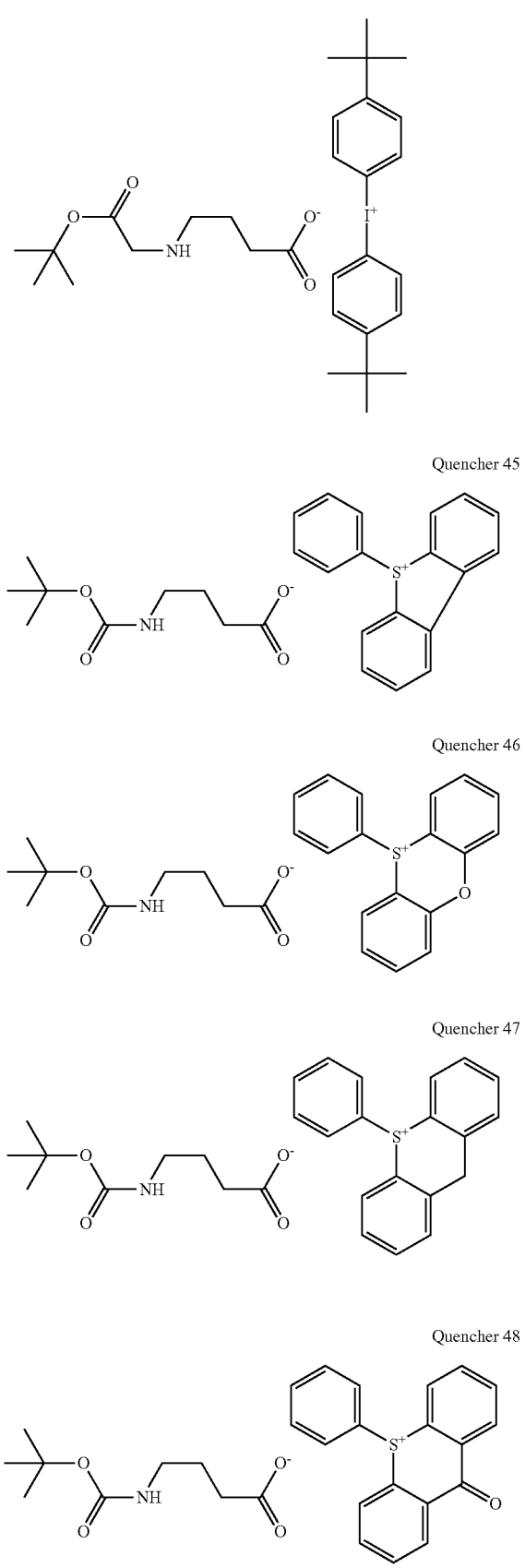

Quencher 49

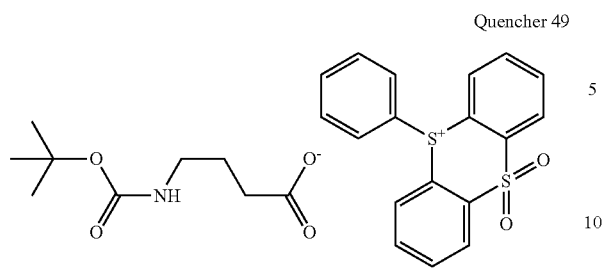

Quencher 50

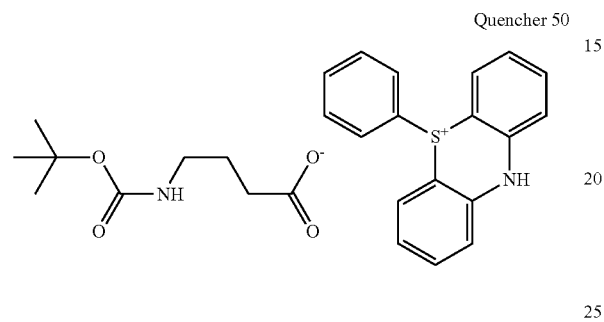

SYNTHESIS EXAMPLE

Synthesis of Polymers 1 to 13

Polymers to be added to resist compositions were prepared by combining suitable monomers, effecting copolymerization reaction thereof in tetrahydrofuran solvent, pouring the reaction solution into methanol for crystallization, repeatedly washing with hexane, isolation, and drying. The resulting polymers, designated Polymers 1 to 13, were analyzed for composition by $^1$H-NMR, and for Mw and Mw/Mn by GPC.

Polymer 1

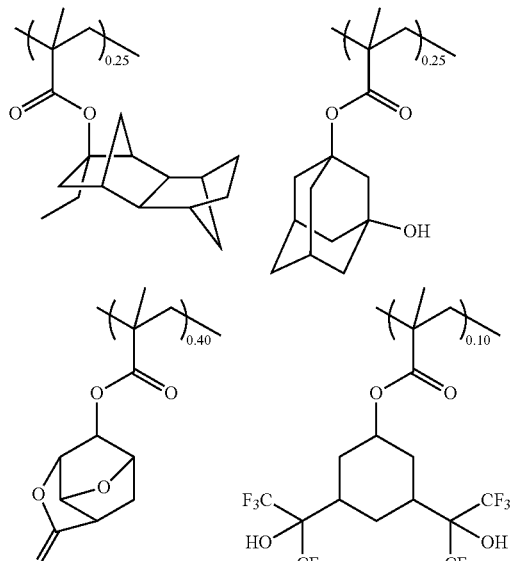

Mw = 8,500
Mw/Mn = 1.78

Polymer 2

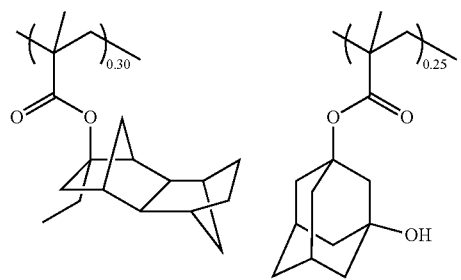

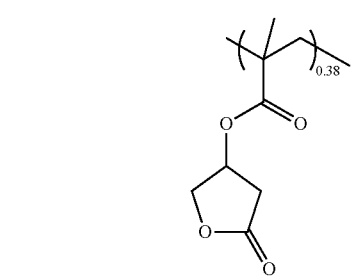

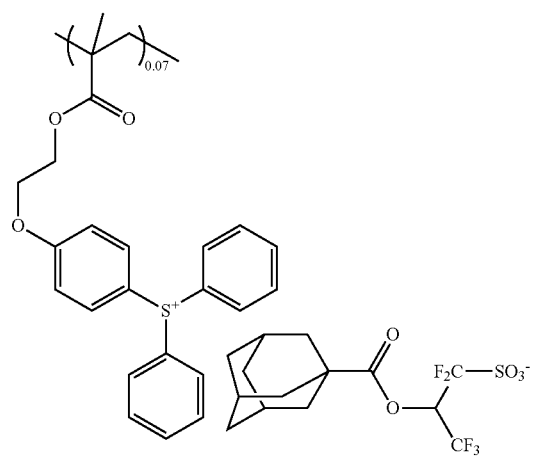

Mw = 8,700
Mw/Mn = 1.89

Polymer 3

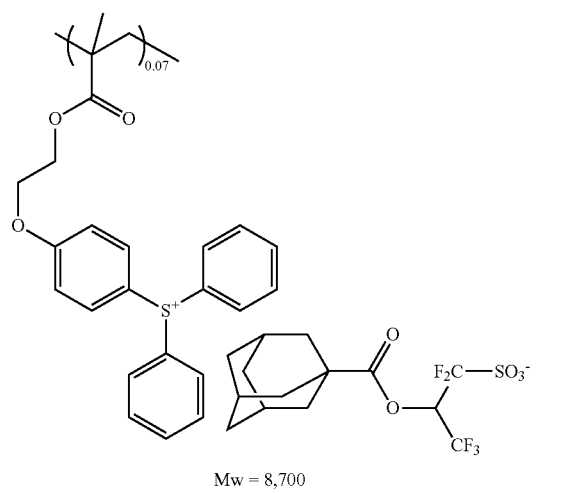

-continued
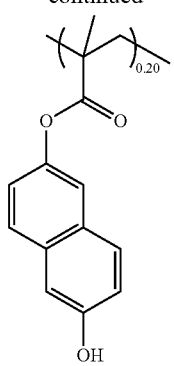
Mw = 7,600
Mw/Mn = 1.69
-continued
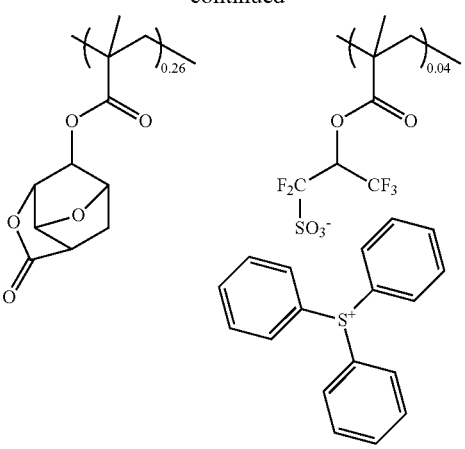
Mw = 7,800
Mw/Mn = 1.98
Polymer 4
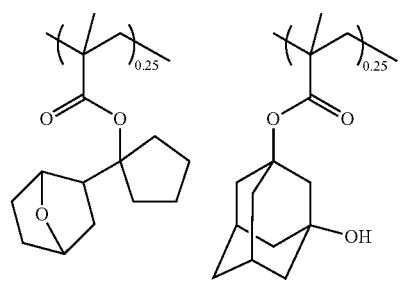
Polymer 6
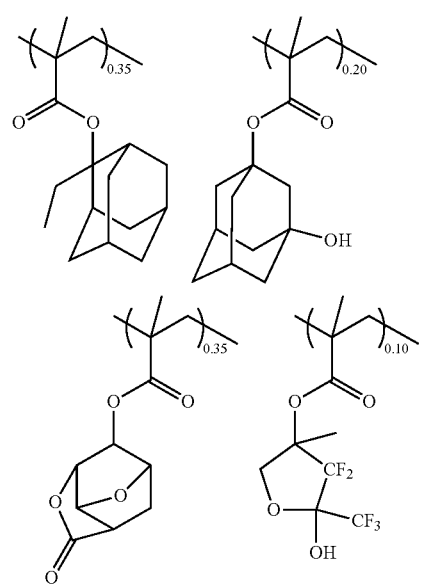
Mw = 8,500
Mw/Mn = 1.78
Polymer 7
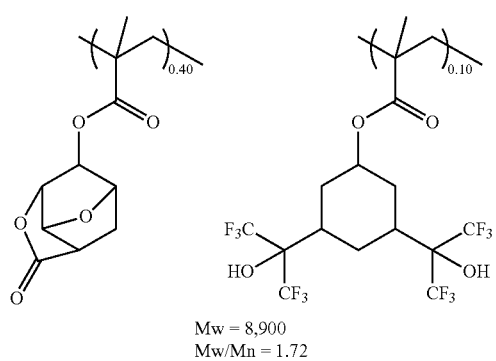
Mw = 8,900
Mw/Mn = 1.72
Polymer 5
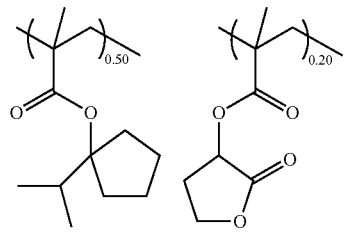
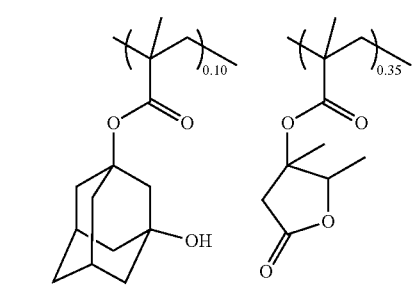

-continued
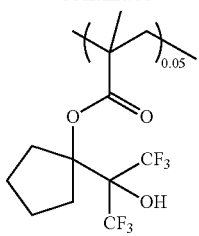
Mw = 7,900
Mw/Mn = 1.69
Polymer 8
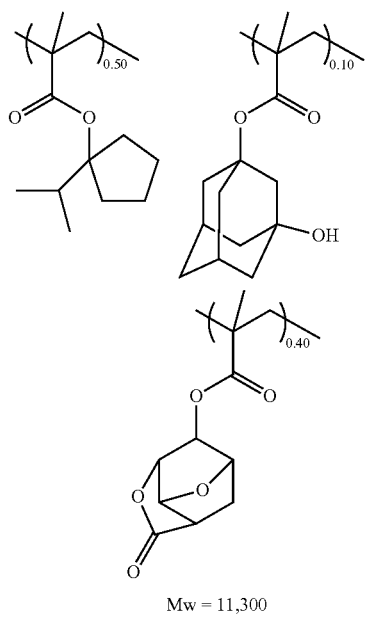
Mw = 11,300
Mw/Mn = 1.89
Polymer 9
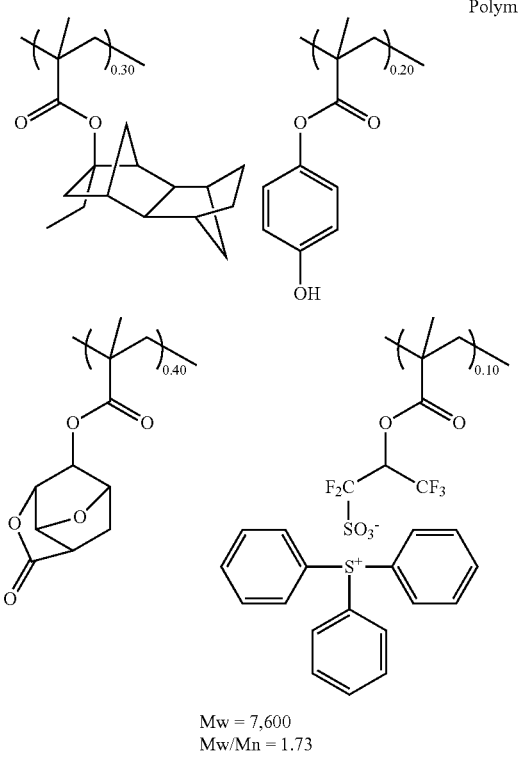
Mw = 7,600
Mw/Mn = 1.73
-continued
Polymer 10
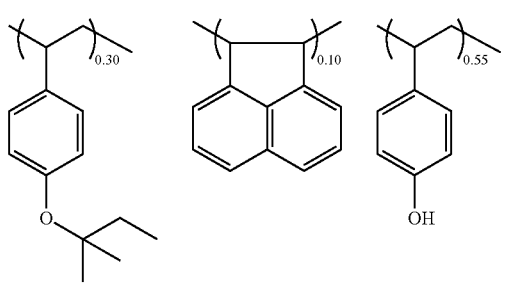
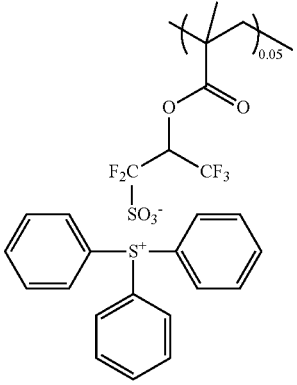
Mw = 5,500
Mw/Mn = 1.76
Polymer 11
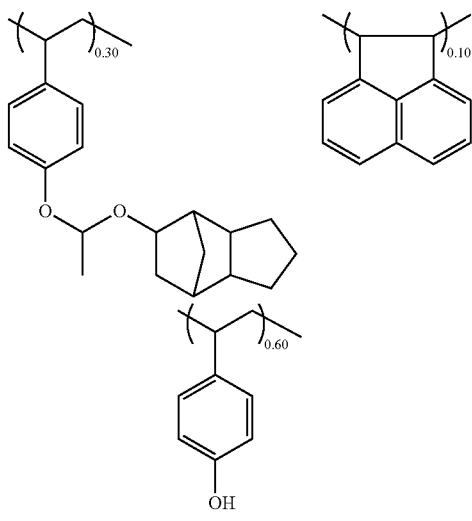
Mw = 5,100
Mw/Mn = 1.46
Polymer 12

-continued

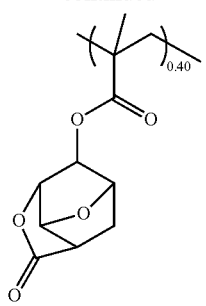

Mw = 7,900
Mw/Mn = 1.79

Polymer 13

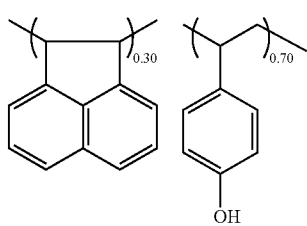

Mw = 4,500
Mw/Mn = 1.61

EXAMPLES AND COMPARATIVE EXAMPLES

Positive or negative resist compositions were prepared by dissolving each of the polymers synthesized above and selected components in a solvent in accordance with the recipe shown in Tables 1 to 5, and filtering through a filter having a pore size of 0.2 μm. The solvent contained 100 ppm of a surfactant FC-4430 (3M-Sumitomo Co., Ltd.).

The components in Tables 1 to 5 are as identified below.

Polymers: Polymers 1 to 13 as identified above

Organic Solvents:
 PGMEA: propylene glycol monomethyl ether acetate
 PGME: propylene glycol monomethyl ether
 PGEE: propylene glycol monoethyl ether
 CyH: cyclohexanone
 CyP: cyclopentanone Acid Generators:
 PAG1 to PAG5 of the following structural formulae

PAG 1

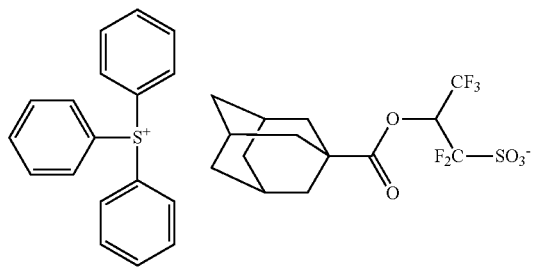

-continued

PAG 2

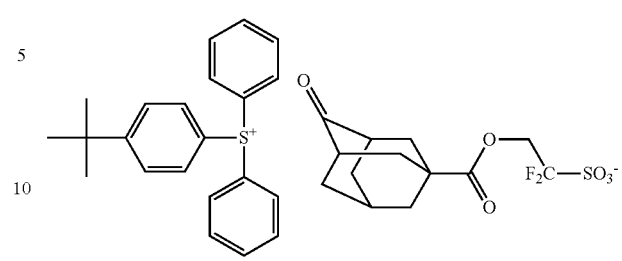

PAG 3

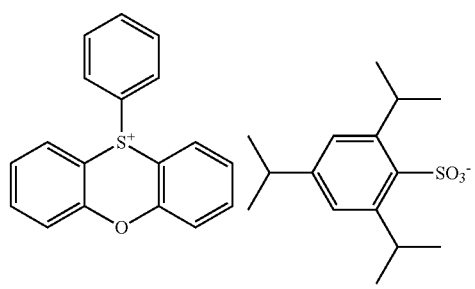

PAG 4

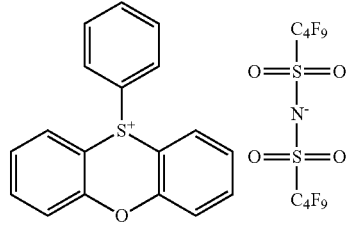

PAG 5

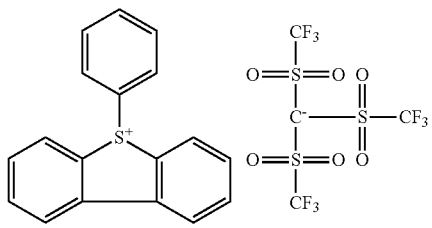

Quencher/Carboxylic Acid-Generating Acid Generator:
 Quenchers 1 to 50 of the above structural formulae Comparative Amines:
 Comparative Amines 1 to 6 of the structural formulae below Comparative Acid-Generating Quenchers:
 Comparative acid-generating quenchers 1 to 3 of the structural formulae below

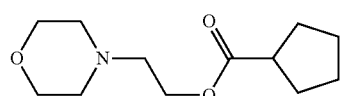

Comparative Amine 1

-continued

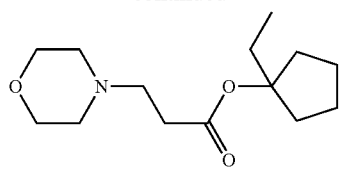

Comparative Amine 2

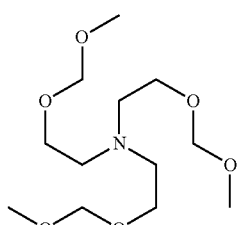

Comparative Amine 3

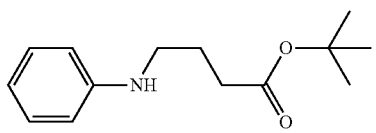

Comparative Amine 4

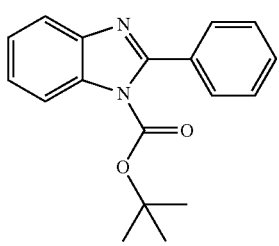

Comparative Amine 5

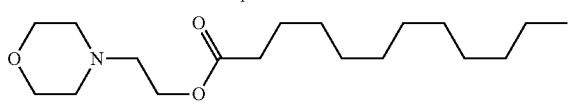

Comparative Amine 6

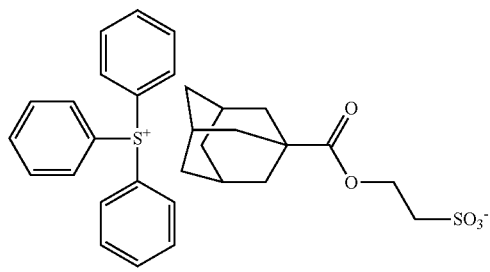

Comparative acid-generating quencher 1

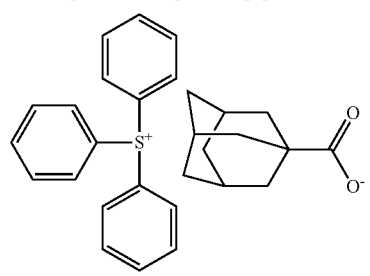

Comparative acid-generating quencher 2

-continued

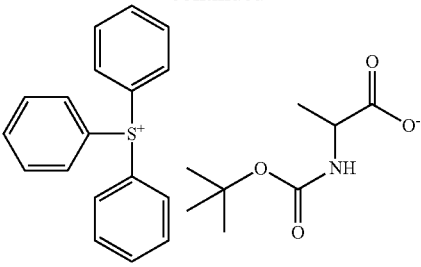

Comparative acid-generating quencher 3

Water-repellent polymer 1:

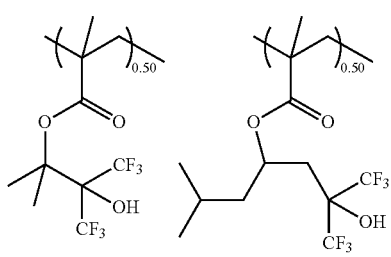

Water-repellent polymer 1
Mw = 8,900
Mw/Mn = 1.96

Crosslinker 1:

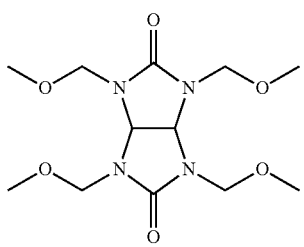

Crosslinker 1

ArF Immersion Lithography Patterning Test 1

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, each of the resist compositions in Tables 1 and 2 was spin coated, then baked on a hot plate at 100° C. for 60 seconds to form a resist film of 80 nm thick.

Using an ArF excimer laser immersion lithography scanner NSR-S610C (Nikon Corp., NA 1.30, σ 0.98/0.78, 35° cross-pole illumination, azimuthally polarized illumination), the resist film was exposed through a 6% halftone phase shift mask bearing a pattern having a space of 70 nm and a pitch of 200 nm (on-wafer size) while varying the exposure dose and focus. The resist film was baked (PEB) at the temperature shown in Tables 1 and 2 for 60 seconds and then developed for 30 seconds with a 2.38 wt % TMAH aqueous solution, yielding a trench pattern having a space of 60 nm and a pitch of 200 nm.

Pattern size was measured by SEM CG-4000. As exposure was done in a varying dose, a sensitivity was determined as the exposure dose which produced a trench size of 60 nm. As exposure was done at a varying focus, a focus margin was determined as a depth of focus (DOF) where the trench size fell in the range of 55 to 65 nm.

The results are shown in Tables 1 and 2.

TABLE 1

| | | Polymer (pbw) | Acid generator (pbw) | Quencher (pbw) | Water-repellent polymer (pbw) | Organic solvent (pbw) | PEB temp. (° C.) | Sensitivity (mJ/cm$^2$) | DOF (nm) |
|---|---|---|---|---|---|---|---|---|---|
| Example | 1-1 | Polymer 1 (100) | PAG1 (8.0) | Quencher 1 (4.50) | Water-repellent polymer 1 (4.0) | PGMEA (2,000) CyH (500) | 100 | 30 | 165 |
| | 1-2 | Polymer 1 (100) | PAG1 (8.0) | Quencher 2 (4.50) | Water-repellent polymer 1 (4.0) | PGMEA (2,000) CyH (500) | 100 | 35 | 150 |
| | 1-3 | Polymer 1 (100) | PAG1 (8.0) | Quencher 3 (4.50) | Water-repellent polymer 1 (4.0) | PGMEA (2,000) PGEE (500) | 100 | 37 | 155 |
| | 1-4 | Polymer 1 (100) | PAG1 (8.0) | Quencher 4 (4.50) | Water-repellent polymer 1 (4.0) | PGMEA (2,000) CyH (500) | 100 | 38 | 145 |
| | 1-5 | Polymer 1 (100) | PAG1 (8.0) | Quencher 5 (4.50) | Water-repellent polymer 1 (4.0) | PGMEA (2,000) PGEE (500) | 100 | 30 | 155 |
| | 1-6 | Polymer 1 (100) | PAG1 (8.0) | Quencher 6 (4.50) | Water-repellent polymer 1 (4.0) | PGMEA (2,000) CyH (500) | 100 | 35 | 155 |
| | 1-7 | Polymer 1 (100) | PAG1 (8.0) | Quencher 7 (4.50) | Water-repellent polymer 1 (4.0) | PGMEA (2,000) CyH (500) | 100 | 32 | 155 |
| | 1-8 | Polymer 1 (100) | PAG1 (8.0) | Quencher 8 (4.50) | Water-repellent polymer 1 (4.0) | PGMEA (2,000) CyH (500) | 100 | 30 | 155 |
| | 1-9 | Polymer 1 (100) | PAG1 (8.0) | Quencher 9 (4.50) | Water-repellent polymer 1 (4.0) | PGMEA (2,000) CyH (500) | 100 | 30 | 155 |
| | 1-10 | Polymer 1 (100) | PAG1 (8.0) | Quencher 10 (4.50) | Water-repellent polymer 1 (4.0) | PGMEA (2,000) CyH (500) | 100 | 32 | 155 |
| | 1-11 | Polymer 1 (100) | PAG1 (8.0) | Quencher 11 (4.50) | Water-repellent polymer 1 (4.0) | PGMEA (2,000) CyH (500) | 100 | 35 | 155 |
| | 1-12 | Polymer 1 (100) | PAG1 (8.0) | Quencher 12 (4.50) | Water-repellent polymer 1 (4.0) | PGMEA (2,000) CyH (500) | 100 | 32 | 155 |
| | 1-13 | Polymer 1 (100) | PAG1 (8.0) | Quencher 13 (4.50) | Water-repellent polymer 1 (4.0) | PGMEA (2,000) CyH (500) | 100 | 28 | 155 |
| | 1-14 | Polymer 1 (100) | PAG1 (8.0) | Quencher 14 (4.50) | Water-repellent polymer 1 (4.0) | PGMEA (2,000) CyH (500) | 100 | 30 | 156 |
| | 1-15 | Polymer 1 (100) | PAG1 (8.0) | Quencher 15 (4.50) | Water-repellent polymer 1 (4.0) | PGMEA (2,000) CyH (500) | 100 | 34 | 155 |
| | 1-16 | Polymer 1 (100) | PAG1 (8.0) | Quencher 16 (4.50) | Water-repellent polymer 1 (4.0) | PGMEA (2,000) CyH (500) | 100 | 35 | 155 |
| | 1-17 | Polymer 1 (100) | PAG1 (8.0) | Quencher 17 (4.50) | Water-repellent polymer 1 (4.0) | PGMEA (2,000) CyH (500) | 100 | 32 | 155 |
| | 1-18 | Polymer 1 (100) | PAG1 (8.0) | Quencher 18 (4.50) | Water-repellent polymer 1 (4.0) | PGMEA (2,000) CyH (500) | 100 | 34 | 155 |
| | 1-19 | Polymer 1 (100) | PAG1 (8.0) | Quencher 19 (4.50) | Water-repellent polymer 1 (4.0) | PGMEA (2,000) PGEE (500) | 100 | 31 | 155 |
| | 1-20 | Polymer 1 (100) | PAG1 (8.0) | Quencher 20 (4.50) | Water-repellent polymer 1 (4.0) | PGMEA (2,000) PGEE (500) | 100 | 28 | 155 |

TABLE 2

| | | Polymer (pbw) | Acid generator (pbw) | Base (pbw) | Water-repellent polymer (pbw) | Organic solvent (pbw) | PEB temp. (° C.) | Sensitivity (mJ/cm$^2$) | DOF (nm) |
|---|---|---|---|---|---|---|---|---|---|
| Example | 1-21 | Polymer 2 (100) | — | Quencher 21 (4.50) | Water-repellent polymer 1 (4.0) | PGMEA (2,000) CyH (500) | 95 | 40 | 160 |
| | 1-22 | Polymer 3 (100) | PAG1 (8.0) | Quencher 22 (4.50) | Water-repellent polymer 1 (4.0) | PGMEA (2,000) CyH (500) | 95 | 42 | 160 |

TABLE 2-continued

|  |  | Polymer (pbw) | Acid generator (pbw) | Base (pbw) | Water-repellent polymer (pbw) | Organic solvent (pbw) | PEB temp. (° C.) | Sensitivity (mJ/cm$^2$) | DOF (nm) |
|---|---|---|---|---|---|---|---|---|---|
|  | 1-23 | Polymer 4 (100) | PAG1 (8.0) | Quencher 23 (4.50) | Water-repellent polymer 1 (4.0) | PGMEA (2,000) CyH (500) | 100 | 33 | 150 |
|  | 1-24 | Polymer 5 (100) | — | Quencher 24 (4.50) | Water-repellent polymer 1 (4.0) | PGMEA (2,000) CyH (500) | 90 | 39 | 165 |
|  | 1-25 | Polymer 6 (100) | PAG2 (8.0) | Quencher 25 (4.50) | Water-repellent polymer 1 (4.0) | CyP (1,500) CyH (1,500) | 105 | 50 | 155 |
|  | 1-26 | Polymer 7 (100) | — | Quencher 26 (4.50) | Water-repellent polymer 1 (4.0) | PGMEA (2,000) CyH (500) | 90 | 51 | 160 |
|  | 1-27 | Polymer 8 (100) | PAG2 (8.0) | Quencher 27 (4.50) | Water-repellent polymer 1 (4.0) | PGMEA (2,000) CyH (500) | 100 | 43 | 160 |
|  | 1-28 | Polymer 7 (100) | — | Quencher 28 (4.50) Comparative acid-generating quencher 2 (5.0) | Water-repellent polymer 1 (4.0) | PGMEA (2,000) CyH (500) | 100 | 46 | 150 |
|  | 1-29 | Polymer 7 (100) | — | Quencher 29 (4.50) Comparative Amine 4 (1.56) | Water-repellent polymer 1 (4.0) | PGMEA (2,000) CyH (500) | 100 | 45 | 150 |
|  | 1-30 | Polymer 7 (100) | — | Quencher 30 (4.50) Comparative Amine 5 (1.56) | Water-repellent polymer 1 (4.0) | PGMEA (2,000) CyH (500) | 100 | 34 | 145 |
| Comparative Example | 1-1 | Polymer 1 (100) | PAG1 (8.0) | Comparative Amine 1 (2.27) | Water-repellent polymer 1 (4.0) | PGMEA (2,000) CyH (500) | 100 | 41 | 100 |
|  | 1-2 | Polymer 1 (100) | PAG1 (8.0) | Comparative Amine 2 (2.55) | Water-repellent polymer 1 (4.0) | PGMEA (2,000) CyH (500) | 100 | 48 | 105 |
|  | 1-3 | Polymer 1 (100) | PAG1 (8.0) | Comparative Amine 3 (2.81) | Water-repellent polymer 1 (4.0) | PGMEA (2,000) CyH (500) | 100 | 55 | 100 |
|  | 1-4 | Polymer 1 (100) | PAG1 (8.0) | Comparative Amine 4 (2.94) | Water-repellent polymer 1 (4.0) | PGMEA (2,000) CyH (500) | 100 | 45 | 130 |
|  | 1-5 | Polymer 1 (100) | PAG1 (8.0) | Comparative Amine 5 (3.13) | Water-repellent polymer 1 (4.0) | PGMEA (2,000) CyH (500) | 100 | 55 | 95 |
|  | 1-6 | Polymer 1 (100) | PAG1 (8.0) | Comparative Amine 6 (3.13) | Water-repellent polymer 1 (4.0) | PGMEA (2,000) CyH (500) | 100 | 56 | 90 |
|  | 1-7 | Polymer 1 (100) | PAG1 (8.0) | Comparative acid-generating quencher 1 (3.13) | Water-repellent polymer 1 (4.0) | PGMEA (2,000) CyH (500) | 100 | 45 | 90 |
|  | 1-8 | Polymer 1 (100) | PAG1 (8.0) | Comparative acid-generating quencher 1 (3.13) | Water-repellent polymer 1 (4.0) | PGMEA (2,000) CyH (500) | 100 | 44 | 90 |

ArF Immersion Lithography Patterning Test 2

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, each of the resist compositions shown in Table 3 was spin coated, then baked on a hot plate at 100° C. for 60 seconds to form a resist film of 80 nm thick.

Using an ArF excimer laser immersion lithography scanner NSR-610C (Nikon Corp., NA 1.30, a 0.98/0.78, cross-pole opening 20 deg., azimuthally polarized illumination), exposure was performed in a varying dose through a 6% halftone phase shift mask bearing a line-and-space pattern with a pitch of 100 nm and a width of 50 nm (on-wafer size). After the exposure, the wafer was baked (PEB) at the temperature shown in Table 3 for 60 seconds and developed. Specifically, butyl acetate was injected from a development nozzle while the wafer was spun at 30 rpm for 3 seconds, which was followed by stationary puddle development for 27 seconds. The wafer was rinsed with 4-methyl-2-pentanol, spin dried, and baked at 100° C. for 20 seconds to evaporate off the rinse liquid, yielding a negative pattern.

A trench pattern resulted from image reversal by solvent development. The size of trenches was measured under TDSEM CG-4000. A focus margin (DOF) and dose (or sensitivity) were determined from those spaces having a size of 50±5 nm. The results are shown in Table 3.

TABLE 3

|  |  | Polymer (pbw) | Acid generator (pbw) | Base (pbw) | Water-repellent polymer (pbw) | Organic solvent (pbw) | PEB temp. (°C.) | Sensitivity (mJ/cm$^2$) | DOF (nm) |
|---|---|---|---|---|---|---|---|---|---|
| Example | 2-1 | Polymer 8 (100) | PAG1 (7.0) | Quencher 30 (4.50) | Water-repellent polymer 1 (4.0) | PGMEA (2,000) CyH (500) | 90 | 45 | 155 |
|  | 2-2 | Polymer 8 (100) | PAG1 (7.0) | Quencher 31 (4.50) | Water-repellent polymer 1 (4.0) | PGMEA (2,000) CyH (500) | 90 | 42 | 155 |
|  | 2-3 | Polymer 8 (100) | PAG1 (7.0) | Quencher 32 (4.50) | Water-repellent polymer 1 (4.0) | PGMEA (2,000) CyH (500) | 90 | 44 | 135 |
|  | 2-4 | Polymer 8 (100) | PAG2 (7.0) | Quencher 33 (4.50) | Water-repellent polymer 1 (4.0) | PGMEA (2,000) CyH (500) | 90 | 49 | 160 |
|  | 2-5 | Polymer 8 (100) | PAG2 (7.0) | Quencher 34 (4.50) | Water-repellent polymer 1 (4.0) | PGMEA (2,000) CyH (500) | 90 | 52 | 145 |
| Comparative Example | 2-1 | Polymer 8 (100) | PAG1 (7.0) | Comparative Amine 1 (2.27) | Water-repellent polymer 1 (4.0) | PGMEA (2,000) CyH (500) | 90 | 48 | 100 |

EB Writing Test

Each of the resist compositions in Tables 4 and 5 was spin coated onto a silicon substrate, which had been vapor primed with hexamethyldisilazane (HMDS), and pre-baked on a hot plate at 110° C. for 60 seconds to form a resist film of 80 nm thick. Using a system HL-800D (Hitachi Ltd.) at a HV voltage of 50 keV, the resist film was exposed imagewise to EB in a vacuum chamber.

Immediately after the image writing, the resist film was baked (PEB) on a hot plate at 90° C. for 60 seconds and developed in a 2.38 wt % TMAH aqueous solution for 30 seconds to form a pattern.

In the case of positive resist film, the resolution is a minimum trench size at the exposure dose that provides a resolution as designed of a 120-nm trench pattern. In the case of negative resist film, the resolution is a minimum isolated line size at the exposure dose that provides a resolution as designed of a 120-nm isolated line pattern. It is noted that Examples 3-1 to 3-17 and Comparative Examples 3-1 to 3-3 are positive resist compositions, and Examples 3-18, 3-19 and Comparative Example 3-4 are negative resist compositions.

The results are shown in Tables 4 and 5.

TABLE 4

|  |  | Polymer (pbw) | Acid generator/ crosslinker (pbw) | Base (pbw) | Organic solvent (pbw) | Sensitivity (µC/cm$^2$) | Resolution (nm) |
|---|---|---|---|---|---|---|---|
| Example | 3-1 | Polymer 9 (100) | — | Quencher 34 (2.50) | PGMEA (400) CyH (2,000) PGME (100) | 28 | 80 |
|  | 3-2 | Polymer 9 (100) | — | Quencher 35 (2.50) | PGMEA (400) CyH (2,000) PGME (100) | 30 | 80 |
|  | 3-3 | Polymer 9 (100) | — | Quencher 36 (2.50) | PGMEA (400) CyH (2,000) PGME (100) | 30 | 80 |
|  | 3-4 | Polymer 9 (100) | — | Quencher 37 (2.50) | PGMEA (400) CyH (2,000) PGME (100) | 28 | 85 |
|  | 3-5 | Polymer 9 (100) | — | Quencher 38 (2.50) | PGMEA (400) CyH (2,000) PGME (100) | 27 | 80 |
|  | 3-6 | Polymer 9 (100) | — | Quencher 39 (2.50) | PGMEA (400) CyH (2,000) PGME (100) | 29 | 80 |
|  | 3-7 | Polymer 9 (100) | — | Quencher 40 (2.50) | PGMEA (400) CyH (2,000) PGME (100) | 30 | 80 |
|  | 3-8 | Polymer 9 (100) | — | Quencher 41 (2.50) | PGMEA (400) CyH (2,000) PGME (100) | 33 | 75 |
|  | 3-9 | Polymer 9 (100) | — | Quencher 42 (2.50) | PGMEA (400) CyH (2,000) PGME (100) | 27 | 75 |
|  | 3-10 | Polymer 9 (100) | — | Quencher 43 (2.50) | PGMEA (400) CyH (2,000) PGME (100) | 26 | 80 |

TABLE 4-continued

| | | Polymer (pbw) | Acid generator/ crosslinker (pbw) | Base (pbw) | Organic solvent (pbw) | Sensitivity (μC/cm$^2$) | Resolution (nm) |
|---|---|---|---|---|---|---|---|
| | 3-11 | Polymer 10 (100) | — | Quencher 44 (2.50) | PGMEA (400) CyH (1,600) CyP (500) | 32 | 80 |
| | 3-12 | Polymer 10 (100) | — | Quencher 45 (2.50) | PGMEA (400) CyH (1,600) CyP (500) | 32 | 80 |
| | 3-13 | Polymer 10 (100) | — | Quencher 46 (2.50) | PGMEA (400) CyH (1,600) CyP (500) | 32 | 80 |
| | 3-14 | Polymer 10 (100) | — | Quencher 47 (2.50) | PGMEA (400) CyH (1,600) CyP (500) | 32 | 80 |
| | 3-15 | Polymer 10 (100) | — | Quencher 48 (2.50) | PGMEA (400) CyH (1,600) CyP (500) | 32 | 80 |
| | 3-16 | Polymer 10 (100) | — | Quencher 49 (2.50) | PGMEA (400) CyH (1,600) CyP (500) | 32 | 80 |
| | 3-17 | Polymer 11 (100) | PAG3 (15) | Quencher 49 (2.50) | PGMEA (400) CyH (1,600) CyP (500) | 36 | 85 |
| | 3-18 | Polymer 13 (100) | PAG4 (10.0) Crosslinker 1 (8.0) | Quencher 50 (2.50) | PGMEA (2,000) CyH (500) | 38 | 75 |
| | 3-19 | Polymer 13 (100) | PAG5 (10.0) Crosslinker 1 (8.0) | Quencher 50 (2.50) | PGMEA (2,000) CyH (500) | 32 | 75 |

TABLE 5

| | | Polymer (pbw) | Acid generator/ crosslinker (pbw) | Base (pbw) | Organic solvent (pbw) | Sensitivity (μC/cm$^2$) | Resolution (nm) |
|---|---|---|---|---|---|---|---|
| Comparative Example | 3-1 | Polymer 9 (100) | — | Comparative acid-generating quencher 1 (2.50) | PGMEA (400) CyH (2,000) PGME (100) | 38 | 90 |
| | 3-2 | Polymer 9 (100) | — | Comparative acid-generating quencher 2 (2.50) | PGMEA (400) CyH (2,000) PGME (100) | 38 | 90 |
| | 3-3 | Polymer 9 (100) | — | Comparative acid-generating quencher 3 (2.50) | PGMEA (400) CyH (2,000) PGME (100) | 38 | 90 |
| | 3-4 | Polymer 13 (100) | PAG1 (10.0) Crosslinker 1 (8.0) | Comparative Amine 1 (0.68) | PGMEA (2,000) CyH (500) | 37 | 100 |

It is demonstrated in Tables 1 to 5 that resist compositions comprising a specific amine compound form patterns of satisfactory profile having an improved resolution and focus margin (DOE).

Japanese Patent Application No. 2013-229075 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:
1. A resist composition comprising:
a base polymer comprising recurring units (a1) derived from (meth)acrylate, styrenecarboxylic acid or vinyl-naphthalenecarboxylic acid having an acid labile group substituted thereon, or recurring units (a2) derived from hydroxystyrene having an acid labile group substituted thereon, as represented by the general formula (2):

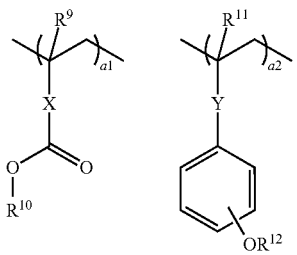

wherein $R^9$ and $R^{11}$ are each independently hydrogen or methyl, X is a single bond, a $C_1$-$C_{12}$ linking group having an ester moiety or lactone ring, phenylene group or naphthylene group, Y is a single bond or ester group, and $R^{10}$ and $R^{12}$ are each independently an acid labile group, and a sulfonium salt having the general formula (1)-1 or a iodonium salt having the general formula (1)-2,

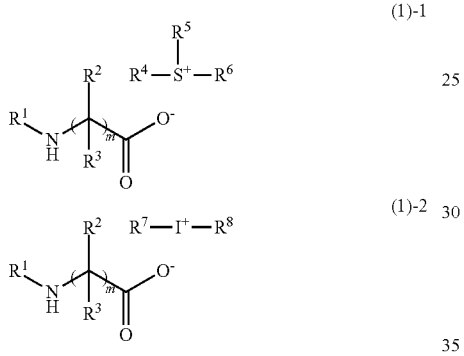

wherein $R^1$ is hydrogen, or a straight, branched or cyclic $C_1$-$C_{30}$ alkyl, $C_6$-$C_{30}$ aryl, $C_7$-$C_{30}$ aralkyl, $C_2$-$C_{30}$ alkenyl, $C_2$-$C_{10}$ alkenyl, or $C_4$-$C_{12}$ heterocyclic-bearing group, or a combination of such groups, which group may contain a hydroxyl, mercapto, carboxyl, ether, thio ether, ester, sulfonic acid ester, sulfonyl, lactone ring, carbonyl, cyano, nitro, halogen, trifluoromethyl, amide, imide, sulfonamide, carbonate, sulfide, —N=CR—O—, —N=CR—S—, or =N—O—N=moiety, or $R^1$ may be an acid labile group; R is hydrogen, mercapto, hydroxyl or $C_1$-$C_3$ alkyl, or may bond with the nitrogen atom in formula (1) to form a ring; $R^2$ and $R^3$ each are hydrogen, a straight or branched $C_1$-$C_4$ alkyl group or $C_2$-$C_4$ alkenyl group, or $R^2$ and $R^3$ may bond together to form a ring with the carbon atom to which they are attached; $R^4$, $R^5$ and $R^6$ are each independently a straight, branched or cyclic $C_1$-$C_{12}$ alkyl, alkenyl, oxoalkyl or oxoalkenyl group, $C_6$-$C_{20}$ aryl, $C_7$-$C_{12}$ aralkyl or aryloxoalkyl group, in which at least one hydrogen atom may be substituted by an ether, ester, carbonyl, carbonate, hydroxyl, carboxyl, halogen, cyano, amide, nitro, sultone, sulfonic acid ester, sulfone moiety, or sulfonium salt-containing substituent, $R^4$ and $R^5$ may bond together to form a ring with the sulfur atom to which they are attached; $R^7$ and $R^8$ each are a $C_6$-$C_{20}$ aryl group which may contain a straight, branched or cyclic $C_1$-$C_{10}$ alkyl or alkoxy moiety, and m is an integer of 2 to 8.

2. The resist composition of claim 1, further comprising an acid generator capable of generating a sulfonic acid, imidic acid or methidic acid.

3. The resist composition of claim 1, further comprising an organic solvent, the resist composition being a chemically amplified positive resist composition.

4. The resist composition of claim 3, further comprising a dissolution inhibitor.

5. The resist composition of claim 1, further comprising a surfactant.

6. A process for forming a pattern comprising the steps of applying the resist composition of claim 1 onto a substrate, baking to form a resist film, exposing the resist film to high-energy radiation, and developing the exposed film with a developer.

7. A resist composition comprising a base polymer and a sulfonium salt having the general formula (1)-1 or a iodonium salt having the general formula (1)-2, and an organic solvent, the composition being a chemically amplified negative resist composition,

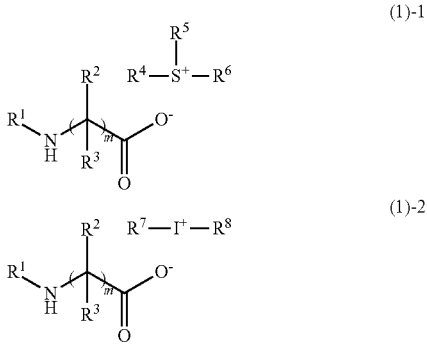

wherein $R^1$ is hydrogen, or a straight, branched or cyclic $C_1$-$C_{30}$ alkyl, $C_6$-$C_{30}$ aryl, $C_7$-$C_{30}$ aralkyl, $C_2$-$C_{30}$ alkenyl, $C_2$-$C_{10}$ alkenyl, or $C_4$-$C_{12}$ heterocyclic-bearing group, or a combination of such groups, which group may contain a hydroxyl, mercapto, carboxyl, ether, thio ether, ester, sulfonic acid ester, sulfonyl, lactone ring, carbonyl, cyano, nitro, halogen, trifluoromethyl, amide, imide, sulfonamide, carbonate, sulfide, —N=CR—O—, —N=CR—S—, or =N—O—N=moiety, or $R^1$ may be an acid labile group; R is hydrogen, mercapto, hydroxyl or $C_1$-$C_3$ alkyl, or may bond with the nitrogen atom in formula (1) to form a ring; $R^2$ and $R^3$ each are hydrogen, a straight or branched $C_1$-$C_4$ alkyl group or $C_2$-$C_4$ alkenyl group, or $R^2$ and $R^3$ may bond together to form a ring with the carbon atom to which they are attached; $R^4$, $R^5$ and $R^6$ are each independently a straight, branched or cyclic $C_1$-$C_{12}$ alkyl, alkenyl, oxoalkyl or oxoalkenyl group, $C_6$-$C_{20}$ aryl, $C_7$-$C_{12}$ aralkyl or aryloxoalkyl group, in which at least one hydrogen atom may be substituted by an ether, ester, carbonyl, carbonate, hydroxyl, carboxyl, halogen, cyano, amide, nitro, sultone, sulfonic acid ester, sulfone moiety, or sulfonium salt-containing substituent, $R^4$ and $R^5$ may bond together to form a ring with the sulfur atom to which they are attached; $R^7$ and $R^8$ each are a $C_6$-$C_{20}$ aryl group which may contain a straight, branched or cyclic $C_1$-$C_{10}$ alkyl or alkoxy moiety, and m is an integer of 2 to 8.

8. The resist composition of claim 7, further comprising a crosslinker.

9. The resist composition of claim 7, further comprising an acid generator capable of generating a sulfonic acid, imidic acid or methidic acid.

10. The resist composition of claim 7 wherein the base polymer comprises recurring units (a1) derived from (meth) acrylate, styrenecarboxylic acid or vinylnaphthalenecarboxylic acid having an acid labile group substituted thereon, or recurring units (a2) derived from hydroxystyrene having an acid labile group substituted thereon, as represented by the general formula (2):

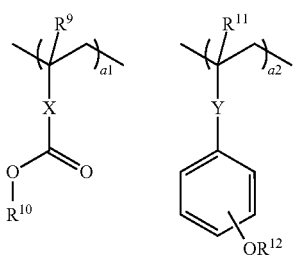

wherein $R^9$ and $R^{11}$ are each independently hydrogen or methyl, X is a single bond, a $C_1$-$C_{12}$ linking group having an ester moiety or lactone ring, phenylene group or naphthylene group, Y is a single bond or ester group, and $R^{10}$ and $R^{12}$ are each independently an acid labile group.

11. The resist composition of claim 7 wherein the base polymer has further copolymerized therein recurring units of at least one type selected from sulfonium salt units (f1) to (f3), as represented by the general formula (3):

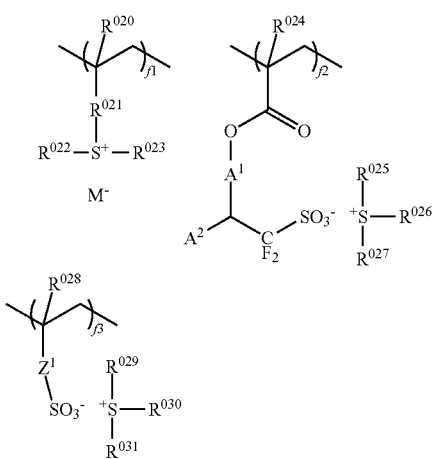

wherein $R^{020}$, $R^{024}$, and $R^{028}$ each are hydrogen or methyl, $R^{021}$ is a single bond, phenylene, —O—$R^{033}$—, or —C(=O)—$Y^1$—$R^{033}$—, $Y^1$ is oxygen or NH, $R^{033}$ is a straight, branched or cyclic $C_1$-$C_6$ alkylene group, alkenylene group or phenylene group, which may contain a carbonyl (—CO—), ester (—COO—), ether (—O—), or hydroxyl moiety, $R^{022}$, $R^{023}$, $R^{025}$, $R^{026}$, $R^{027}$, $R^{029}$, $R^{030}$, and $R^{031}$ are each independently a straight, branched or cyclic $C_1$-$C_{12}$ alkyl group which may contain a carbonyl, ester or ether moiety, a $C_6$-$C_{12}$ aryl group, a $C_7$-$C_{20}$ aralkyl group, or a thiophenyl group, $A^1$ is a single bond, -$A^0$-C(=O)—O—, -$A^0$-O— or -$A^0$-O—C(=O)—, $A^0$ is a straight, branched or cyclic $C_1$-$C_{12}$ alkylene group which may contain a carbonyl, ester or ether moiety, $A^2$ is hydrogen, $CF_3$ or carbonyl group, $Z^1$ is a single bond, methylene, ethylene, phenylene, fluorinated phenylene, —O—$R^{032}$—, or —C(=O)—$Z^2$—$R^{032}$—, $Z^2$ is oxygen or NH, $R^{032}$ is a straight, branched or cyclic $C_1$-$C_6$ alkylene, phenylene, fluorinated phenylene, trifluoromethyl-substituted phenylene or alkenylene group, which may contain a carbonyl, ester, ether or hydroxyl moiety, M$^-$ is a non-nucleophilic counter ion, subscripts f1, f2 and f3 are numbers in the range: $0 \leq f1 \leq 0.5$, $0 \leq f2 \leq 0.5$, $0 \leq f3 \leq 0.5$, and $0 \leq f1+f2+f3 \leq 0.5$.

12. A resist composition comprising:
a base polymer having recurring units of at least one type selected from sulfonium salt units (f1) to (f3), as represented by the general formula (3):

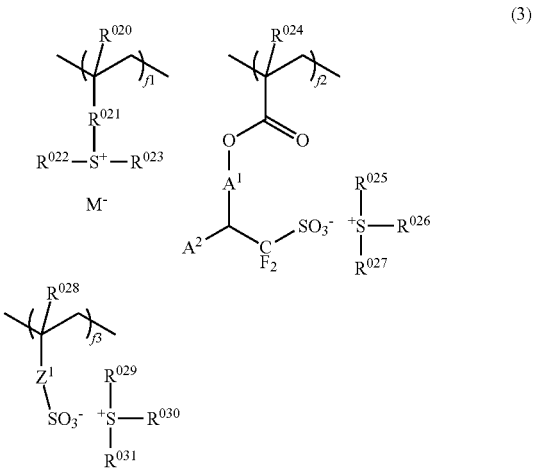

wherein $R^{020}$, $R^{024}$, and $R^{028}$ each are hydrogen or methyl, $R^{021}$ is a single bond, phenylene, —O—$R^{033}$—, or —C(=O)—$Y^1$—$R^{033}$—, $Y^1$ is oxygen or NH, $R^{033}$ is a straight, branched or cyclic $C_1$-$C_6$ alkylene group, alkenylene group or phenylene group, which may contain a carbonyl (—CO—), ester (—COO—), ether (—O—), or hydroxyl moiety, $R^{022}$, $R^{023}$, $R^{025}$, $R^{026}$, $R^{027}$, $R^{029}$, $R^{030}$ and $R^{031}$ are each independently a straight, branched or cyclic $C_1$-$C_{12}$ alkyl group which may contain a carbonyl, ester or ether moiety, a $C_6$-$C_{12}$ aryl group, a $C_7$-$C_{20}$ aralkyl group, or a thiophenyl group, $A^1$ is a single bond, -$A^0$-C(=O)—O—, -$A^0$-O— or -$A^0$-O—C(=O)—, $A^0$ is a straight, branched or cyclic $C_1$-$C_{12}$ alkylene group which may contain a carbonyl, ester or ether moiety, $A^2$ is hydrogen, $CF_3$ or carbonyl group, $Z^1$ is a single bond, methylene, ethylene, phenylene, fluorinated phenylene, —O—$R^{032}$—, or —C(=O)—$Z^2$—$R^{032}$—, $Z^2$ is oxygen or NH, $R^{032}$ is a straight, branched or cyclic $C_1$-$C_6$ alkylene, phenylene, fluorinated phenylene, trifluoromethyl-substituted phenylene or alkenylene group, which may contain a carbonyl, ester, ether or hydroxyl moiety, M$^-$ is a non-nucleophilic counter ion, subscripts f1, f2 and f3 are numbers in the range: $0 \leq f1 \leq 0.5$, $0 \leq f2 \leq 0.5$, $0 \leq f3 \leq 0.5$, and $0 \leq f1+f2+f3 \leq 0.5$, and a sulfonium salt having the general formula (1)-1 or a iodonium salt having the general formula (1)-2,

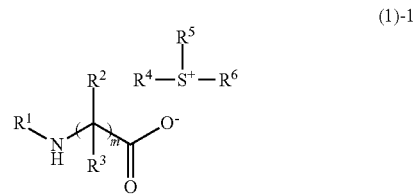

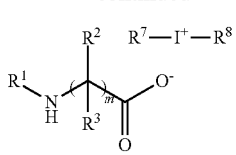

wherein $R^1$ is hydrogen, or a straight, branched or cyclic $C_1$-$C_{30}$ alkyl, $C_6$-$C_{30}$ aryl, $C_7$-$C_{30}$ aralkyl, $C_2$-$C_{30}$ alkenyl, $C_2$-$C_{10}$ alkenyl, or $C_4$-$C_{12}$ heterocyclic-bearing group, or a combination of such groups, which group may contain a hydroxyl, mercapto, carboxyl, ether, thio ether, ester, sulfonic acid ester, sulfonyl, lactone ring, carbonyl, cyano, nitro, halogen, trifluoromethyl, amide, imide, sulfonamide, carbonate, sulfide, —N═CR—O—, —N═CR—S—, or ═N—O—N═moiety, or $R^1$ may be an acid labile group; R is hydrogen, mercapto, hydroxyl or $C_1$-$C_3$ alkyl, or may bond with the nitrogen atom in formula (1) to form a ring; $R^2$ and $R^3$ each are hydrogen, a straight or branched $C_1$-$C_4$ alkyl group or $C_2$-$C_4$ alkenyl group, or $R^2$ and $R^3$ may bond together to form a ring with the carbon atom to which they are attached; $R^4$, $R^5$ and $R^6$ are each independently a straight, branched or cyclic $C_1$-$C_{12}$ alkyl, alkenyl, oxoalkyl or oxoalkenyl group, $C_6$-$C_{20}$ aryl, $C_7$-$C_{12}$ aralkyl or aryloxoalkyl group, in which at least one hydrogen atom may be substituted by an ether, ester, carbonyl, carbonate, hydroxyl, carboxyl, halogen, cyano, amide, nitro, sultone, sulfonic acid ester, sulfone moiety, or sulfonium salt-containing substituent, $R^4$ and $R^5$ may bond together to form a ring with the sulfur atom to which they are attached; $R^7$ and $R^8$ each are a $C_6$-$C_{20}$ aryl group which may contain a straight, branched or cyclic $C_1$-$C_{10}$ alkyl or alkoxy moiety, and m is an integer of 2 to 8.

13. The resist composition of claim 12 wherein the base polymer further comprises recurring units (a1) derived from (meth)acrylate, styrenecarboxylic acid or vinylnaphthalenecarboxylic acid having an acid labile group substituted thereon, or recurring units (a2) derived from hydroxystyrene having an acid labile group substituted thereon, as represented by the general formula (2):

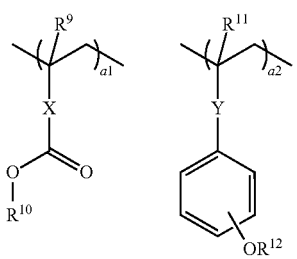

wherein $R^9$ and $R^{11}$ are each independently hydrogen or methyl, X is a single bond, a $C_1$-$C_{12}$ linking group having an ester moiety or lactone ring, phenylene group or naphthylene group, Y is a single bond or ester group, and $R^{10}$ and $R^{12}$ are each independently an acid labile group.

14. A process for forming a pattern comprising the steps of applying a resist composition onto a substrate, baking to form a resist film, exposing the resist film to ArF excimer laser radiation of 193 nm wavelength or KrF excimer laser radiation of 248 nm wavelength, and developing the exposed film with a developer, wherein the resist composition comprises a base polymer and a sulfonium salt having the general formula (1)-1 or a iodonium salt having the general formula (1)-2,

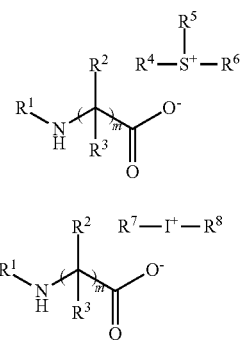

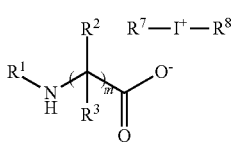

wherein $R^1$ is hydrogen, or a straight, branched or cyclic $C_1$-$C_{30}$ alkyl, $C_6$-$C_{30}$ aryl, $C_7$-$C_{30}$ aralkyl, $C_2$-$C_{30}$ alkenyl, $C_2$-$C_{10}$ alkenyl, or $C_4$-$C_{12}$ heterocyclic-bearing group, or a combination of such groups, which group may contain a hydroxyl, mercapto, carboxyl, ether, thio ether, ester, sulfonic acid ester, sulfonyl, lactone ring, carbonyl, cyano, nitro, halogen, trifluoromethyl, amide, imide, sulfonamide, carbonate, sulfide, —N═CR—O—, —N═CR—S—, or ═N—O—N═moiety, or $R^1$ may be an acid labile group; R is hydrogen, mercapto, hydroxyl or $C_1$-$C_3$ alkyl, or may bond with the nitrogen atom in formula (1) to form a ring; $R^2$ and $R^3$ each are hydrogen, a straight or branched $C_1$-$C_4$ alkyl group or $C_2$-$C_4$ alkenyl group, or $R^2$ and $R^3$ may bond together to form a ring with the carbon atom to which they are attached; $R^4$, $R^5$ and $R^6$ are each independently a straight, branched or cyclic $C_1$-$C_{12}$ alkyl, alkenyl, oxoalkyl or oxoalkenyl group, $C_6$-$C_{20}$ aryl, $C_7$-$C_{12}$ aralkyl or aryloxoalkyl group, in which at least one hydrogen atom may be substituted by an ether, ester, carbonyl, carbonate, hydroxyl, carboxyl, halogen, cyano, amide, nitro, sultone, sulfonic acid ester, sulfone moiety, or sulfonium salt-containing substituent, $R^4$ and $R^5$ may bond together to form a ring with the sulfur atom to which they are attached; $R^7$ and $R^8$ each are a $C_6$-$C_{20}$ aryl group which may contain a straight, branched or cyclic $C_1$-$C_{10}$ alkyl or alkoxy moiety, and m is an integer of 2 to 8.

15. A process for forming a pattern comprising the steps of applying a resist composition onto a substrate, baking to form a resist film, exposing the resist film to electron beam or extreme ultraviolet radiation of 3 to 15 nm wavelength, and developing the exposed film with a developer, wherein the resist composition comprises a base polymer and a sulfonium salt having the general formula (1)-1 or a iodonium salt having the general formula (1)-2,

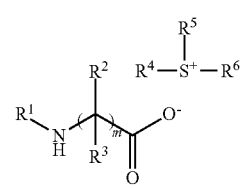

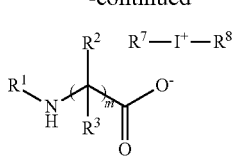

wherein $R^1$ is hydrogen, or a straight, branched or cyclic $C_1$-$C_{30}$ alkyl, $C_6$-$C_{30}$ aryl, $C_7$-$C_{30}$ aralkyl, $C_2$-$C_{30}$ alkenyl, $C_2$-$C_{10}$ alkenyl, or $C_4$-$C_{12}$ heterocyclic-bearing group, or a combination of such groups, which group may contain a hydroxyl, mercapto, carboxyl, ether, thio ether, ester, sulfonic acid ester, sulfonyl, lactone ring, carbonyl, cyano, nitro, halogen, trifluoromethyl, amide, imide, sulfonamide, carbonate, sulfide, —N=CR—O—, —N=CR—S—, or =N—O—N=moiety, or $R^1$ may be an acid labile group; R is hydrogen, mercapto, hydroxyl or $C_1$-$C_3$ alkyl, or may bond with the nitrogen atom in formula (1) to form a ring; $R^2$ and $R^3$ each are hydrogen, a straight or branched $C_1$-$C_4$ alkyl group or $C_2$-$C_4$ alkenyl group, or $R^2$ and $R^3$ may bond together to form a ring with the carbon atom to which they are attached; $R^4$, $R^5$ and $R^6$ are each independently a straight, branched or cyclic $C_1$-$C_{12}$ alkyl, alkenyl, oxoalkyl or oxoalkenyl group, $C_6$-$C_{20}$ aryl, $C_7$-$C_{12}$ aralkyl or aryloxoalkyl group, in which at least one hydrogen atom may be substituted by an ether, ester, carbonyl, carbonate, hydroxyl, carboxyl, halogen, cyano, amide, nitro, sultone, sulfonic acid ester, sulfone moiety, or sulfonium salt-containing substituent, $R^4$ and $R^5$ may bond together to form a ring with the sulfur atom to which they are attached; $R^7$ and $R^8$ each are a $C_6$-$C_{20}$ aryl group which may contain a straight, branched or cyclic $C_1$-$C_{10}$ alkyl or alkoxy moiety, and m is an integer of 2 to 8.

* * * * *